(12) United States Patent
Kurata et al.

(10) Patent No.: US 12,495,615 B2
(45) Date of Patent: Dec. 9, 2025

(54) SEMICONDUCTOR DEVICE, MANUFACTURING METHOD THEREOF, AND ELECTRONIC DEVICE

(71) Applicant: Semiconductor Energy Laboratory Co., Ltd., Atsugi (JP)

(72) Inventors: Motomu Kurata, Kanagawa (JP); Shinya Sasagawa, Kanagawa (JP); Ryota Hodo, Kanagawa (JP); Katsuaki Tochibayashi, Kanagawa (JP); Tomoaki Moriwaka, Kanagawa (JP); Jiro Nishida, Kanagawa (JP); Hidekazu Miyairi, Kanagawa (JP); Shunpei Yamazaki, Tokyo (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 816 days.

(21) Appl. No.: 17/557,185

(22) Filed: Dec. 21, 2021

(65) Prior Publication Data
US 2022/0115409 A1    Apr. 14, 2022

Related U.S. Application Data

(60) Continuation of application No. 16/876,286, filed on May 18, 2020, now Pat. No. 11,282,860, which is a
(Continued)

(30) Foreign Application Priority Data

May 30, 2014    (JP) .................................. 2014-112369

(51) Int. Cl.
*H01L 27/12*    (2006.01)
*H01L 23/522*    (2006.01)
(Continued)

(52) U.S. Cl.
CPC ......... *H10D 87/00* (2025.01); *H01L 23/5226* (2013.01); *H10D 30/6755* (2025.01);
(Continued)

(58) Field of Classification Search
CPC ............... H10D 87/00; H10D 30/6755; H10D 30/5226; H10D 30/67–6759;
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

CN        001727977 A    2/2006
EP           1022784 A    7/2000
(Continued)

OTHER PUBLICATIONS

Brain.R et al., "A 22nm High Performance Embedded DRAM SoC Technology Featuring Tri-gate Transistors and Mimcap Cob", 2013 Symposium on VLSI Technology : Digest of Technical Papers, Jun. 11, 2013, pp. T16-T17.
(Continued)

*Primary Examiner* — Steven B Gauthier
*Assistant Examiner* — Rhys Poniente Sheker
(74) *Attorney, Agent, or Firm* — Fish & Richardson P.C.

(57) ABSTRACT

The semiconductor device includes a first layer including a first transistor, a second layer including a first insulating film over the first layer, a third layer including a second insulating film over the second layer, and a fourth layer including a second transistor over the third layer. A first conductive film electrically connects the first transistor and the second transistor to each other through an opening provided in the first insulating film. A second conductive film electrically
(Continued)

connects the first transistor, the second transistor, and the first conductive film to one another through an opening provided in the second insulating film. A channel formation region of the first transistor includes a single crystal semiconductor. A channel formation region of the second transistor includes an oxide semiconductor. The width of a bottom surface of the second conductive film is 5 nm or less.

9 Claims, 40 Drawing Sheets

Related U.S. Application Data continuation of application No. 15/386,017, filed on Dec. 21, 2016, now Pat. No. 10,658,389, which is a division of application No. 14/489,074, filed on Sep. 17, 2014, now Pat. No. 9,553,202.

(51) Int. Cl.

| | |
|---|---|
| *H01L 29/66* | (2006.01) |
| *H01L 29/786* | (2006.01) |
| *H10D 30/67* | (2025.01) |
| *H10D 86/01* | (2025.01) |
| *H10D 86/40* | (2025.01) |
| *H10D 86/60* | (2025.01) |
| *H10D 86/80* | (2025.01) |
| *H10D 87/00* | (2025.01) |
| *H10D 99/00* | (2025.01) |
| *H10D 84/03* | (2025.01) |
| *H10D 88/00* | (2025.01) |

(52) U.S. Cl.
CPC ......... *H10D 30/6757* (2025.01); *H10D 86/01* (2025.01); *H10D 86/021* (2025.01); *H10D 86/423* (2025.01); *H10D 86/481* (2025.01); *H10D 86/60* (2025.01); *H10D 86/80* (2025.01); *H10D 99/00* (2025.01); *H10D 84/038* (2025.01); *H10D 88/01* (2025.01)

(58) Field of Classification Search
CPC ....... H10D 30/031–0327; H10D 86/01; H10D 86/423; H10D 86/48; H10D 86/60; H10D 86/80; H10D 86/021–0251; H10D 84/038; H10D 88/01; H10D 88/00; H10D 99/00

See application file for complete search history.

(56) References Cited

U.S. PATENT DOCUMENTS

| | | | |
|---|---|---|---|
| 5,973,369 | A | 10/1999 | Hayashi |
| 6,093,597 | A | 7/2000 | Hayashi |
| 6,127,702 | A | 10/2000 | Yamazaki et al. |
| 6,204,518 | B1 | 3/2001 | Adan et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,164,151 | B2 | 1/2007 | Yamazaki et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,323,713 | B2 | 1/2008 | Ishiga et al. |
| 7,339,235 | B1 | 3/2008 | Yamazaki et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,470,571 | B2 | 12/2008 | Ishiga et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,892,969 | B2 | 2/2011 | Tsutsumi et al. |
| 7,910,490 | B2 | 3/2011 | Akimoto et al. |
| 7,932,521 | B2 | 4/2011 | Akimoto et al. |
| 7,982,250 | B2 | 7/2011 | Yamazaki et al. |
| 8,044,464 | B2 | 10/2011 | Yamazaki et al. |
| 8,183,630 | B2 | 5/2012 | Batude et al. |
| 8,274,077 | B2 | 9/2012 | Akimoto et al. |
| 8,378,403 | B2 | 2/2013 | Kato |
| 8,389,417 | B2 | 3/2013 | Yamazaki et al. |
| 8,466,463 | B2 | 6/2013 | Akimoto et al. |
| 8,476,708 | B2 | 7/2013 | Fukuzumi et al. |
| 8,513,773 | B2 | 8/2013 | Takemura |
| 8,575,985 | B2 | 11/2013 | Ohmaru et al. |
| 8,581,309 | B2 | 11/2013 | Yamazaki et al. |
| 8,605,477 | B2 | 12/2013 | Takemura |
| 8,629,069 | B2 | 1/2014 | Akimoto et al. |
| 8,637,865 | B2 | 1/2014 | Kato |
| 8,653,520 | B2 | 2/2014 | Yamazaki et al. |
| 8,654,567 | B2 | 2/2014 | Saito |
| 8,669,550 | B2 | 3/2014 | Akimoto et al. |
| 8,675,394 | B2 | 3/2014 | Matsubayashi |
| 8,779,479 | B2 | 7/2014 | Yamazaki et al. |
| 8,780,629 | B2 | 7/2014 | Furutani et al. |
| 8,790,959 | B2 | 7/2014 | Akimoto et al. |
| 8,796,069 | B2 | 8/2014 | Akimoto et al. |
| 8,809,850 | B2 | 8/2014 | Yamazaki |
| 8,828,794 | B2 | 9/2014 | Yamazaki et al. |
| 8,837,202 | B2 | 9/2014 | Takemura |
| 8,901,559 | B2 | 12/2014 | Yamazaki |
| 8,916,424 | B2 | 12/2014 | Isobe et al. |
| 8,923,036 | B2 | 12/2014 | Saito |
| 8,929,128 | B2 | 1/2015 | Shionoiri et al. |
| 8,941,958 | B2 | 1/2015 | Tomatsu |
| 8,981,367 | B2 | 3/2015 | Yoneda et al. |
| 8,987,731 | B2 | 3/2015 | Yamazaki |
| 9,023,684 | B2 | 5/2015 | Suzawa et al. |
| 9,024,669 | B2 | 5/2015 | Ohmaru et al. |
| 9,042,161 | B2 | 5/2015 | Koyama et al. |
| 9,082,863 | B2 | 7/2015 | Yamazaki |
| 9,099,560 | B2 | 8/2015 | Yamazaki |
| 9,117,662 | B2 | 8/2015 | Isobe et al. |
| 9,147,684 | B2 | 9/2015 | Saito |
| 9,202,546 | B2 | 12/2015 | Yamazaki et al. |
| 9,209,251 | B2 | 12/2015 | Yamazaki |
| 9,263,116 | B2 | 2/2016 | Koyama et al. |
| 9,299,723 | B2 | 3/2016 | Saito |
| 9,324,875 | B2 | 4/2016 | Yamazaki |
| 9,330,759 | B2 | 5/2016 | Ohmaru et al. |
| 9,349,849 | B2 | 5/2016 | Tanaka |
| 9,362,136 | B2 | 6/2016 | Yamazaki et al. |
| 9,384,816 | B2 | 7/2016 | Takemura |
| 9,472,680 | B2 | 10/2016 | Yoneda et al. |
| 9,477,294 | B2 | 10/2016 | Nishijima et al. |
| 9,496,375 | B2 | 11/2016 | Isobe et al. |
| 9,508,742 | B2 | 11/2016 | Yamazaki |
| 9,620,650 | B2 | 4/2017 | Yamazaki |
| 9,680,029 | B2 | 6/2017 | Saito |
| 9,735,280 | B2 | 8/2017 | Noda et al. |
| 9,755,084 | B2 | 9/2017 | Isobe et al. |
| 9,780,093 | B2 | 10/2017 | Kato |
| 9,806,079 | B2 | 10/2017 | Yamazaki et al. |
| 9,818,749 | B2 | 11/2017 | Ohmaru et al. |
| 9,825,042 | B2 | 11/2017 | Takemura |
| 9,893,204 | B2 | 2/2018 | Yamazaki |
| 9,978,855 | B2 | 5/2018 | Noda et al. |
| 10,002,775 | B2 | 6/2018 | Yamazaki et al. |
| 10,038,099 | B2 | 7/2018 | Saito |
| 10,043,833 | B2 | 8/2018 | Yoneda et al. |
| 10,134,909 | B2 | 11/2018 | Yamazaki |
| 10,319,723 | B2 | 6/2019 | Kato |

(56) References Cited

U.S. PATENT DOCUMENTS

| | | | |
|---|---|---|---|
| 10,324,521 B2 | 6/2019 | Nishijima et al. |
| 10,615,052 B2 | 4/2020 | Yamazaki et al. |
| 10,720,433 B2 | 7/2020 | Yamazaki et al. |
| 11,233,055 B2 | 1/2022 | Kato |
| 11,387,116 B2 | 7/2022 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0022199 A1 | 2/2006 | Ishiga et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao. et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0023770 A1 | 1/2008 | Kim et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0078970 A1 | 3/2009 | Yamazaki et al. |
| 2009/0079000 A1 | 3/2009 | Yamazaki et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0294822 A1 | 12/2009 | Batude et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089417 A1 | 4/2011 | Yamazaki et al. |
| 2011/0101332 A1 | 5/2011 | Yamazaki et al. |
| 2011/0101351 A1 | 5/2011 | Yamazaki |
| 2011/0104851 A1 | 5/2011 | Akimoto et al. |
| 2011/0121290 A1 | 5/2011 | Akimoto et al. |
| 2011/0127595 A1 | 6/2011 | Cho et al. |
| 2011/0140099 A1 | 6/2011 | Yamazaki |
| 2012/0032163 A1 | 2/2012 | Yamazaki |
| 2012/0268849 A1 | 10/2012 | Tomatsu |
| 2013/0092944 A1 | 4/2013 | Honda et al. |
| 2013/0140569 A1* | 6/2013 | Yoneda ............... H01L 27/0688 257/57 |
| 2013/0187161 A1 | 7/2013 | Yamazaki |
| 2013/0228839 A1* | 9/2013 | Arai ................... H10D 30/6755 257/300 |
| 2013/0288426 A1 | 10/2013 | Akimoto |
| 2013/0292675 A1 | 11/2013 | Tsubuku et al. |
| 2013/0299818 A1 | 11/2013 | Tanaka |
| 2013/0314074 A1 | 11/2013 | Takahashi et al. |
| 2013/0320330 A1 | 12/2013 | Yamazaki |
| 2014/0009198 A1 | 1/2014 | Ohmaru |
| 2014/0054584 A1 | 2/2014 | Sunamura et al. |
| 2014/0103346 A1 | 4/2014 | Yamazaki |
| 2014/0167041 A1 | 6/2014 | Yamazaki et al. |
| 2014/0312346 A1 | 10/2014 | Yamazaki et al. |
| 2014/0325249 A1 | 10/2014 | Toyotaka |
| 2014/0326992 A1 | 11/2014 | Hondo et al. |
| 2014/0332800 A1 | 11/2014 | Hanaoka |
| 2015/0108470 A1 | 4/2015 | Yamazaki et al. |
| 2015/0187814 A1 | 7/2015 | Miyairi et al. |
| 2015/0187823 A1 | 7/2015 | Miyairi et al. |
| 2015/0214256 A1 | 7/2015 | Miyairi |
| 2015/0228802 A1 | 8/2015 | Suzawa et al. |
| 2015/0249439 A1 | 9/2015 | Kozuma et al. |
| 2015/0255490 A1 | 9/2015 | Miyairi |
| 2015/0256177 A1 | 9/2015 | Kozuma et al. |
| 2015/0270288 A1 | 9/2015 | Yamazaki et al. |
| 2015/0348909 A1 | 12/2015 | Yamazaki et al. |
| 2015/0348961 A1 | 12/2015 | Isobe |
| 2015/0348997 A1 | 12/2015 | Sasagawa et al. |
| 2016/0005872 A1 | 1/2016 | Kurata et al. |
| 2016/0163374 A1 | 6/2016 | Koyama et al. |
| 2016/0240685 A1 | 8/2016 | Tanaka |
| 2022/0149044 A1 | 5/2022 | Kato |

FOREIGN PATENT DOCUMENTS

| | | | |
|---|---|---|---|
| EP | 1737044 A | 12/2006 |
| EP | 2131397 A | 12/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-098243 A | 4/1989 |
| JP | 01-268151 A | 10/1989 |
| JP | 02-271657 A | 11/1990 |
| JP | 04-003455 A | 1/1992 |
| JP | 05-251705 A | 9/1993 |
| JP | 07-099286 A | 4/1995 |
| JP | 08-264794 A | 10/1996 |
| JP | 09-097877 A | 4/1997 |
| JP | 09-129754 A | 5/1997 |
| JP | 10-093100 A | 4/1998 |
| JP | 11-505377 | 5/1999 |
| JP | 2000-044236 A | 2/2000 |

(56) References Cited

FOREIGN PATENT DOCUMENTS

| | | |
|---|---|---|
| JP | 2000-150900 A | 5/2000 |
| JP | 2000-208644 A | 7/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-041161 A | 2/2006 |
| JP | 2007-096055 A | 4/2007 |
| JP | 2007-123861 A | 5/2007 |
| JP | 2009-094494 A | 4/2009 |
| JP | 2009-094495 A | 4/2009 |
| JP | 2009-152438 A | 7/2009 |
| JP | 2009-302530 A | 12/2009 |
| JP | 2011-109124 A | 6/2011 |
| JP | 2011-187945 A | 9/2011 |
| JP | 2011-249782 A | 12/2011 |
| JP | 2012-019018 A | 1/2012 |
| JP | 2012-033906 A | 2/2012 |
| JP | 2012-054547 A | 3/2012 |
| JP | 2012-119048 A | 6/2012 |
| JP | 2012-146861 A | 8/2012 |
| JP | 2012-178553 A | 9/2012 |
| JP | 2012-199527 A | 10/2012 |
| JP | 2012-209546 A | 10/2012 |
| JP | 2012-256814 A | 12/2012 |
| JP | 2012-256821 A | 12/2012 |
| JP | 2012-256859 A | 12/2012 |
| JP | 2012-256929 A | 12/2012 |
| JP | 2012-256941 A | 12/2012 |
| JP | 2013-008936 A | 1/2013 |
| JP | 2013-009297 A | 1/2013 |
| JP | 2013-138191 A | 7/2013 |
| JP | 2013-165132 A | 8/2013 |
| JP | 2013-168638 A | 8/2013 |
| JP | 2013-168644 A | 8/2013 |
| JP | 2013-179286 A | 9/2013 |
| JP | 2013-211544 A | 10/2013 |
| JP | 2013-225620 A | 10/2013 |
| JP | 2013-229587 A | 11/2013 |
| JP | 2013-243349 A | 12/2013 |
| JP | 2013-243397 A | 12/2013 |
| JP | 2013-254942 A | 12/2013 |
| JP | 2013-257933 A | 12/2013 |
| JP | 2014-007394 A | 1/2014 |
| JP | 2014-030191 A | 2/2014 |
| JP | 2014-099165 A | 5/2014 |
| JP | 2014-099595 A | 5/2014 |
| KR | 10-0444654 | 10/2004 |
| KR | 2012-0103566 A | 9/2012 |
| KR | 2013-0061637 A | 6/2013 |
| KR | 2014-0005792 A | 1/2014 |
| TW | 1267197 | 11/2006 |
| TW | 201417285 | 5/2014 |
| WO | WO-2004/114391 | 12/2004 |
| WO | WO-2011/048929 | 4/2011 |
| WO | WO-2011/052351 | 5/2011 |
| WO | WO-2011/070928 | 6/2011 |
| WO | WO-2011/099335 | 8/2011 |
| WO | WO-2011/135999 | 11/2011 |
| WO | WO-2011/145468 | 11/2011 |
| WO | WO-2012/002186 | 1/2012 |
| WO | WO-2012/036001 | 3/2012 |
| WO | WO-2013/179922 | 12/2013 |
| WO | WO-2014/024808 | 2/2014 |
| WO | WO-2014/061761 | 4/2014 |

OTHER PUBLICATIONS

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The Blue Phase", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Jin.D et al., "65.2: Distinguished Paper: World-Largest (6.5") Flexible Full Color Top Emission Amoled Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] At Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF Rfcpus on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of Am-Oled", IDW '06 : Proceedings of the 13th International Display Workshops, Dec. 7, 2006, pp. 663-666.

Lee.J et al., "World's Largest (15-Inch) XGA AMLCD Panel Using Igzo Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem Oleds", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA Amoled Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA Amoled Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size Amoled", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent Am-Oled Driven by Peald Grown ZnO TFT", IMID '07 DIGEST, 2007, pp. 1249-1252.

Park.S et al., "42.3: Transparent ZnO Thin Film Transistor for the Application of High Aperture Ratio Bottom Emission AM-OLED

(56) References Cited

OTHER PUBLICATIONS

Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. Amoled Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA Amoled Driven by the Threshold Voltage Controlled Amorphous Gizo ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of Igzo Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2014/074337) dated Dec. 9, 2014.

Written Opinion (Application No. PCT/JP2014/074337) dated Dec. 9, 2014.

Taiwanese Office Action (Application No. 103131752) dated May 22, 2018.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S, "CAAC-OS (Oxide Semiconductor) And Its Applications", Extended Abstract of the 61th JSAP Spring Meeting, Mar. 17, 2014, pp. SS-05.

Yamazaki.S, "Properties and Application of Crystalline In—Ga—Zn-Oxide Semiconductor", SSDM 2013 (Extended Abstracts of The 2013 International Conference on Solid State Devices and Materials), 2013, pp. 1098-1099.

German Office Action (Application No. 112014006711.3) dated Jun. 19, 2020.

German Office Action (Application No. 112014007347.4) dated Aug. 3, 2023.

\* cited by examiner

FIG. 28A
FIG. 28B
FIG. 28C
FIG. 28D
FIG. 28E
FIG. 28F
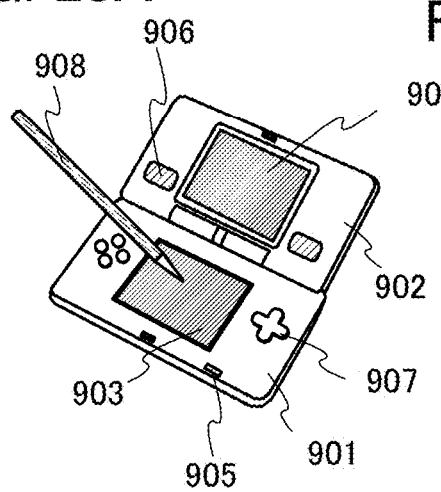
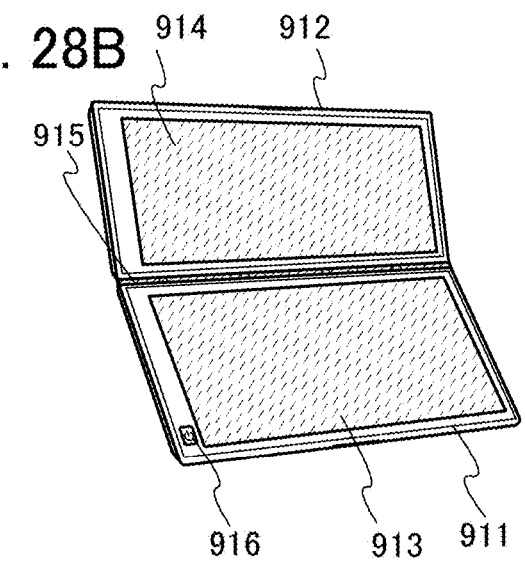
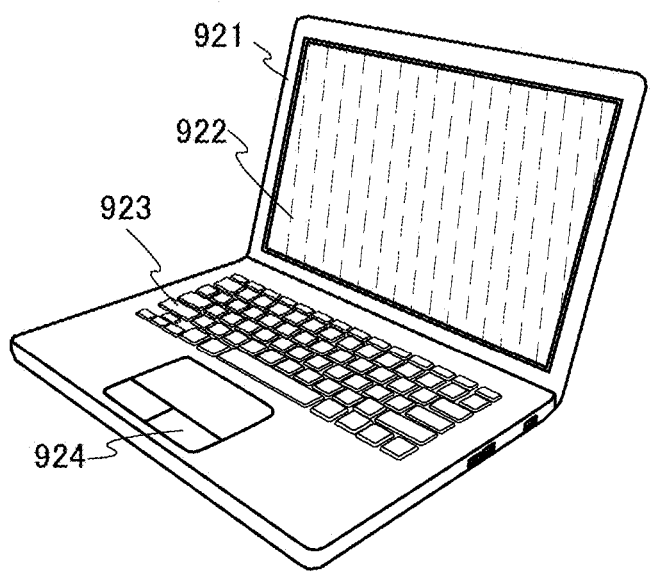
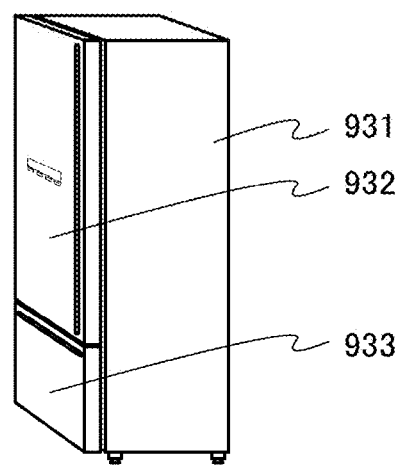
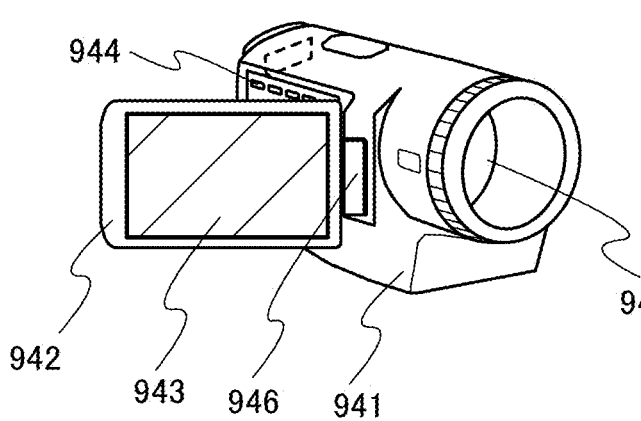
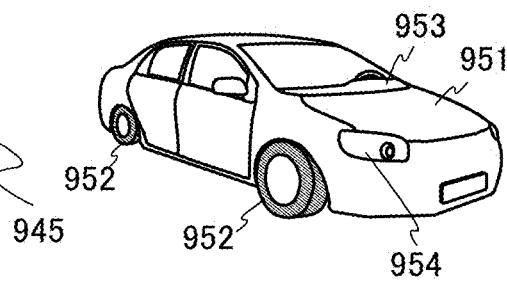

FIG. 33A
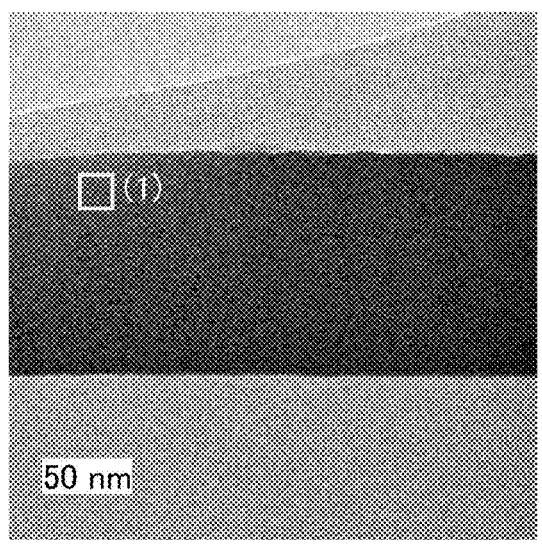
FIG. 33B    FIG. 33C
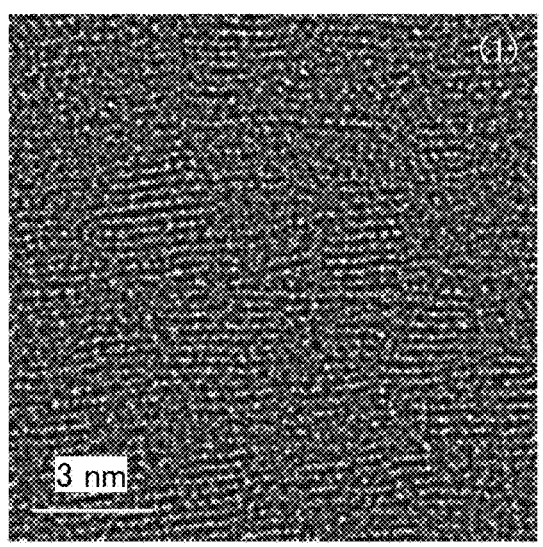 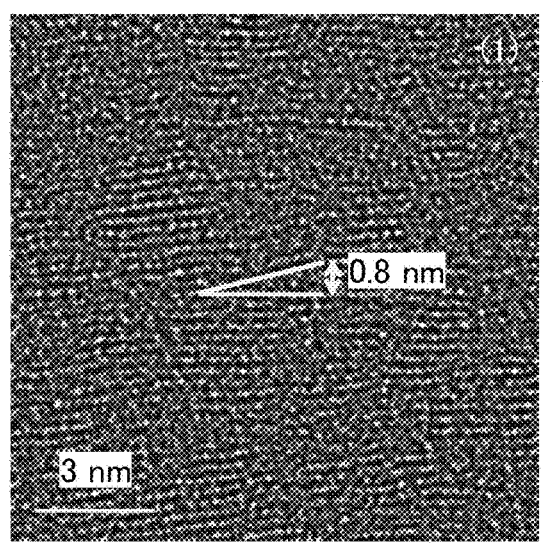
FIG. 33D
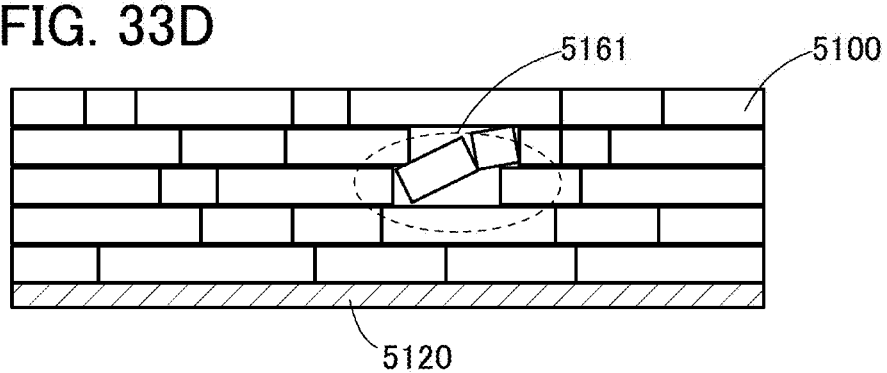

FIG. 34A
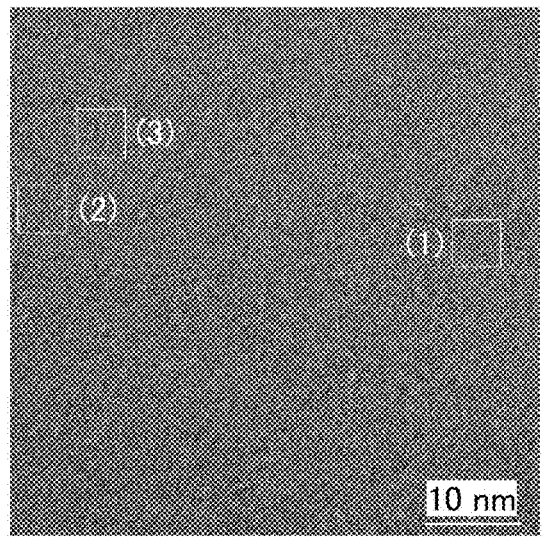
FIG. 34B  FIG. 34C  FIG. 34D
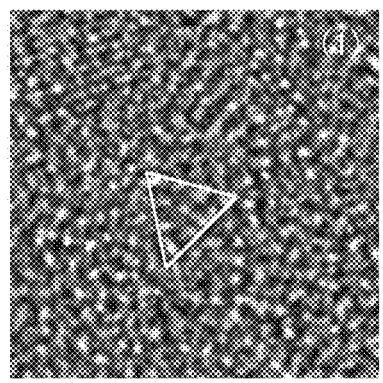 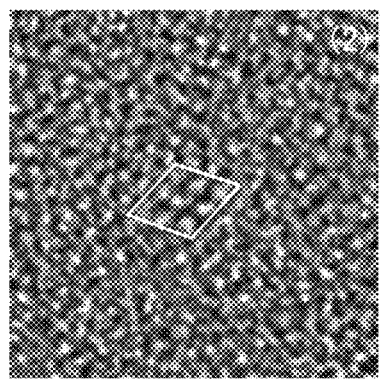 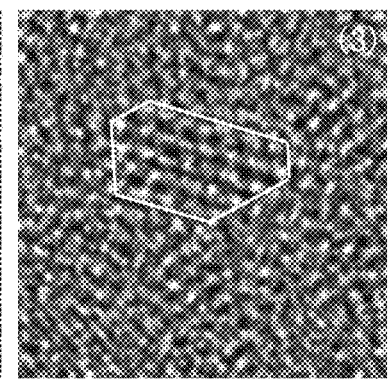

electron beam enters in direction parallel to sample surface electron beam enters in direction perpendicular to sample surface cross section of pellet top view of pellet

SEMICONDUCTOR DEVICE, MANUFACTURING METHOD THEREOF, AND ELECTRONIC DEVICE

CROSS-REFERENCE TO RELATED APPLICATIONS

This application is a continuation of U.S. application Ser. No. 16/876,286, filed May 18, 2020, now allowed, which is a continuation of U.S. application Ser. No. 15/386,017, filed Dec. 21, 2016, now U.S. Pat. No. 10,658,389, which is a divisional of U.S. application Ser. No. 14/489,074, filed Sep. 17, 2014, now U.S. Pat. No. 9,553,202, which claims the benefit of a foreign priority application filed in Japan as Serial No. 2014-112369 on May 30, 2014, all of which are incorporated by reference.

TECHNICAL FIELD

One embodiment of the present invention relates to a semiconductor device including a field-effect transistor.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

In this specification and the like, the term "semiconductor device" means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may have a semiconductor device.

BACKGROUND ART

A technique in which a transistor is formed using a semiconductor material has attracted attention. The transistor is applied to a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

For example, a technique for forming a transistor using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic devices. For example, a tri-gate transistor and a capacitor-over-bitline (COB) MIM capacitor are reported (Non-Patent Document 1).

PATENT DOCUMENTS

[Patent Document 1] Japanese Published Patent Application No. 2007-123861
[Patent Document 2] Japanese Published Patent Application No. 2007-96055

Non-Patent Document

R. Brain et al., "A 22 nm High Performance Embedded DRAM SoC Technology Featuring Tri-gate Transistors and MIMCAP COB", 2013 SYMPOSIUM ON VLSI TECHNOLOGY: DIGEST OF TECHNICAL PAPERS, 2013, pp. T16-T17

DISCLOSURE OF INVENTION

An object of one embodiment of the present invention is to provide a semiconductor device that is suitable for miniaturization and higher density. Another object of one embodiment of the present invention is to provide a semiconductor device with favorable electrical characteristics.

Another object is to provide a semiconductor device capable of high-speed writing. Another object is to provide a semiconductor device capable of high-speed reading. Another object is to provide a semiconductor device with low power consumption. Another object is to provide a highly reliable semiconductor device. Another object is to provide a semiconductor device with a novel structure.

Note that the descriptions of these objects do not disturb the existence of other objects. Note that in one embodiment of the present invention, there is no need to achieve all the objects. Note that other objects will be apparent from the description of the specification, the drawings, the claims, and the like and other objects can be derived from the description of the specification, the drawings, the claims, and the like.

(1) One embodiment of the present invention is a semiconductor device which includes a first layer, a second layer over the first layer, a third layer over the second layer, and a fourth layer over the third layer. The first layer includes a first transistor. The second layer includes a first insulating film and a first conductive film. The first conductive film has a function of electrically connecting the first transistor and a second transistor to each other through an opening provided in the first insulating film. The third layer includes a second insulating film and a second conductive film. The second conductive film has a function of electrically connecting the first transistor, the second transistor, and the first conductive film to one another through an opening provided in the second insulating film. The fourth layer includes the second transistor. A channel formation region of the first transistor includes a single crystal semiconductor. A channel formation region of the second transistor includes an oxide semiconductor. The width of a bottom surface of the second conductive film is 5 nm or less.

(2) Another embodiment of the present invention is a semiconductor device which includes a first layer, a second layer over the first layer, a third layer over the second layer, and a fourth layer over the third layer. The first layer includes a first transistor. The second layer includes a first insulating film and a first conductive film. The first conductive film has a function of electrically connecting the first transistor and a second transistor to each other through an opening provided in the first insulating film. The third layer includes a second insulating film and a second conductive film. The second conductive film has a function of electrically connecting the first transistor, the second transistor, and the first conductive film to one another through an opening provided in the second insulating film. The fourth layer includes the second transistor. A channel formation region of the first transistor includes a single crystal semiconductor. A channel formation region of the second transistor includes an oxide semiconductor. The width of a bottom surface of the second conductive film is 5 nm or less. Assuming that the center of a top surface of a gate electrode of the first transistor is at the apex (vertex) of an inverted square pyramid with a square and first to fourth isosceles triangles each having a vertex angle of 120° or less, a bottom surface of the oxide semiconductor fits inside the square.

(3) Another embodiment of the present invention is a semiconductor device which includes a first layer, a second layer over the first layer, a third layer over the second layer, and a fourth layer over the third layer. The first layer includes a first transistor. The second layer includes a first insulating film and a first conductive film. The first conductive film has a function of electrically connecting the first transistor and a second transistor to each other through an opening provided in the first insulating film. The third layer includes a second insulating film and a second conductive film. The second conductive film has a function of electrically connecting the first transistor, the second transistor, and the first conductive film to one another through an opening provided in the second insulating film. The fourth layer includes a second transistor. A channel formation region of the first transistor includes a single crystal semiconductor. A channel formation region of the second transistor includes an oxide semiconductor. The width of a bottom surface of the second conductive film is 5 nm or less. Assuming that the center of a top surface of a gate electrode of the first transistor is at the apex of an inverted right circular cone with a circle, a bottom surface of the oxide semiconductor fits inside the circle, and a cross section passing through the vertex of the inverted right circular cone and the center of the circle has an isosceles triangle having a vertex angle of 120° or less.

(4) Another embodiment of the present invention is the semiconductor device of (2) or (3) in which the center of the top surface of the gate electrode of the first transistor and the center of a top surface of a gate electrode of the second transistor overlap with each other, and the center of the top surface of the gate electrode of the first transistor and the center of a top surface of the oxide semiconductor overlap with each other.

(5) Another embodiment of the present invention is the semiconductor device of any of (1) to (4) in which the oxide semiconductor of the second transistor has a stacked-layer structure including a first oxide semiconductor film, a second oxide semiconductor film, and a third oxide semiconductor film between the first oxide semiconductor film and the second oxide semiconductor film, and the electron affinity of the third oxide semiconductor film is higher than the electron affinity of the first oxide semiconductor film and the electron affinity of the second oxide semiconductor film.

(6) Another embodiment of the present invention is the semiconductor device of any of (1) to (5) which further includes a capacitor between the first transistor and the second transistor.

(7) Another embodiment of the present invention is an electronic device which includes the semiconductor device of any of (1) to (6) and at least one of a display device, a microphone, a speaker, an operation key, a touch panel, or an antenna.

(8) Another embodiment of the present invention is a method for manufacturing a semiconductor device, which includes the following steps: forming a first transistor including a single crystal semiconductor as a channel; forming a first insulating film over the first transistor; forming an oxide semiconductor film over the first insulating film; forming a first conductive film over the oxide semiconductor film; forming a second insulating film over the first conductive film; forming a resist mask over the second insulating film; processing the second insulating film using the resist mask as a mask; processing the first conductive film using the processed second insulating film as a mask; providing an opening in the first insulating film, the oxide semiconductor film, and the first conductive film by processing the oxide semiconductor film and the first insulating film using the processed first conductive film as a mask; forming a second conductive film so as to fill the opening; forming a pair of electrodes by processing the processed first conductive film; forming a third insulating film over the processed oxide semiconductor film and the pair of electrodes; and forming an electrode over the third insulating film.

(9) Another embodiment of the present invention is a method for manufacturing a semiconductor device, which includes the following steps: forming a first transistor including a single crystal semiconductor as a channel; forming a first insulating film over the first transistor; forming an oxide semiconductor film over the first insulating film; forming a first conductive film over the oxide semiconductor film; forming a second insulating film over the first conductive film; forming an organic resin film over the second insulating film; forming a resist mask over the organic resin film; processing the second insulating film using the resist mask as a mask; processing the first conductive film using the processed second insulating film as a mask; providing an opening in the first insulating film, the oxide semiconductor film, and the first conductive film by processing the oxide semiconductor film and the first insulating film using the processed first conductive film as a mask; forming a second conductive film so as to fill the opening; forming a pair of electrodes by processing the processed first conductive film; forming a third insulating film over the processed oxide semiconductor film and the pair of electrodes; and forming an electrode over the third insulating film.

According to one embodiment of the present invention, a semiconductor device that is suitable for miniaturization and higher density can be provided.

A semiconductor device with favorable electrical characteristics can be provided. A semiconductor device capable of high-speed writing can be provided. A semiconductor device capable of high-speed reading can be provided. A semiconductor device with low power consumption can be provided. A highly reliable semiconductor device can be provided. A semiconductor device or the like with a novel structure can be provided. Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF DRAWINGS

FIGS. 28A to 28F each illustrate an electronic device according to an embodiment.

FIGS. 33A to 33D are Cs-corrected high-resolution TEM images of a cross section of a CAAC-OS and a cross-sectional schematic view of a CAAC-OS.

FIGS. 34A to 34D are Cs-corrected high-resolution TEM images of a plane of a CAAC-OS.

BEST MODE FOR CARRYING OUT THE INVENTION

Figure 1A:
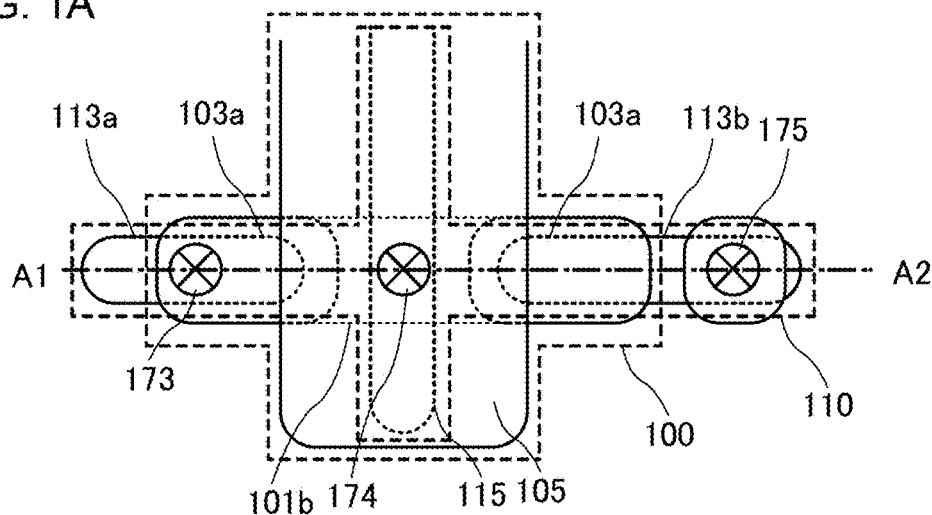
FIGS. 1A and 1B are a top view and a cross-sectional view of a semiconductor device according to an embodiment.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Further, the same hatch pattern is applied to similar functions, and these are not especially denoted by reference numerals in some cases.

Note that in each drawing described in this specification, the size, the layer thickness, or the region of each component is exaggerated for clarity in some cases. Therefore, embodiments of the invention are not limited to such scales.

Note that ordinal numbers such as "first" and "second" in this specification and the like are used in order to avoid confusion among components, and the terms do not limit the components numerically.

A transistor is a kind of semiconductor element and can achieve amplification of a current or a voltage, switching operation for controlling conduction or non-conduction, or the like. A transistor in this specification includes an insulated-gate field effect transistor (IGFET) and a thin film transistor (TFT).

Note that in this specification, the term "electrode" is interchangeable with the term "plug." In particular, a portion in which an opening is filled with a conductive film to electrically connect upper and lower wirings is often referred to as a "plug."

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

Figure 1B:
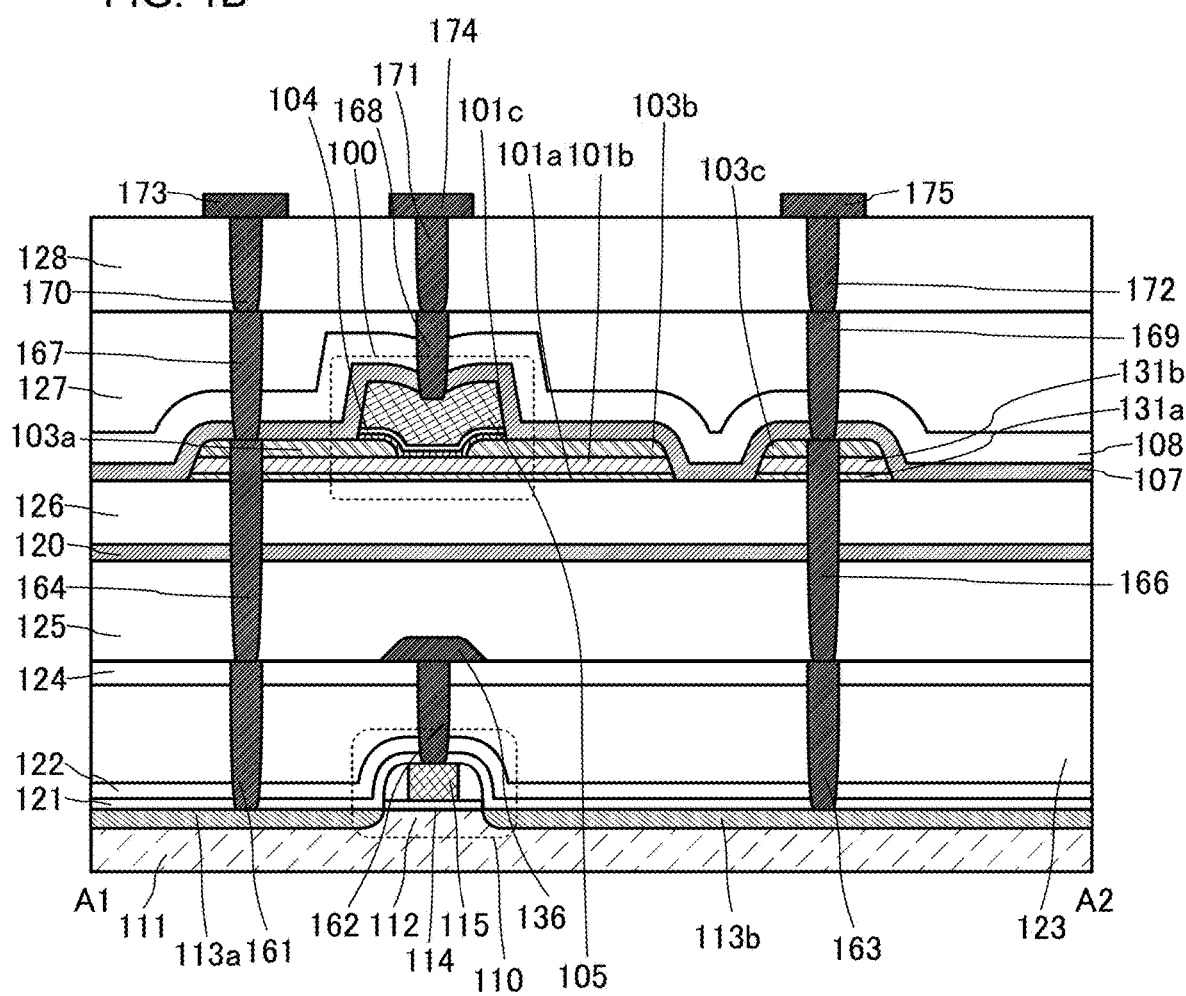

FIG. 1A illustrates an example of a top view of a semiconductor device. FIG. 1B is a cross-sectional view taken along dashed-dotted line A1-A2 in FIG. 1A. The semiconductor device includes a first transistor 110 and a second transistor 100 as illustrated in FIG. 1B. The second transistor 100 is provided over the first transistor 110, and a barrier film 120 is provided between the first transistor 110 and the second transistor 100.

The first transistor 110 is provided on a semiconductor substrate 111 and includes a semiconductor film 112 which is a portion of the semiconductor substrate 111, a gate insulating film 114, a gate electrode 115, and low-resistance layers 113a and 113b serving as source and drain regions.

The first transistor 110 can be either a p-channel transistor or an n-channel transistor; it is preferable to use a p-channel transistor. Alternatively, an appropriate transistor may be used depending on the circuit configuration or the driving method.

It is preferable that a region of the semiconductor film 112 where a channel is formed, a region in the vicinity thereof, the low-resistance layers 113a and 113b serving as source and drain regions, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the first transistor 110 may be a high-electron-mobility transistor (HEMT) with GaAs and AlGaAs or the like.

The low-resistance layers 113a and 113b contain an element which imparts n-type conductivity, such as arsenic or phosphorus, or an element which imparts p-type conductivity, such as boron, in addition to a semiconductor material used for the semiconductor film 112.

The gate electrode 115 can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material. It is preferable to use a high-melting-point material which has both heat resistance and conductivity, such as tungsten or molybdenum, and it is particularly preferable to use tungsten.

Figure 4:
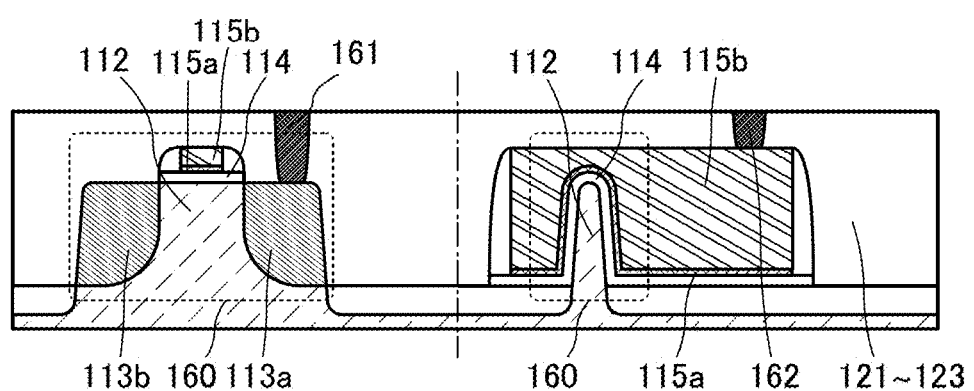
FIG. 4 illustrates an example of a structure of a semiconductor device according to an embodiment.

Here, a transistor 160 illustrated in FIG. 4 may be used instead of the first transistor 110. FIG. 4 illustrates a cross section of the transistor 160 in a channel length direction on the left side of the dashed-dotted line and a cross section thereof in a channel width direction on the right side of the dashed-dotted line. In the transistor 160 illustrated in FIG. 4, the semiconductor film 112 (a portion of the semiconductor substrate) in which a channel is formed has a protrusion, and the gate insulating film 114, a gate electrode 115a, and a gate electrode 115b are provided along top and side surfaces of the protrusion. Note that the gate electrode 115a may be formed using a material with an adjusted work function. The transistor 160 having such a shape is also referred to as a FIN transistor because it utilizes a protruding portion of the semiconductor substrate. Note that an insulating film serving as a mask for forming the protruding portion may be provided in contact with the top of the protruding portion. Although the case where the protruding portion is formed by processing a portion of the semiconductor substrate is described here, a semiconductor film having a protruding shape may be formed by processing an SOI substrate.

The first transistor 110 is covered with an insulating film 121, an insulating film 122, an insulating film 123, and an insulating film 124 which are stacked in this order.

In the case where a silicon-based semiconductor material is used for the semiconductor film 112, the insulating film 122 preferably contains hydrogen. When the insulating film 122 containing hydrogen is provided over the first transistor 110 and heat treatment is performed, dangling bonds in the semiconductor film 112 are terminated by hydrogen contained in the insulating film 122, whereby the reliability of the first transistor 110 can be improved.

The insulating film 123 functions as a planarization film for eliminating a level difference generated by the first transistor 110 or the like underlying the insulating film 123. A top surface of the insulating film 123 may be planarized by planarization treatment using a chemical mechanical polishing (CMP) method or the like to increase planarity.

The insulating film 124 may have a function as a barrier film. The insulating film 124 is not necessarily provided.

In the insulating films 121, 122, 123, and 124, plugs 161 and 163 electrically connected to the low-resistance layers 113a and 113b, and the like are embedded, and a plug 162 electrically connected to the gate electrode 115 of the first transistor 110, and the like are embedded. Note that in this specification and the like, an electrode and a wiring electrically connected to the electrode may be a single component. In other words, there are cases where a portion of a wiring functions as an electrode and where a portion of an electrode functions as a wiring.

An electrode 136 is provided over the insulating film 124 and the plug 162. The electrode 136 is electrically connected to the plug 162.

Each of the plugs (plugs 161 to 163), the electrode 136, and the like can be formed using a conductive material such as a metal material, an alloy material, or a metal oxide material. It is preferable to use a high-melting-point material which has both heat resistance and conductivity, such as tungsten, molybdenum, titanium, or titanium nitride, and it is particularly preferable to use tungsten. Alternatively, a stacked-layer film including two or more layers containing more than one of the above high-melting-point metals may be used. For example, a two-layer structure with tungsten over titanium nitride may be used.

It is preferable that the electrode 136 be embedded in an insulating film 125, and that a top surface of the insulating film 125 be planarized.

The barrier film 120 is provided so as to cover the top surface of the insulating film 125.

The barrier film 120 has openings in which plugs 164 and 166 described later are embedded.

An insulating film 126 is provided over the barrier film 120. An oxide material from which oxygen is partly released due to heating is preferably used for the insulating film 126.

As the oxide material from which oxygen is released by heating, an oxide insulating film containing oxygen at a higher proportion than the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the substrate temperature in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The second transistor 100 is provided over the insulating film 126.

The second transistor 100 includes an oxide semiconductor film 101a in contact with a top surface of the insulating film 126, an oxide semiconductor film 101b in contact with a top surface of the oxide semiconductor film 101a, an electrode 103a and an electrode 103b in contact with a top surface of the oxide semiconductor film 101b and apart from each other in a region overlapping with the oxide semiconductor film 101b, an oxide semiconductor film 101c in contact with the top surface of the oxide semiconductor film 101b and top surfaces of the electrodes 103a and 103b, a gate insulating film 104 over the oxide semiconductor film 101c, and a gate electrode 105 overlapping with the oxide semiconductor film 101b with the gate insulating film 104 and the oxide semiconductor film 101c provided therebetween. The second transistor 100 is covered with an insulating film 107, an insulating film 108, and an insulating film 127.

The plug 164 electrically connected to the plug 161 and the electrode 103a is embedded in the insulating film 125, the barrier film 120, the insulating film 126, the oxide semiconductor film 101a, the oxide semiconductor film 101b, and the electrode 103a.

At the same time the second transistor 100 is formed, an oxide semiconductor film 131a, an oxide semiconductor film 131b, and an electrode 103c are formed, and the plug 166 electrically connected to the plug 163 and the electrode 103c is provided so as to be embedded in the insulating film 125, the barrier film 120, the insulating film 126, the oxide semiconductor film 131a, the oxide semiconductor film 131b, and the electrode 103c.

Note that at least part (or all) of the electrode 103a (and/or the electrode 103b) is provided on at least part (or all) of a surface, a side surface, a top surface, and/or a bottom surface of a semiconductor film such as the oxide semiconductor film 101b (and/or the oxide semiconductor film 101a).

Alternatively, at least part (or all) of the electrode 103a (and/or the electrode 103b) is in contact with at least part (or all) of a surface, a side surface, a top surface, and/or a bottom surface of a semiconductor film such as the oxide semiconductor film 101b (and/or the oxide semiconductor film 101a). Alternatively, at least part (or all) of the electrode 103a (and/or the electrode 103b) is in contact with at least part (or all) of a semiconductor film such as the oxide semiconductor film 101b (and/or the oxide semiconductor film 101a).

Alternatively, at least part (or all) of the electrode 103a (and/or the electrode 103b) is electrically connected to at least part (or all) of a surface, a side surface, a top surface, and/or a bottom surface of a semiconductor film such as the oxide semiconductor film 101b (and/or the oxide semiconductor film 101a). Alternatively, at least part (or all) of the electrode 103a (and/or the electrode 103b) is electrically connected to at least part (or all) of a semiconductor film such as the oxide semiconductor film 101b (and/or the oxide semiconductor film 101a).

Alternatively, at least part (or all) of the electrode 103a (and/or the electrode 103b) is provided near at least part (or all) of a surface, a side surface, a top surface, and/or a bottom surface of a semiconductor film such as the oxide semiconductor film 101b (and/or the oxide semiconductor film 101a). Alternatively, at least part (or all) of the electrode 103a (and/or the electrode 103b) is provided near at least part (or all) of a semiconductor film such as the oxide semiconductor film 101b (and/or the oxide semiconductor film 101a).

Alternatively, at least part (or all) of the electrode 103a (and/or the electrode 103b) is placed on a side of at least part (or all) of a surface, a side surface, a top surface, and/or a bottom surface of a semiconductor film such as the oxide semiconductor film 101b (and/or the oxide semiconductor film 101a). Alternatively, at least part (or all) of the electrode 103a (and/or the electrode 103b) is placed on a side of at least part (or all) of a semiconductor film such as the oxide semiconductor film 101b (and/or the oxide semiconductor film 101a).

Alternatively, at least part (or all) of the electrode 103a (and/or the electrode 103b) is provided obliquely above at least part (or all) of a surface, a side surface, a top surface, and/or a bottom surface of a semiconductor film such as the oxide semiconductor film 101b (and/or the oxide semiconductor film 101a). Alternatively, at least part (or all) of the electrode 103a (and/or the electrode 103b) is provided obliquely above at least part (or all) of a semiconductor film such as the oxide semiconductor film 101b (and/or the oxide semiconductor film 101a).

Alternatively, at least part (or all) of the electrode 103a (and/or the electrode 103b) is provided above at least part (or all) of a surface, a side surface, a top surface, and/or a bottom surface of a semiconductor film such as the oxide semiconductor film 101b (and/or the oxide semiconductor film 101a). Alternatively, at least part (or all) of the electrode 103a (and/or the electrode 103b) is provided above at least part (or all) of a semiconductor film such as the oxide semiconductor film 101b (and/or the oxide semiconductor film 101a).

For example, the oxide semiconductor preferably contains at least indium (In) or zinc (Zn). More preferably, the oxide semiconductor contains an oxide represented by an In-M-Zn-based oxide (M is a metal such as Al, Ti, Ga, Ge, Y, Zr, Sn, La, Ce, or Hf).

As the semiconductor film, it is particularly preferable to use an oxide semiconductor film including a plurality of crystal parts whose c-axes are aligned perpendicular to a surface on which the semiconductor film is formed or the top surface of the semiconductor film and in which the adjacent crystal parts have no grain boundary.

The use of such materials for the semiconductor film makes it possible to provide a highly reliable transistor in which a change in the electrical characteristics is suppressed.

Note that details of a preferable mode and a formation method of an oxide semiconductor applicable to the semiconductor film are described in an embodiment below.

The semiconductor device of one embodiment of the present invention preferably includes a first oxide semiconductor film between the oxide semiconductor film and the insulating film overlapping with the oxide semiconductor film, and the first oxide semiconductor film contains as its constituent element at least one of the metal elements that constitute the oxide semiconductor film. With such a structure, formation of a trap level at the interface between the oxide semiconductor film and the insulating film overlapping with the oxide semiconductor film can be suppressed.

That is, one embodiment of the present invention preferably has a structure in which each of the top surface and the bottom surface of at least the channel formation region of the oxide semiconductor film is in contact with an oxide film that functions as a barrier film for preventing formation of an interface state of the oxide semiconductor film With this structure, formation of oxygen vacancies and entry of impurities which cause generation of carriers in the oxide semiconductor film and at the interface can be prevented. Thus, a highly purified intrinsic oxide semiconductor film can be obtained. Obtaining a highly purified intrinsic oxide semiconductor film refers to purifying or substantially purifying the oxide semiconductor film to be an intrinsic or substantially intrinsic oxide semiconductor film. In this way, a change in electrical characteristics of a transistor including the oxide semiconductor film can be prevented, and a highly reliable semiconductor device can be provided.

Note that in this specification and the like, the carrier density of a substantially purified oxide semiconductor film is lower than $1 \times 10^{17}/cm^3$, lower than $1 \times 10^{15}/cm^3$, or lower than $1 \times 10^{13}/cm^3$. With a highly purified intrinsic oxide semiconductor film, the transistor can have stable electrical characteristics.

The oxide semiconductor film 101a is provided between the insulating film 126 and the oxide semiconductor film 101b.

The oxide semiconductor film 101c is provided between the oxide semiconductor film 101b and the gate insulating film 104. Specifically, the bottom surface of the oxide semiconductor film 101c is provided in contact with the top surfaces of the electrode 103a and the electrode 103b and the bottom surface of the gate insulating film 104.

The oxide semiconductor film 101a and the oxide semiconductor film 101c each contain an oxide containing one or more metal elements that are also contained in the oxide semiconductor film 101b.

Note that the boundary between the oxide semiconductor film 101b and the oxide semiconductor film 101a or the boundary between the oxide semiconductor film 101b and the oxide semiconductor film 101c is not clear in some cases.

For example, the oxide semiconductor films 101a and 101c contain In or Ga; typically, a material such as an In—Ga-based oxide, an In—Zn-based oxide, or an In-M-Zn-based oxide (M is Al, Ti, Ga, Y, Zr, La, Ce, Nd, or Hf) that has energy at the bottom of the conduction band closer to the vacuum level than that of the oxide semiconductor film 101b is used. Typically, the difference in energy at the bottom of the conduction band between the oxide semiconductor film 101a or 101c and the oxide semiconductor film 101b is preferably 0.05 eV or more, 0.07 eV or more, 0.1 eV or more, or 0.15 eV or more and 2 eV or less, 1 eV or less, 0.5 eV or less, or 0.4 eV or less.

For each of the oxide semiconductor films 101a and 101c between which the oxide semiconductor film 101b is sandwiched, an oxide that contains a larger amount of Ga serving as a stabilizer than that of the oxide semiconductor film 101b is used, which can suppress release of oxygen from the oxide semiconductor film 101b.

When an In—Ga—Zn-based oxide in which the atomic ratio of In to Ga and Zn is 1:1:1, 4:2:4.1, or 3:1:2 is used for the oxide semiconductor film 101b, for example, an In—Ga—Zn-based oxide in which the atomic ratio of In to Ga and Zn is 1:3:2, 1:3:4, 1:3:6, 1:6:4, 1:6:8, 1:6:10, or 1:9:6 can be used for the oxide semiconductor films 101a and 101c. Note that the proportion of each metal element in the atomic ratio of each of the oxide semiconductor films 101a, 101b, and 101c varies within a range of ±20% of that in the above atomic ratio as an error. For the oxide semiconductor films 101a and 101c, materials with the same composition or materials with different compositions may be used.

Further, when an In-M-Zn-based oxide is used for the oxide semiconductor film 101b, an oxide containing metal elements in the atomic ratio satisfying the following conditions is preferably used for a target for forming a semiconductor film to be the oxide semiconductor film 101b. Given that the atomic ratio of the metal elements in the oxide is InM:Zn=$x_1$:$y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are InM:Zn=1:1:1, InM:Zn=4:2:4.1, InM:Zn=3:1:2, and the like.

When an In-M-Zn-based oxide is used for the oxide semiconductor films 101a and 101c, an oxide containing metal elements in the atomic ratio satisfying the following conditions is preferably used for a target for forming oxide semiconductor films to be the oxide semiconductor films 101a and 101c. Given that the atomic ratio of the metal elements in the oxide is InM:Zn=$x_2$:$y_2$:$z_2$, $x_2/y_2$ is less than $x_1/y_1$, and $z_2/y_2$ is greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are InM:Zn=1:3:4, In:M:Zn=1:3:6, InM:Zn=1:3:8, InM:Zn=1:2:4, and the like.

By using a material in which the energy at the bottom of the conduction band is closer to the vacuum level than that of the oxide semiconductor film 101b is for the oxide semiconductor films 101a and 101c, a channel is mainly formed in the oxide semiconductor film 101b, so that the oxide semiconductor film 101b serves as a main current path. When the oxide semiconductor film 101b in which a channel is formed is sandwiched between the oxide semiconductor films 101a and 101c as described above, formation of interface states between these films is suppressed, and thus reliability of the electrical characteristics of the transistor is improved.

Note that, without limitation to that described above, a material with an appropriate atomic ratio may be used depending on required semiconductor characteristics and electrical characteristics (e.g., field-effect mobility and threshold voltage). To obtain the required semiconductor characteristics of the transistor, it is preferable that the carrier density, the impurity concentration, the defect density, the atomic ratio of a metal element to oxygen, the interatomic distance, the density, and the like of the oxide semiconductor films 101a, 101b, and 101c be set to appropriate values.

Here, a mixed region of the oxide semiconductor film 101a and the oxide semiconductor film 101b might exist between the oxide semiconductor film 101a and the oxide semiconductor film 101b. Further, a mixed region of the oxide semiconductor film 101b and the oxide semiconductor film 101c might exist between the oxide semiconductor film 101b and the oxide semiconductor film 101c. The mixed region has a low density of interface states. For that reason, the stack including the oxide semiconductor films 101a, 101b, and 101c has a band structure where energy at each interface and in the vicinity of the interface is changed continuously (continuous junction).

Here, a band structure is described. For easy understanding, the band structure is illustrated with the energy (Ec) at the bottom of the conduction band of each of the insulating film 125, the oxide semiconductor film 101a, the oxide semiconductor film 101b, the oxide semiconductor film 101c, and the gate insulating film 104.

Figure 5A:
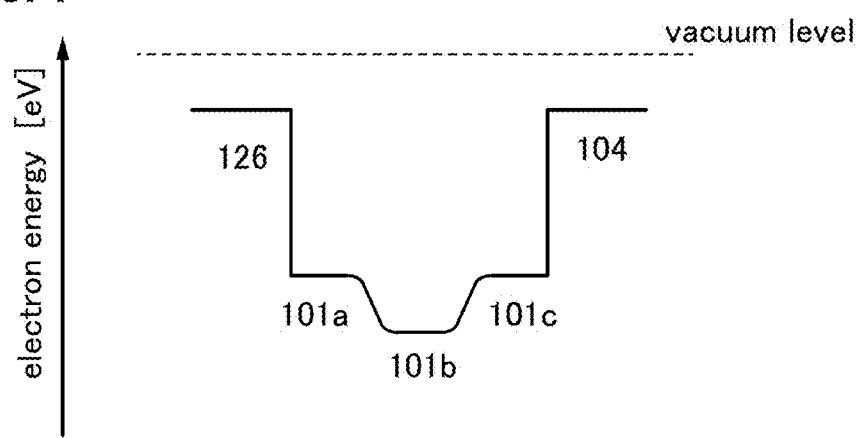
FIGS. 5A and 5B each illustrate a band structure according to an embodiment.
Figure 5B:
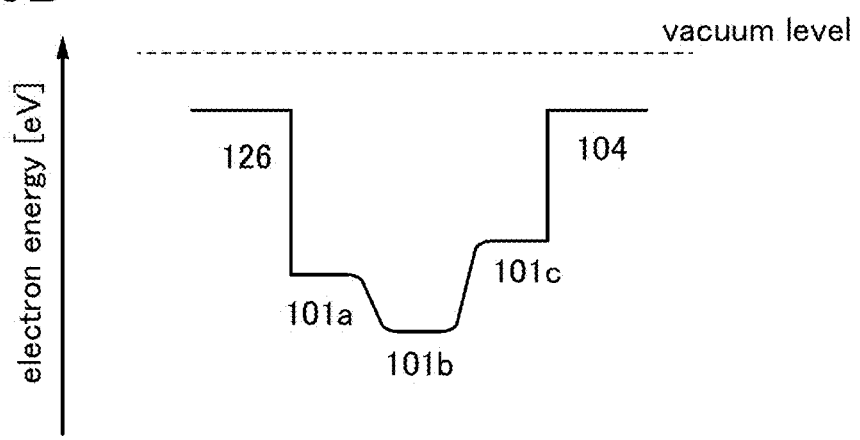

As illustrated in FIGS. 5A and 5B, the energy at the bottom of the conduction band changes continuously in the oxide semiconductor film 101a, the oxide semiconductor film 101b, and the oxide semiconductor film 101c. This can be understood also from the fact that the constituent elements are common among the oxide semiconductor film 101a, the oxide semiconductor film 101b, and the oxide semiconductor film 101c and oxygen is easily diffused among the oxide semiconductor films 101a to 101c. Thus, the oxide semiconductor films 101a to 101c have a continuous physical property although they are a stack of layers having different compositions.

The oxide semiconductor films, which contain the same main components and are stacked, are not simply stacked but formed to have continuous junction (here, particularly a U-shaped well structure where the energy at the bottom of the conduction band is continuously changed between the films). In other words, a stacked-layer structure is formed such that there exist no impurities which form a defect level such as a trap center or a recombination center at each interface. If impurities are mixed between the films in the stacked multilayer film, the continuity of the energy band is lost and carriers disappear by being trapped or recombined at the interface.

Note that FIG. 5A illustrates the case where the Ec of the oxide semiconductor film 101a and the Ec of the oxide semiconductor film 101c are equal to each other; however, they may be different from each other. For example, part of the band structure in the case where the Ec of the oxide semiconductor film 101c is higher than the Ec of the oxide semiconductor film 101a is illustrated in FIG. 5B.

As illustrated in FIGS. 5A and 5B, the oxide semiconductor film 101b serves as a well and a channel of the second transistor 100 is formed in the oxide semiconductor film 101b. Note that since the energies at the bottoms of the conduction bands are changed continuously, the oxide semiconductor films 101a, 101b, and 101c can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the oxide semiconductor films 101a and 101c. The oxide semiconductor film 101b can be distanced away from the trap levels owing to existence of the oxide semiconductor films 101a and 101c. However, when the energy difference between the Ec of the oxide semiconductor film 101a or 101c and the Ec of the oxide semiconductor film 101b is small, an electron in the oxide semiconductor film 101b might reach the trap level across the energy difference. When the electron is trapped in the trap level, a negative fixed charge is generated at the interface with the insulating film, whereby the threshold voltage of the transistor is shifted in the positive direction.

Thus, to reduce a change in the threshold voltage of the transistor, an energy difference between the Ec of the oxide semiconductor film 101b and the Ec of each of the oxide semiconductor films 101a and 101c is necessary. The energy difference is preferably greater than or equal to 0.1 eV, further preferably greater than or equal to 0.15 eV.

The oxide semiconductor films 101a, 101b, and 101c preferably include crystal parts. In particular, when a crystal in which c-axes are aligned is used, the transistor can have stable electrical characteristics.

In the band structure illustrated in FIG. 5B, instead of the oxide semiconductor film 101c, an In—Ga oxide (e.g., with an atomic ratio of In:Ga=7:93) may be provided between the oxide semiconductor film 101b and the gate insulating film 104.

For the oxide semiconductor film 101b, an oxide having an electron affinity higher than that of each of the oxide semiconductor films 101a and 101c is used. For example, for the oxide semiconductor film 101b, an oxide having an electron affinity higher than that of each of the oxide semiconductor films 101a and 101c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the bottom of the conduction band.

Here, it is preferable that the thickness of the oxide semiconductor film 101b be at least larger than that of the oxide semiconductor film 101a. The thicker the oxide semiconductor film 101b is, the larger the on-state current of the transistor can be. The thickness of the oxide semiconductor film 101a may be set as appropriate as long as formation of an interface state at the interface with the oxide semiconductor film 101b is inhibited. For example, the thickness of the oxide semiconductor film 101b is larger than that of the oxide semiconductor film 101a, preferably 2 or more times, further preferably 4 or more times, still further preferably 6 or more times as large as that of the oxide semiconductor film 101a. Note that the above does not apply in the case where the on-state current of the transistor need not be increased, and the thickness of the oxide semiconductor film 101a may be larger than or equal to than that of the oxide semiconductor film 101b.

The thickness of the oxide semiconductor film 101c may be set as appropriate, in a manner similar to that of the oxide semiconductor film 101a, as long as formation of an interface state at the interface with the oxide semiconductor film 101b is inhibited. For example, the thickness of the oxide semiconductor film 101c may be set smaller than or equal to that of the oxide semiconductor film 101a. If the oxide semiconductor film 101c is thick, it may become difficult for the electric field from the gate electrode to reach the oxide semiconductor film 101b. Therefore, it is preferable that the oxide semiconductor film 101c be thin, for example, thinner than the oxide semiconductor film 101b. Note that the thickness of the oxide semiconductor film 101c is not limited to the above, and may be set as appropriate depending on a driving voltage of the transistor in consideration of the withstand voltage of the gate insulating film 104.

Here, in the case where the oxide semiconductor film 101b is in contact with an insulating film containing different constituent elements (e.g., an insulating film containing a silicon oxide film), an interface state is sometimes formed at the interface between the two films and the interface state forms a channel. In that case, a second transistor having a different threshold voltage may be formed, and accordingly an apparent threshold voltage of the transistor may fluctuate. However, in the transistor of this structural example, the oxide semiconductor film 101a contains one or more kinds of metal elements that constitute the oxide semiconductor film 101b. Therefore, an interface state is not easily formed at the interface between the oxide semiconductor film 101a and the oxide semiconductor film 101b. Thus, providing the oxide semiconductor film 101a makes it possible to reduce variations or changes in electrical characteristics of the transistor, such as threshold voltage.

When a channel is formed at the interface between the gate insulating film 104 and the oxide semiconductor film 101b, interface scattering occurs at the interface and the field-effect mobility of the transistor decreases in some cases. In the transistor of this structural example, however, the oxide semiconductor film 101c contains one or more kinds of metal elements that constitute the oxide semiconductor film 101b. Therefore, scattering of carriers is less likely to occur at the interface between the oxide semiconductor film 101b and the oxide semiconductor film 101c, and thus the field-effect mobility of the transistor can be increased.

One of the electrodes 103a and 103b serves as a source electrode and the other serves as a drain electrode.

Each of the electrodes 103a and 103b is formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. A transparent conductive material containing indium oxide, tin oxide, or zinc oxide may be used.

As the gate insulating film 104, an insulating film containing a so-called high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or (Ba, Sr)$TiO_3$ (BST) can be used, for example. The insulating film may have a single-layer structure or a stacked-layer structure. Alternatively, aluminum oxide, bismuth oxide, germanium oxide, niobium oxide, silicon oxide, titanium oxide, tungsten oxide, yttrium oxide, or zirconium oxide may be added to the insulating film, for example. Alternatively, the insulating film may be subjected to nitriding treatment. Silicon oxide, silicon oxynitride, or silicon nitride may be stacked over the above insulating film.

As the gate insulating film 104, like the insulating film 126, an oxide insulating film that contains more oxygen than that in the stoichiometric composition is preferably used.

When a specific material is used for the gate insulating film, electrons are trapped in the gate insulating film under specific conditions and the threshold voltage can be increased. For example, like a stacked-layer film of silicon oxide and hafnium oxide, part of the gate insulating film uses a material having a lot of electron trap states, such as hafnium oxide, aluminum oxide, and tantalum oxide, and the state where the potential of the gate electrode is higher than that of the source electrode or the drain electrode is kept for one second or more, specifically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the semiconductor film to the gate electrode, and some of the electrons are trapped by the electron trap states.

In the transistor in which a necessary amount of electrons is trapped by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the transistor.

For example, the treatment is preferably performed at any step before factory shipment, such as after the formation of a wiring connected to the source electrode or the drain electrode of the transistor, after pretreatment (wafer processing), after a wafer-dicing step, after packaging, or the like. In any case, it is preferable that the transistor not be exposed to a temperature higher than or equal to 125° C. for one hour or more after that.

The gate electrode 105 can be formed using, for example, a metal selected from aluminum, chromium, copper, tantalum, titanium, molybdenum, and tungsten; an alloy containing any of these metals as a component; an alloy containing any of these metals in combination; or the like. Furthermore, one or more metals selected from manganese and zirconium may be used. Alternatively, a semiconductor typified by polycrystalline silicon doped with an impurity element such as phosphorus, or silicide such as nickel silicide may be used. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more metals selected from titanium, tantalum, tungsten, molybdenum, chromium, neodymium, and scandium may be used.

The gate electrode 105 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

A plug 167 electrically connected to the plug 164 is embedded in the insulating film 127, the insulating film 108, and the insulating film 107. A plug 168 electrically connected to the gate electrode 105 is embedded in the insulating film 127, the insulating film 108, and the insulating film 107. A plug 169 electrically connected to the plug 166 is embedded in the insulating film 127, the insulating film 108, and the insulating film 107.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 105 and the gate insulating film 104. These films each have a work function higher than or equal to 5 eV, preferably higher than or equal to 5.5 eV, which is higher than the electron affinity of an oxide semiconductor. Thus, the threshold voltage of the transistor including an oxide semiconductor can be shifted in the positive direction, and what is called a normally-off switching element can be achieved. For example, in the case of using an In—Ga—Zn-based oxynitride semiconductor film, an In—Ga—Zn-based oxynitride semiconductor film having a higher nitrogen concentration than that of at least the oxide semiconductor film 101b, specifically, an In—Ga—Zn-based oxynitride semiconductor film having a nitrogen concentration of 7 at. % or higher is used.

For the insulating film 107, like the barrier film 120, a material relatively impermeable to water or hydrogen is preferably used. In particular, for the insulating film 107, a material relatively impermeable to oxygen is preferably used.

By covering the oxide semiconductor film 101b with the insulating film 107 including a material relatively impermeable to oxygen, oxygen can be prevented from being released from the oxide semiconductor film 101b to a portion over the insulating film 107. Furthermore, oxygen released from the insulating film 126 can be confined below the insulating film 107, resulting in an increase in the amount of oxygen to be supplied to the oxide semiconductor film 101b.

The insulating film 107 relatively impermeable to water or hydrogen can inhibit water or hydrogen, which is an impurity for an oxide semiconductor, from entering the oxide semiconductor film 101b from the outside; therefore, a change in the electrical characteristics of the second transistor 100 can be suppressed and the transistor can have high reliability.

Note that an insulating film from which oxygen is released by heating, like the insulating film 126, may be provided under the insulating film 107 to supply oxygen also from a portion over the oxide semiconductor film 101b through the gate insulating film 104.

Here, the area occupied by the semiconductor device including the first transistor 110 and the second transistor 100 is described with reference to FIGS. 2A to 2C.

Figure 2A:
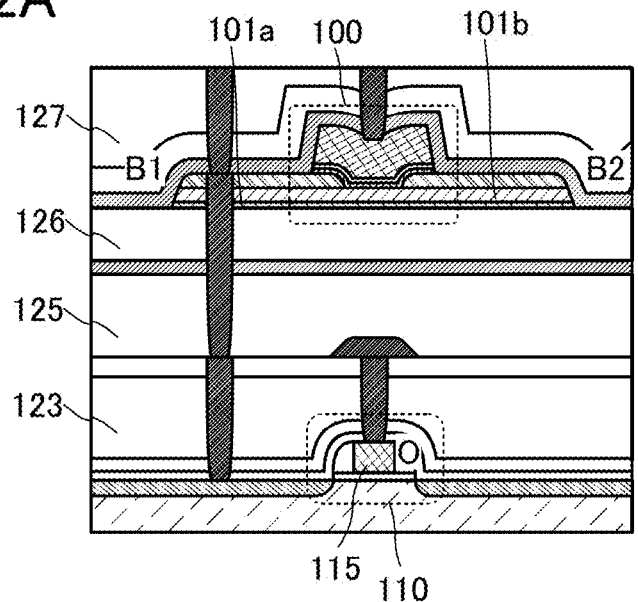
FIGS. 2A to 2C illustrate an area occupied by a semiconductor device according to an embodiment.

FIG. 2A is a partial cross-sectional view of FIG. 1B including the first transistor 110 and the second transistor 100. In order to miniaturize the semiconductor device and decrease the area occupied by the semiconductor device, the first transistor 110 and the second transistor 100 are preferably stacked. In particular, the gate electrode 115 of the first transistor 110 and the gate electrode 105 of the second transistor 110 preferably overlap with each other.

Note that when point O illustrated in FIG. 2A is the center of the top surface of the gate electrode 115 of the first transistor 110 and line B1-B2 corresponds to the long side of the bottom surface of the oxide semiconductor film 101a, it is preferable that <B1-O-B2 of triangle B1-O-B2 in FIG. 2A be 120° or less, more preferably 90° or less, further preferably 60°. As <B1-O-B2 decreases, the area occupied by the semiconductor device decreases.

Figure 2B:
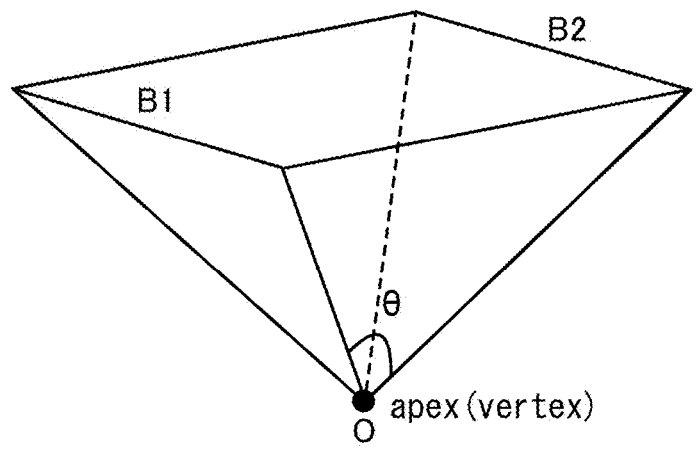

FIG. 2B illustrates an upside-down quadrangular pyramid (hereinafter referred to as an inverted quadrangular pyramid). The inverted quadrangular pyramid has a square and first to fourth isosceles triangles. It is preferable that the center of the top surface of the gate electrode 115 of the first transistor 110 be at the vertex of one of the isosceles triangles, that the bottom surface of the oxide semiconductor film 101a fit inside the square, and that the second transistor 100 fit inside the inverted quadrangular pyramid with the vertex angle of one of the isosceles triangles being 120° or less. It is more preferable that the vertex angle of one of the isosceles triangles be 90° or less, further preferably 60° or less. As the vertex angle of one of the isosceles triangles decreases, the area occupied by the semiconductor device decreases.

Figure 2C:
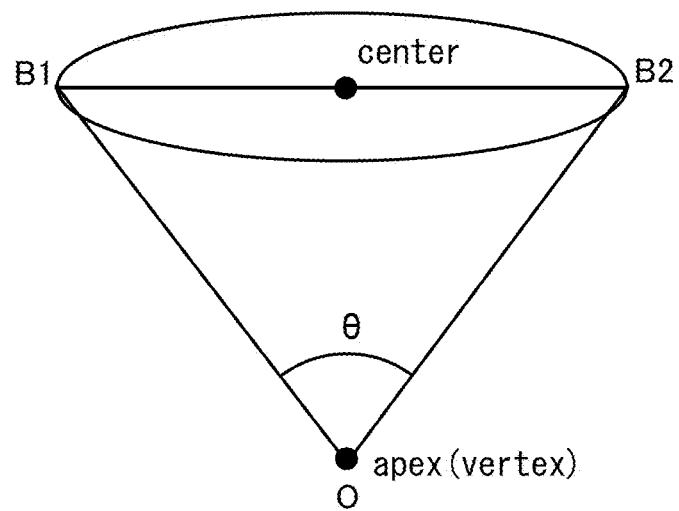

FIG. 2C illustrates an upside-down right circular cone (hereinafter referred to as an inverted right circular cone). The inverted right circular cone has a circle. A plane passing through the vertex of the inverted right circular cone and the center of the circle has an isosceles triangle. It is preferable that the center of the top surface of the gate electrode 115 of the first transistor 110 be at the vertex of the isosceles triangle, that the bottom surface of the oxide semiconductor film 101a fit inside the circle, and that the second transistor 100 fit inside the inverted right circular cone with the vertex angle of the isosceles triangle being 120° or less. It is more preferable that the vertex angle of the isosceles triangle be 90° or less, further preferably 60° or less. As the vertex angle of the isosceles triangle decreases, the area occupied by the semiconductor device decreases.

Figure 6A:
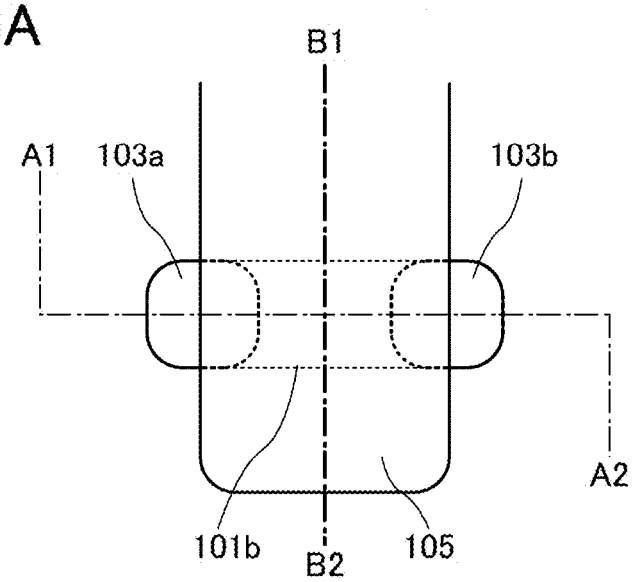
FIGS. 6A to 6C illustrate an example of a structure of a semiconductor device according to an embodiment.
Figure 6B:
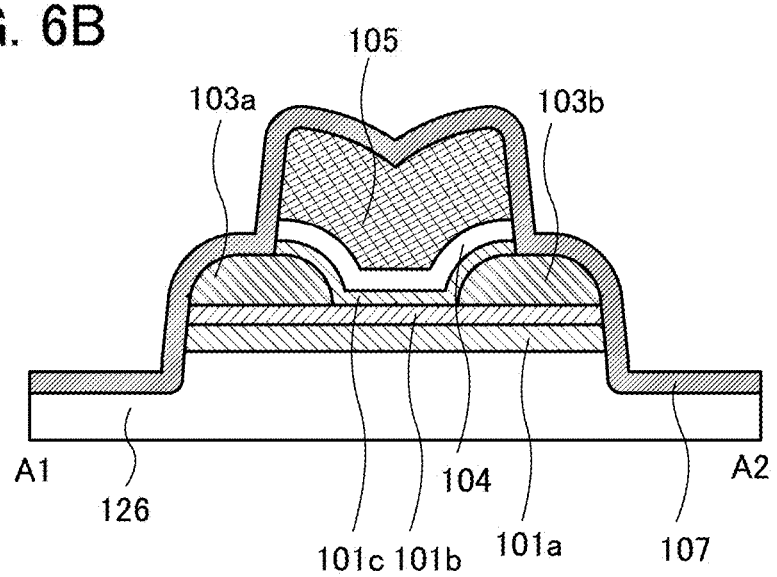
Figure 6C:
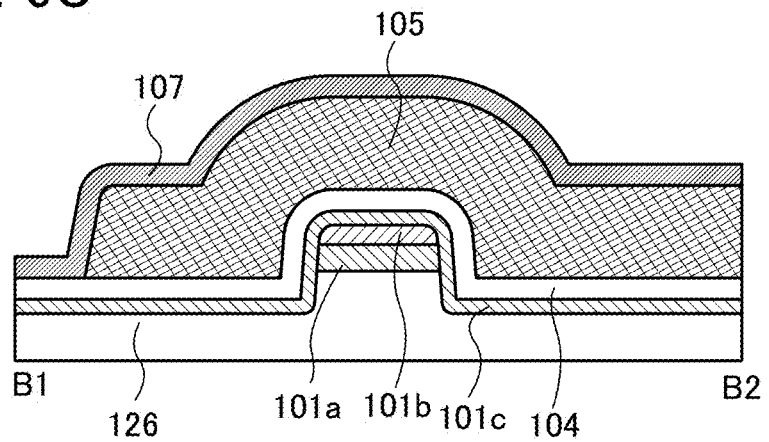

An example of a structure of a transistor which can be used as the second transistor 100 is described. FIG. 6A is a schematic top view of a transistor described below as an example, and FIGS. 6B and 6C are schematic cross-sectional views taken along section lines A1-A2 and B1-B2, respectively, in FIG. 6A. Note that FIG. 6B corresponds to a cross section of the transistor in a channel length direction, and FIG. 6C corresponds to a cross section of the transistor in a channel width direction.

As illustrated in FIG. 6C, the gate electrode is provided so as to face top and side surfaces of the oxide semiconductor film 101b in the cross section of the transistor in the channel width direction. Thus, a channel is formed not only in the vicinity of the top surface but also in the vicinity of the side surface of the oxide semiconductor film 101b, and the effective channel width is increased. Accordingly, current in an on state (on-state current) can be increased. In the case where the width of the oxide semiconductor film 101b is particularly very small (e.g., 50 nm or less, preferably 30 nm or less, more preferably 20 nm or less), a region where the channel is formed expands to an inner portion of the oxide semiconductor film 101b. Thus, as miniaturization advances, contribution of this structure to on-state current increases.

Figure 7A:
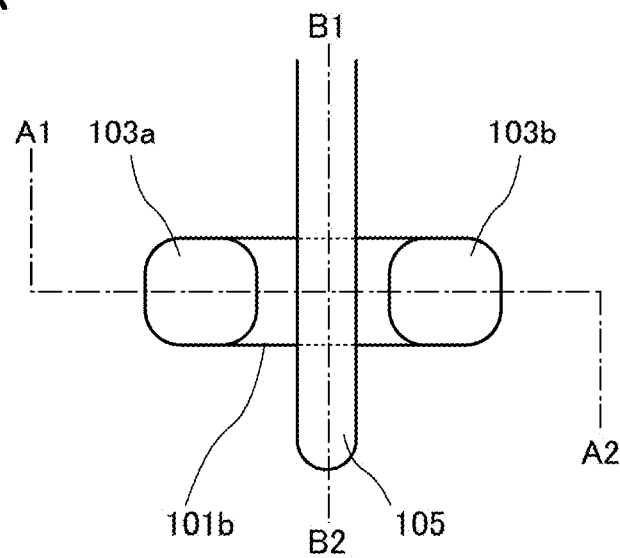
FIGS. 7A to 7C illustrate an example of a structure of a semiconductor device according to an embodiment.
Figure 7B:
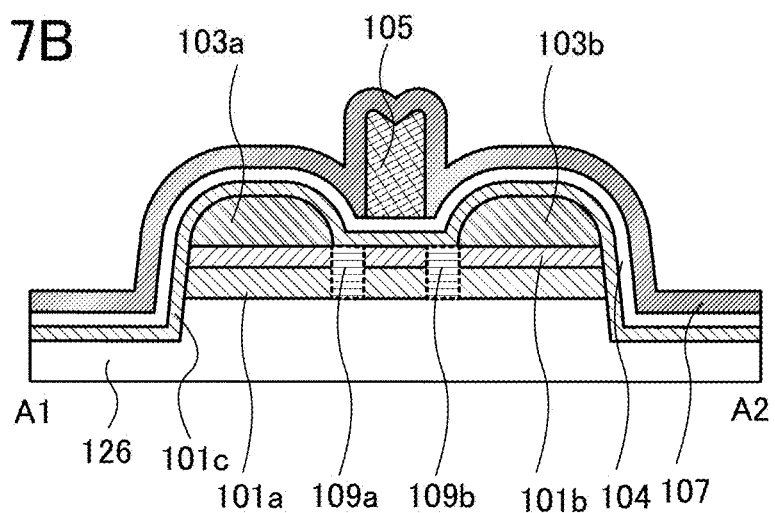
Figure 7C:
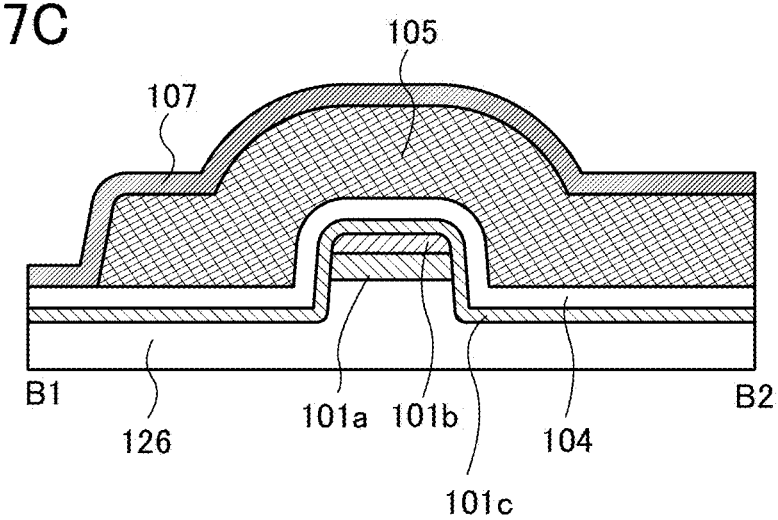

Note that the width of the gate electrode 105 may be made small as illustrated in FIGS. 7A to 7C. In that case, an impurity such as argon, hydrogen, phosphorus, or boron can be introduced into the oxide semiconductor film 101b or the like using the electrodes 103a and 103b, the gate electrode 105, and the like as a mask, for example. As a result, low-resistance regions 109a and 109b can be provided in the oxide semiconductor film 101b or the like. Note that the low-resistance regions 109a and 109b are not necessarily provided. Note that the width of the gate electrode 105 can be made small not only in FIGS. 6A to 6C but also in other diagrams.

Figure 8A:
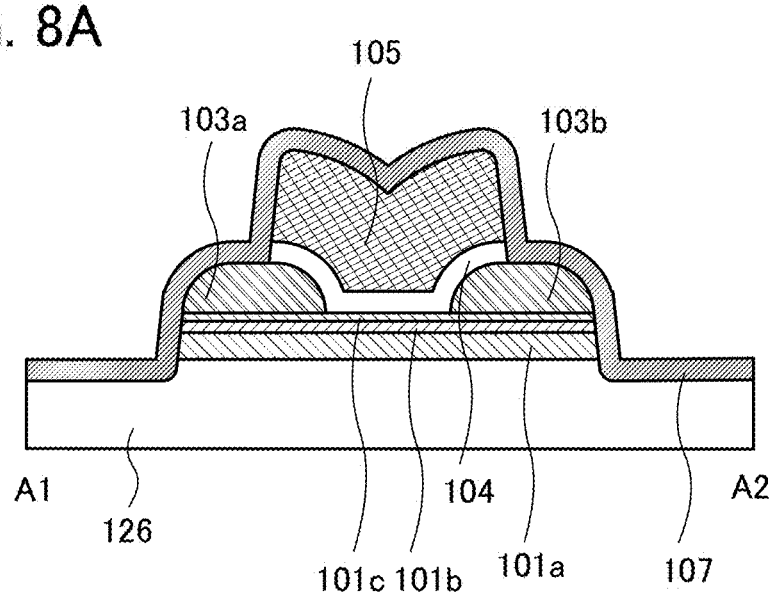
FIGS. 8A and 8B illustrate an example of a structure of a semiconductor device according to an embodiment.
Figure 8B:
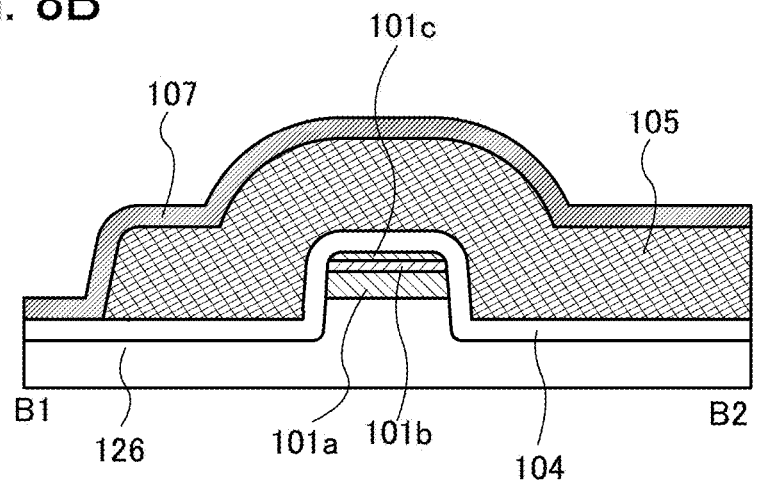

A transistor illustrated in FIGS. 8A and 8B differs from the transistor illustrated in FIGS. 6A to 6C mainly in that the oxide semiconductor film 101c is provided in contact with bottom surfaces of the electrodes 103a and 103b.

Such a structure enables films used for the oxide semiconductor films 101a, 101b, and 101c to be formed successively without contact with the air and therefore can reduce defects at each interface.

Although the oxide semiconductor film 101a and the oxide semiconductor film 101c are provided in contact with the oxide semiconductor film 101b in the above-described structure, only one of the oxide semiconductor films 101a and 101c or neither of them may be provided.

Figure 9A:
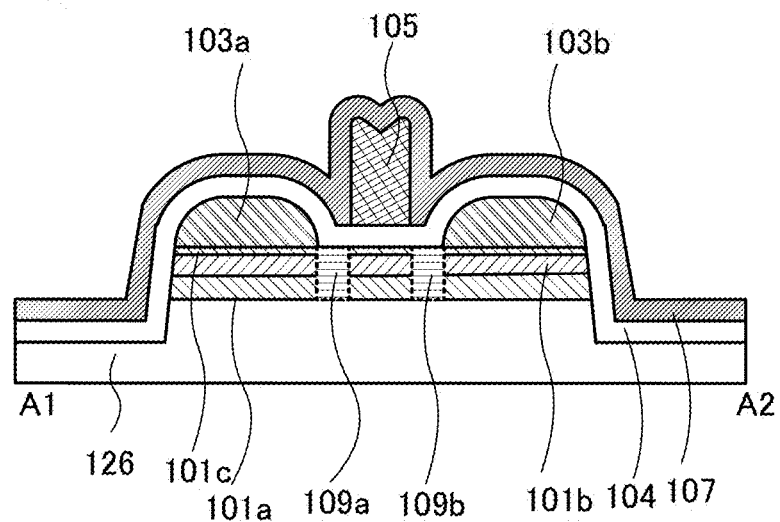
FIGS. 9A and 9B illustrate an example of a structure of a semiconductor device according to an embodiment.
Figure 9B:
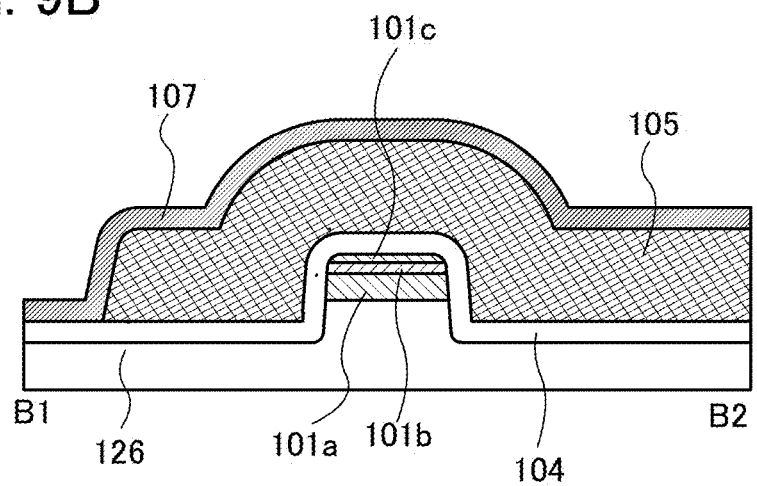

Note that the width of the gate electrode 105 can be made small in FIGS. 8A and 8B as well as in FIGS. 6A to 6C. An example in that case is illustrated in FIGS. 9A and 9B. Note that the width of the gate electrode 105 can be made small not only in FIGS. 6A to 6C and FIGS. 8A and 8B but also in other diagrams.

Figure 10A:
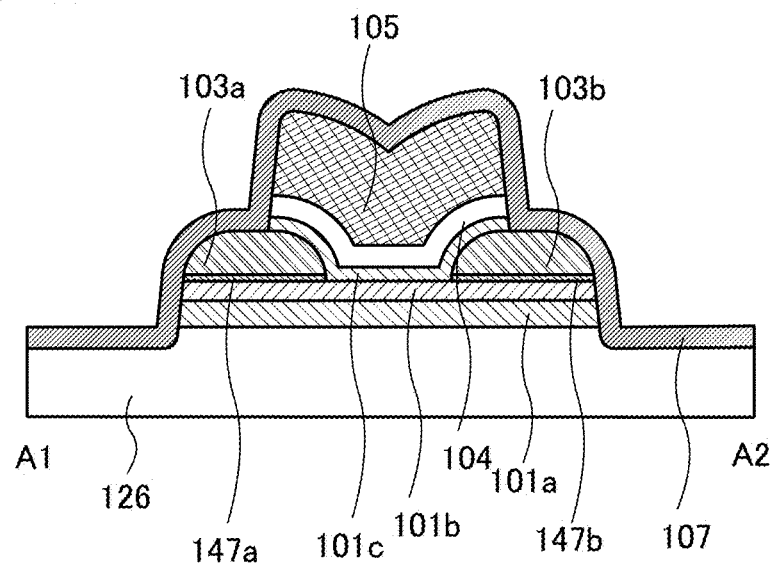
FIGS. 10A and 10B illustrate an example of a structure of a semiconductor device according to an embodiment.
Figure 10B:
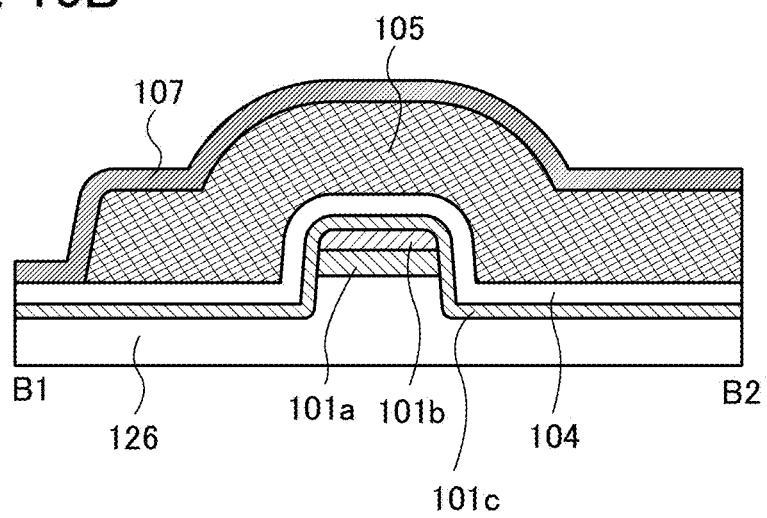

As illustrated in FIGS. 10A and 10B, it is possible to provide a layer 147a between and in contact with the oxide semiconductor film 101b and the electrode 103a and a layer 147b between and in contact with the oxide semiconductor film 101b and the electrode 103b.

The layers 147a and 147b may be formed using a transparent conductor, an oxide semiconductor, a nitride semiconductor, or an oxynitride semiconductor, for example. The layers 147a and 147b may be formed using, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, or the like. Alternatively, any of these layers may contain hydrogen, carbon, nitrogen, silicon, germanium, or argon.

The layers 147a and 147b may have a property of transmitting visible light. Alternatively, the layers 147a and 147b may have a property of not transmitting visible light, ultraviolet light, infrared light, or X-rays by reflecting or absorbing it. In some cases, such a property can suppress a change in electrical characteristics of the transistor due to stray light.

The layers 147a and 147b may preferably be formed using a layer which does not form a Schottky barrier with the oxide semiconductor film 101b or the like. Accordingly, on-state characteristics of the transistor can be improved.

Note that the layers 147a and 147b may preferably be formed using a layer having a resistance higher than that of the electrodes 103a and 103b. The layers 147a and 147b may preferably be formed using a layer having a resistance lower than that of the channel of the transistor. For example, the layers 147a and 147b may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 147a and 147b having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the layers 147a and 147b (e.g., the layer on the drain side) may preferably be provided.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

The above is the description of the second transistor 100.

The insulating film 127 covering the second transistor 100 functions as a planarization film which covers an uneven surface shape of an underlying layer. The insulating film 108 may function as a protective film when the insulating film 127 is formed. The insulating film 108 is not necessarily provided.

A plug 170 is embedded in an insulating film 128 and is electrically connected to the plug 167. A plug 171 is embedded in the insulating film 128 and is electrically connected to the plug 168. A plug 172 is embedded in the insulating film 128 and is electrically connected to the plug 169.

An electrode 173 is electrically connected to the plug 170. An electrode 174 is electrically connected to the plug 171. An electrode 175 is electrically connected to the plug 172.

The semiconductor device in one embodiment of the present invention includes the first transistor 110 and the second transistor 100 over the first transistor. Since these transistors are stacked, the area occupied by the elements can be decreased. Furthermore, the barrier film 120 provided between the first transistor 110 and the second transistor 100 can suppress diffusion of impurities such as water and hydrogen from an underlying layer to the second transistor 100 side.

The above is the description of a structural example.

[Example of Manufacturing Method]

An example of a method for manufacturing the semiconductor device described in the above structural example is described below with reference to FIGS. 11A to 11D, FIGS. 12A to 12C, FIGS. 13A and 13B, FIGS. 14A and 14B, FIGS. 15A and 15B, and FIGS. 16A and 16B.

First, the semiconductor substrate 111 is prepared. As the semiconductor substrate 111, a single crystal silicon substrate (including a p-type semiconductor substrate or an n-type semiconductor substrate), a compound semiconductor substrate containing silicon carbide or gallium nitride, or the like can be used, for example. An SOI substrate may be used as the semiconductor substrate 111. The case where single crystal silicon is used for the semiconductor substrate 111 is described below.

Next, an element isolation layer (not illustrated) is formed in the semiconductor substrate 111. The element isolation layer may be formed by a local oxidation of silicon (LOCOS) method, a shallow trench isolation (STI) method, or the like.

In the case where a p-channel transistor and an n-channel transistor are formed on the same substrate, an n-well or a p-well may be formed in part of the semiconductor substrate 111. For example, a p-well may be formed by adding an impurity element imparting p-type conductivity, such as boron, to an n-type semiconductor substrate 111, and an n-channel transistor and a p-channel transistor may be formed on the same substrate.

Next, an insulating film to be the gate insulating film 114 is formed over the semiconductor substrate 111. For example, after surface nitriding treatment, oxidizing treatment may be performed to oxidize the interface between silicon and silicon nitride, whereby a silicon oxynitride film may be formed. For example, a silicon oxynitride film can be obtained by performing oxygen radical oxidation after a thermal silicon nitride film is formed on the surface at 700° C. in an $NH_3$ atmosphere.

The insulating film may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like.

Then, a conductive film to be the gate electrode 115 is formed. It is preferable that the conductive film be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Still alternatively, a stacked-layer structure including a film of metal nitride and a film of any of the above metals may be used. As the metal nitride, tungsten nitride, molybdenum nitride, or titanium nitride can be used. When the metal nitride film is provided, adhesiveness of the metal film can be increased; thus, separation can be prevented. A metal film which controls the work function of the gate electrode 115 may be provided.

The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Next, a resist mask is formed over the conductive film by a lithography process or the like and unnecessary portions of the conductive film are removed. Then, the resist mask is removed. Thus, the gate electrode 115 can be formed.

Here, a method for processing a film is described. In the case of finely processing a film, a variety of fine processing techniques can be used. For example, a method may be used in which a resist mask formed by a lithography process or the like is subjected to slimming treatment. Alternatively, a method may be used in which a dummy pattern is formed by a lithography process or the like, the dummy pattern is provided with a sidewall and is then removed, and a film is etched using the remaining sidewall as a mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely fine processing can be performed. Note that in the case of performing exposure by scanning of a beam such as an electron beam, a photomask is not needed.

An organic resin film having a function of improving adhesion between a film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film In the case of fine processing, in particular, a material serving as a film having a function of preventing reflection of light for the exposure is preferably used for the organic resin film Examples of the organic resin film having such a function include a bottom anti-reflection coating (BARC) film. The organic resin film may be removed at the same time as the removal of the resist mask or after the removal of the resist mask.

After the gate electrode 115 is formed, a sidewall covering a side surface of the gate electrode 115 may be formed. The sidewall can be formed in such a manner that an insulating film thicker than the gate electrode 115 is formed and subjected to anisotropic etching so that only a portion of the insulating film on the side surface of the gate electrode 115 remains.

The insulating film to be the gate insulating film 114 is etched at the same time as the formation of the sidewall, whereby the gate insulating film 114 is formed under the gate electrode 115 and the sidewall. Alternatively, after the gate electrode 115 is formed, the gate insulating film 114 may be formed by etching the insulating film using the gate electrode 115 or a resist mask for forming the gate electrode 115 as an etching mask. Alternatively, the insulating film can be used as the gate insulating film 114 without being processed by etching.

Figure 11A:
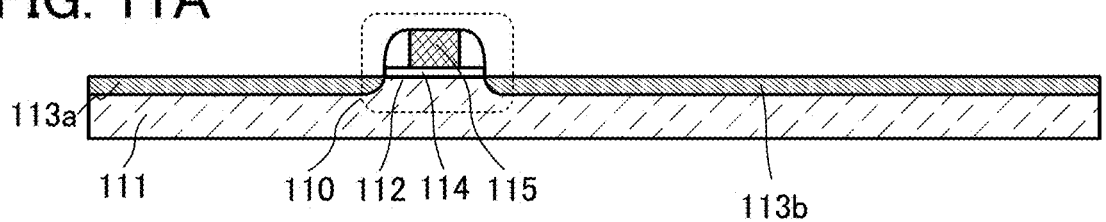
FIGS. 11A to 11D illustrate an example of a method for manufacturing a semiconductor device according to an embodiment.

Next, an element which imparts n-type conductivity, such as phosphorus, or an element which imparts p-type conductivity, such as boron, is added to a region of the semiconductor substrate 111 where the gate electrode 115 (and the sidewall) is not provided. FIG. 11A is a schematic cross-sectional view at this stage.

Next, the insulating film 121 is formed, and then, first heat treatment is performed to activate the aforementioned element which imparts conductivity.

The insulating film 121 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating film 121 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

The first heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

At this stage, the first transistor 110 is formed.

Next, the insulating film 122 and the insulating film 123 are formed.

The insulating film 122 can be formed using any of the materials that can be used for the insulating film 121, and is preferably formed using silicon nitride containing oxygen and hydrogen (SiNOH) because the amount of hydrogen released by heating can be increased. The insulating film 123 can be formed using any of the materials that can be used for the insulating film 121, and is preferably formed using silicon oxide with high step coverage which is formed by reacting tetraethyl orthosilicate (TEOS), silane, or the like with oxygen, nitrous oxide, or the like.

The insulating film 122 and the insulating film 123 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

Next, the top surface of the insulating film 123 is planarized by a CMP method or the like.

After that, second heat treatment is performed so that dangling bonds in the semiconductor film 112 are terminated by hydrogen released from the insulating film 122.

The second heat treatment can be performed under the conditions given as an example in the above description of the first heat treatment.

Then, the insulating film 124 is formed over the insulating film 123.

Figure 11B:
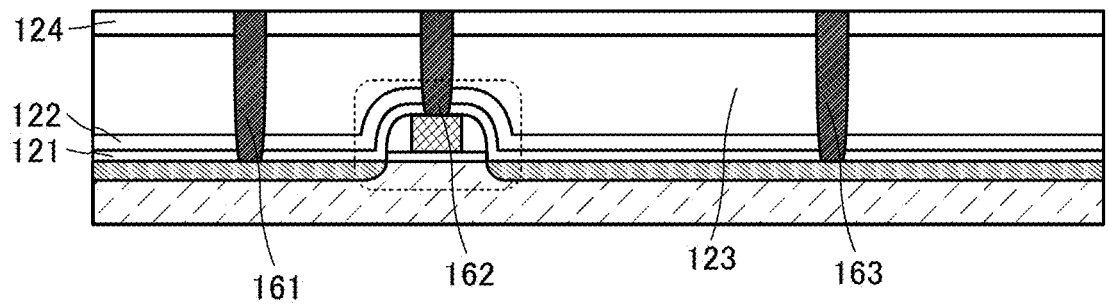

Next, openings are formed in the insulating films 121, 122, 123, and 124 so as to reach the low-resistance layers 113a and 113b, the gate electrode 115, and the like. After that, a conductive film is formed so as to fill the openings, and the conductive film is subjected to planarization treatment to expose a top surface of the insulating film 124, whereby the plug 161, the plug 162, the plug 163, and the like are formed. The conductive film can be formed by a sputtering method, a CVD method (including a thermal CVD method, an MOCVD method, a PECVD method, and the like), an MBE method, an ALD method, a PLD method, or the like. FIG. 11B is a schematic cross-sectional view at this stage.

Figure 11C:
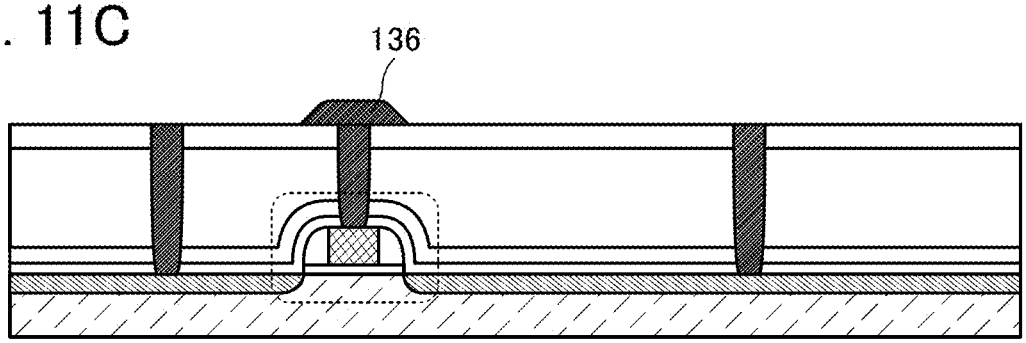

The electrode 136 is formed over the insulating film 124 (see FIG. 11C).

Next, the insulating film 125 is formed so as to cover the electrode 136, and a top surface of the insulating film 125 is planarized by a CMP method or the like. An insulating film to be the insulating film 125 can be formed using a material and a method similar to those for the insulating film 121 or the like.

After the insulating film 125 is formed, third heat treatment is preferably performed. By the third heat treatment, water and hydrogen are released from each layer; thus, the contents of water and hydrogen can be reduced. In the case where the third heat treatment is performed shortly before formation of the barrier film 120 to be described later to thoroughly remove hydrogen and water from layers under the barrier film 120 and then the barrier film 120 is formed, it is possible to suppress diffusion and release of water and hydrogen to the side under the barrier film 120 in a later step.

The third heat treatment can be performed under the conditions given as an example in the above description of the first heat treatment.

Figure 11D:
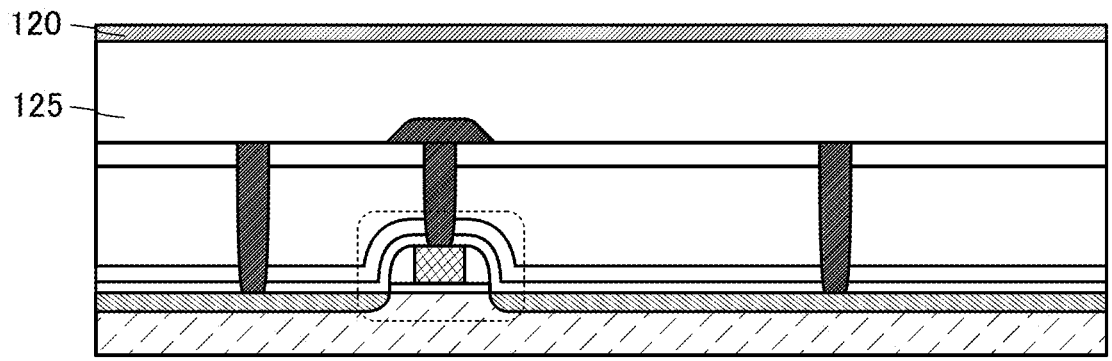

Next, the barrier film 120 is formed over the insulating film 125 (see FIG. 11D).

The barrier film 120 can be formed by a sputtering method, a CVD method (including a thermal CVD method, an MOCVD method, a PECVD method, and the like), an MBE method, an ALD method, a PLD method, or the like, for example In particular, it is preferable that the barrier film be formed by a CVD method, further preferably a plasma CVD method because coverage can be further improved. It is preferable to use a thermal CVD method, an MOCVD method, or an ALD method in order to reduce plasma damage.

After the barrier film 120 is formed, heat treatment may be performed to reduce water and hydrogen contained in the barrier film 120 or suppress release of a gas.

An insulating film to be the insulating film 126 is formed over the barrier film 120. The insulating film to be the insulating film 126 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

In order to make the insulating film to be the insulating film 126 contain excess oxygen, the insulating film to be the insulating film 126 may be formed in an oxygen atmosphere, for example. Alternatively, a region containing excess oxygen may be formed by introducing oxygen into the insulating film to be the insulating film 126 that has been formed. Both the methods may be combined.

For example, oxygen (at least including any of oxygen radicals, oxygen atoms, and oxygen ions) is introduced into the insulating film to be the insulating film 126 which has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introduction treatment. As the gas containing oxygen, oxygen, dinitrogen monoxide, nitrogen dioxide, carbon dioxide, carbon monoxide, and the like can be used. Further, a rare gas may be included in the gas containing oxygen for the oxygen introduction treatment. For example, a mixed gas of carbon dioxide, hydrogen, and argon can be used.

Figure 12A:
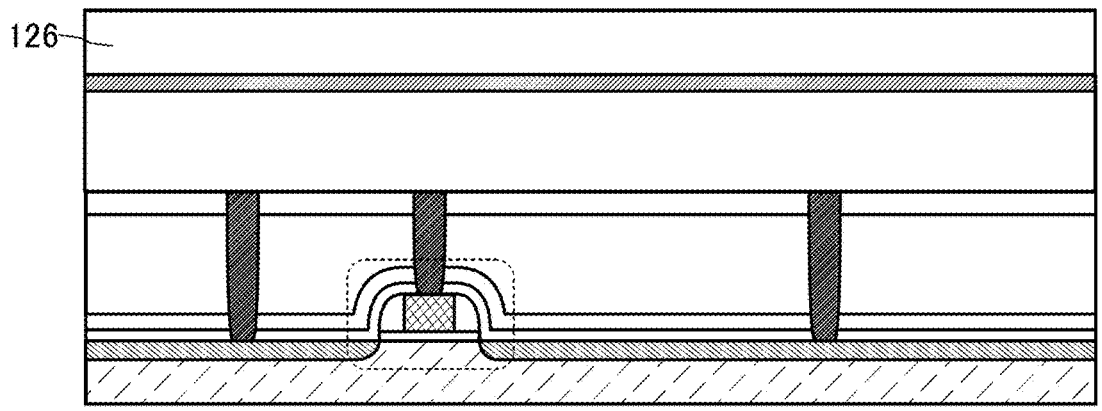
FIGS. 12A to 12C illustrate an example of a method for manufacturing a semiconductor device according to an embodiment.

After the insulating film to be the insulating film 126 is formed, the insulating film 126 is formed by performing planarization treatment using a CMP method or the like to improve planarity of a top surface of the insulating film (see FIG. 12A).

Next, an oxide semiconductor film 102a to be the oxide semiconductor film 101a and an oxide semiconductor film 102b to be the oxide semiconductor film 101b are formed sequentially. The oxide semiconductor films are preferably formed successively without contact with the air.

After the oxide semiconductor film 102b is formed, fourth heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidizing gas at 10 ppm or more, in order to compensate for released oxygen. The heat treatment may be performed directly after the formation of the oxide semiconductor film 102b or may be performed after the oxide semiconductor film 102b is processed into the island-shaped oxide semiconductor film 101b. Through the heat treatment, oxygen can be supplied to the oxide semiconductor film from the insulating film 126; thus, oxygen vacancies in the semiconductor film can be reduced.

Figure 12B:
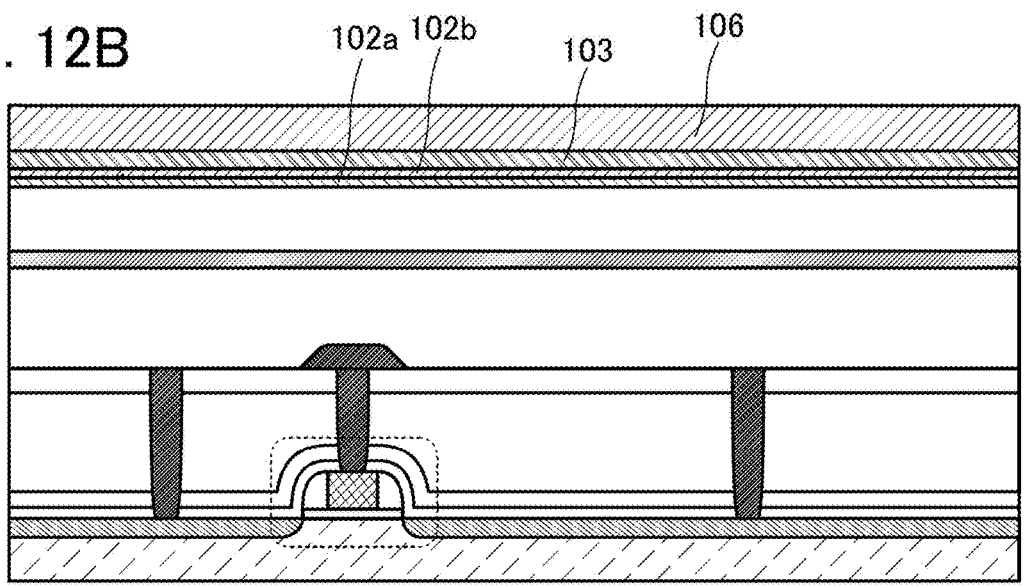

Next, a conductive film 103 to be a hard mask and an insulating film 106 are sequentially formed over the oxide semiconductor film 102b (see FIG. 12B). The conductive film 103 can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage. The insulating film 106 can be formed using, for example, a silicon nitride film, a silicon oxide film, a silicon oxynitride film, or the like by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

Described next is an example of a method for forming fine openings in the oxide semiconductor film 102b, the oxide semiconductor film 102a, the insulating film 126, the barrier film 120, and the insulating film 125 by using the two layers of the insulating film 106 and the conductive film 103 as a hard mask so as to reach the plug 161, the plug 163, and the electrode 136.

A resist mask 141 is formed over the insulating film 106 using a method similar to that described above. An organic resin film may be formed between the insulating film 106 and the resist mask in order to improve the adhesion between the insulating film 106 and the resist mask.

Figure 12C:
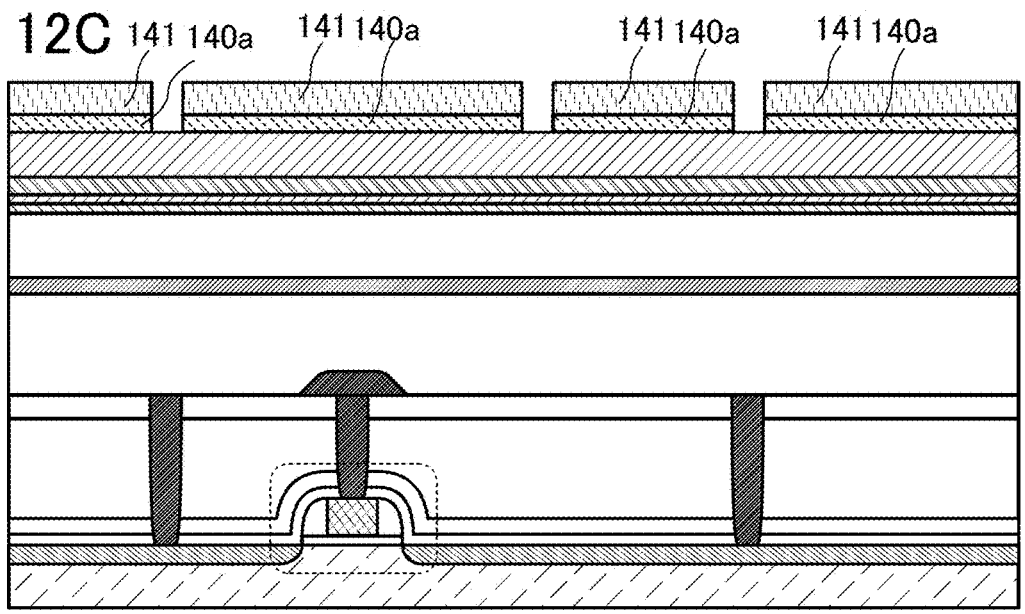

Next, the organic resin film is etched using the resist mask 141 (see FIG. 12C). Then, an insulating film 106a is formed by etching the insulating film 106. At this time, the etching rate of the resist mask is preferably lower than the etching rate of the insulating film In other words, when the etching rate of the resist mask is low, the openings in the insulating film can be prevented from expanding in the lateral direction (see FIG. 13A).

Next, a conductive film 103a1 is formed by thy-etching the conductive film 103 using the insulating film 106a as a mask. Here, the etching rate of the insulating film 106a is preferably low for the same reason as described above. In the dry etching, the resist mask 141 and the organic resin film 140a are also etched, whereby a resist mask 141a and an organic resin film 140b which have receded are formed.

Figure 13A:
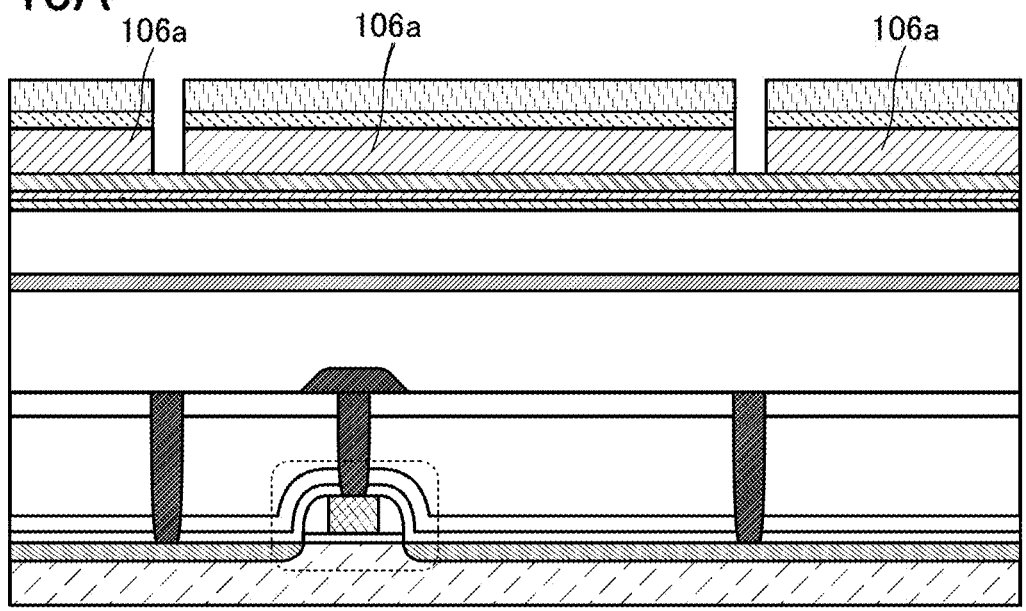
FIGS. 13A and 13B illustrate an example of a method for manufacturing a semiconductor device according to an embodiment.
Figure 13B:
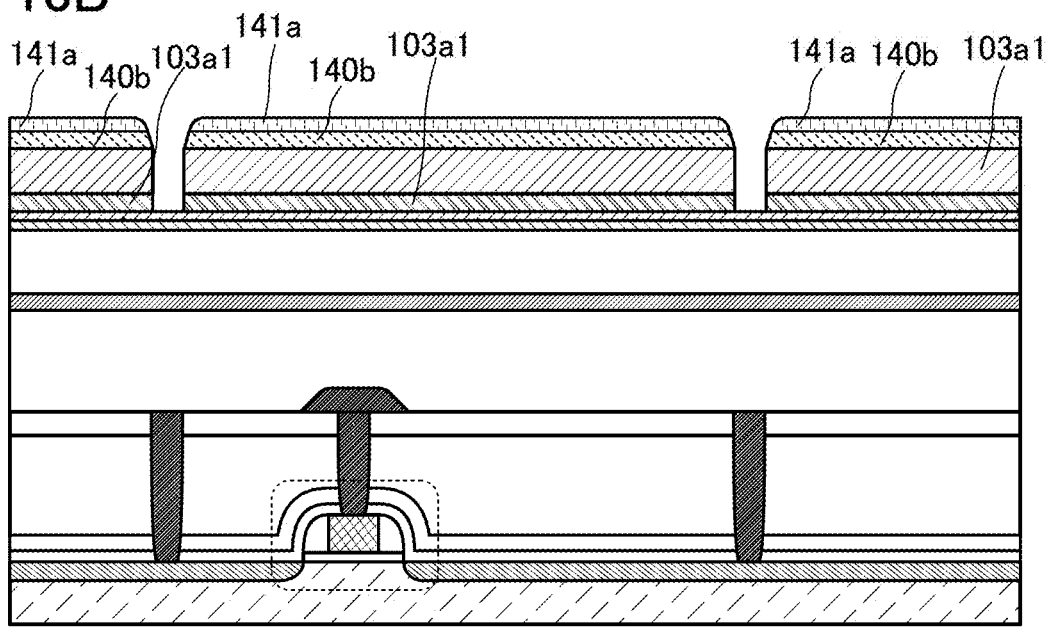
Figure 14A:
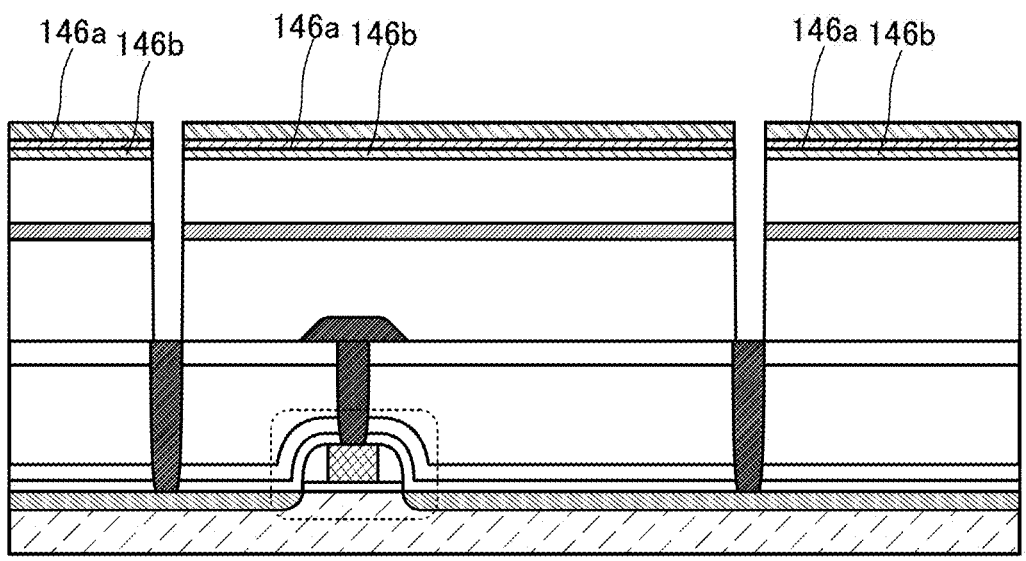
FIGS. 14A and 14B illustrate an example of a method for manufacturing a semiconductor device according to an embodiment.
Figure 14B:
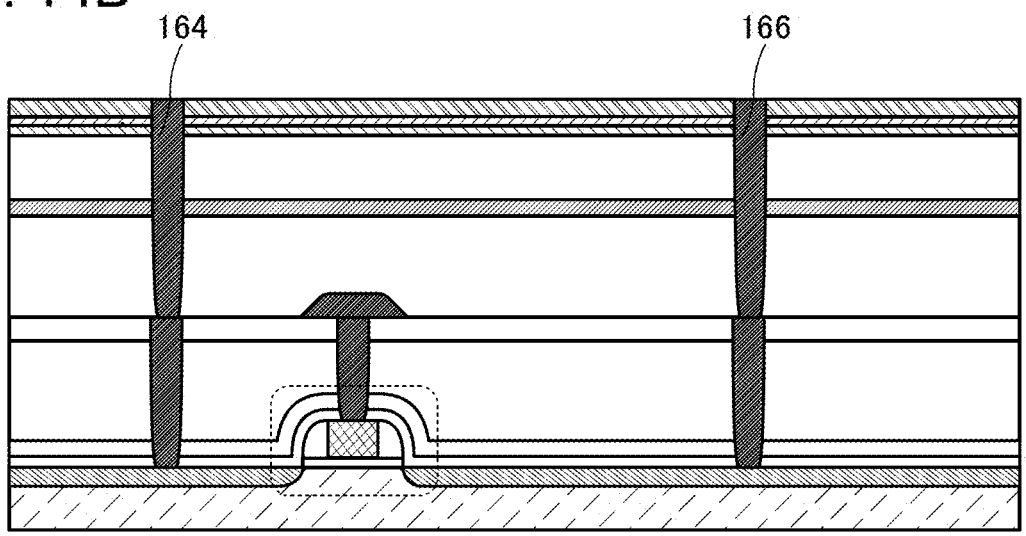
Figure 15A:
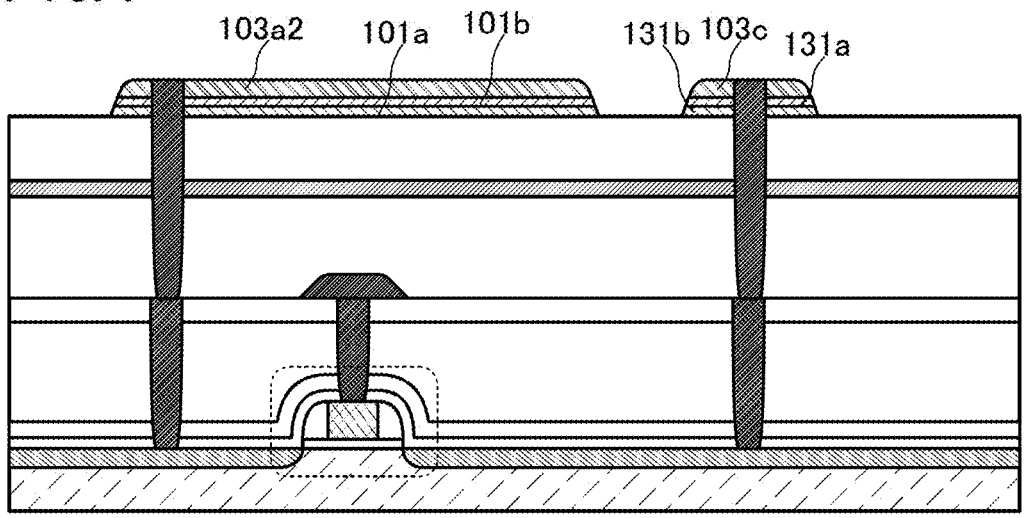
FIGS. 15A and 15B illustrate an example of a method for manufacturing a semiconductor device according to an embodiment.
Figure 15B:
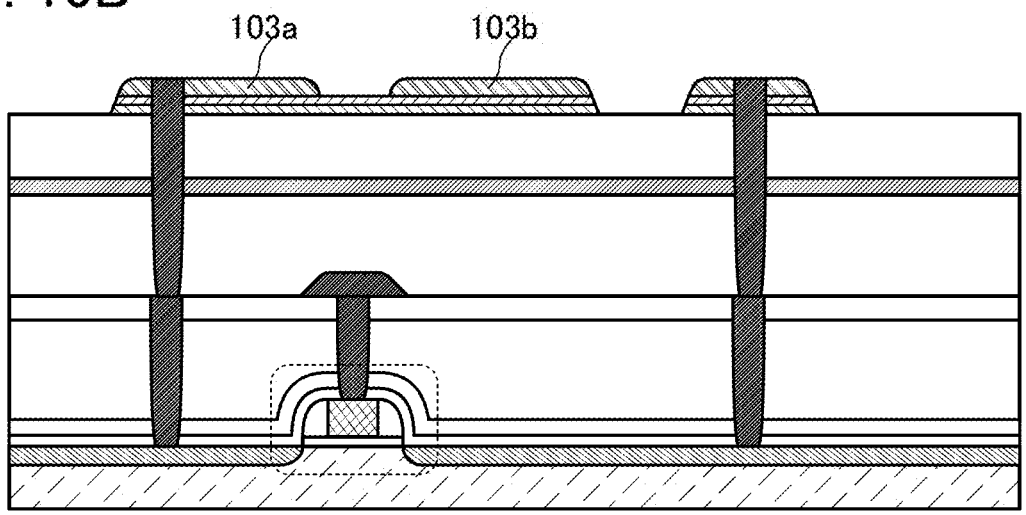

Through the above steps, a two-layer hard mask including the insulating film 106a and the conductive film 103 can be formed (see FIG. 13B).

By dry-etching the oxide semiconductor film 102b, the oxide semiconductor film 102a, the insulating film 126, the barrier film 120, and the insulating film 125 using this two-layer hard mask, fine openings can be formed so as to reach the plugs 161 and 163. At the same time, an oxide semiconductor film 146a and an oxide semiconductor film 146b are formed. Furthermore, the resist mask 141a and the organic resin film 140b are eliminated by the dry etching (see FIG. 14A).

The insulating film 106a included in the two-layer hard mask may be eliminated during the dry-etching of the oxide semiconductor films 102b and 102a, the insulating film 126, the barrier film 120, and the insulating film 125. Note that in order to prevent the conductive film 103, which is the other part of the hard mask, from being etched excessively, etching time is adjusted as appropriate such that exactly the whole insulating film 106a is eliminated by etching or such that the etching is performed excessively by approximately 10% of the thickness of the insulating film 106a (see FIG. 14A). Alternatively, the insulating film 106a may be left intentionally, which can be achieved by adjusting the thickness of the insulating film 106a as appropriate. When the insulating film 106a is left, the insulating film 106a functions as a stopper film when the end of the CMP step is detected in a later step and can prevent a decrease in thickness of the conductive film 103a1. Alternatively, in terms of characteristics of the transistor 100, parasitic capacitance between the gate electrode and the source electrode and parasitic capacitance between the gate electrode and the drain electrode can be reduced. Alternatively, leakage current between the gate electrode and the source electrode and leakage current between the gate electrode and the drain electrode can be reduced.

Here, a dry etching apparatus capable of forming the two-layer hard mask including the insulating film 106a and the conductive film 103 and forming fine openings by dry-etching the oxide semiconductor films 102b and 102a, the insulating film 126, the barrier film 120, and the insulating film 125 using the two-layer hard mask so as to reach the plugs 161 and 163 will be described with reference to a schematic diagram of an etching apparatus in FIG. 3.

Figure 3:
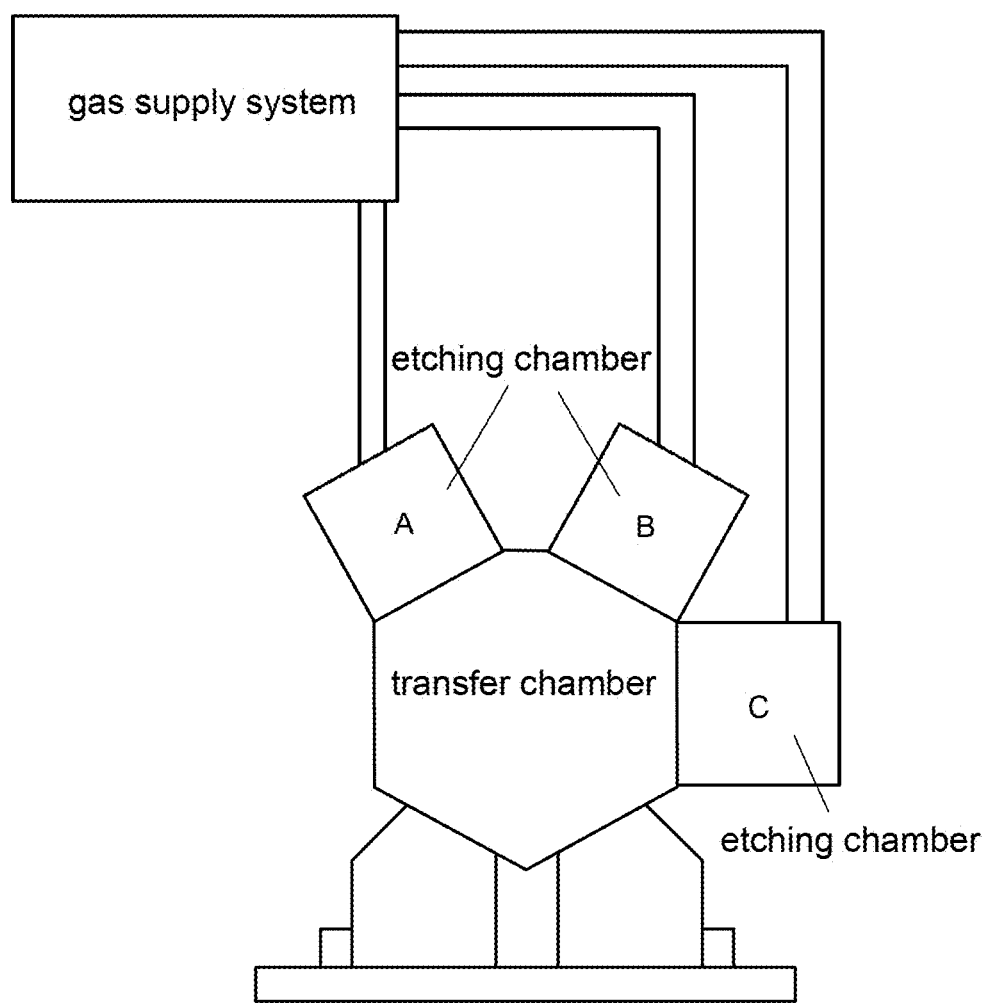
FIG. 3 is a schematic diagram illustrating an example of an etching apparatus.

The etching apparatus in FIG. 3 includes three etching chambers, a transfer chamber intended for temporary standby of a substrate at the time of transferring the substrate to each etching chamber, a gas supply system that supplies an etching gas or the like to each etching chamber, and a power supply system, a pump system, a gas removal system, and the like which are not illustrated.

To form a fine opening in a multilayer film including a plurality of kinds of films, it is desirable to use a parallel-plate etching apparatus, particularly an etching apparatus with a high-density plasma generation source or the like. Alternatively, it is preferable that the etching apparatus includes a plurality of etching chambers. Alternatively, it is preferable that the etching apparatus includes a gas supply system that allows an optimal etching gas to be selected as appropriate for the etching of each layer and allows a plurality of gases to be used in combination.

A fine opening in a multilayer film including a plurality of kinds of films may be formed in one etching chamber. In this method, an optimal etching gas for the etching of each layer may be introduced into the etching chamber. The etching apparatus including a plurality of etching chambers is preferable because it can process a plurality of substrates concurrently and therefore can improve the production efficiency. FIG. 3 illustrates an example of the etching apparatus with three etching chambers.

In the case where etching of a multilayer film is performed in one etching chamber, the gas in the etching chamber is switched to an optimal gas in accordance with the kind of a film to be etched, which is introduced for the etching. Therefore, various etching products are attached to and deposited on the etching chamber wall in some cases. The etching products peel off and are scattered as particles during etching in some cases. Attachment of the particles on a substrate might cause an etching defect.

One of methods for preventing generation of such particles is to etch different kinds of films in different etching chambers. As one example, a method for etching films to be a hard mask in a chamber A and etching other films in a chamber B will be described below.

First, the substrate is introduced into the etching chamber A, and the organic resin film, the insulating film 106, and the conductive film 103 are etched. The organic resin film may be etched using a $CF_4$ gas, for example. The insulating film 106 may be etched using a mixed gas in which an $O_2$ gas is added to a $CHF_3$ gas, for example. The conductive film 103 may be etched using a mixed gas of a $CF_4$ gas, a $Cl_2$ gas, and an $O_2$ gas, for example. Then, the substrate is introduced into the etching chamber B from the etching chamber A via the transfer chamber, and the oxide semiconductor film 102b, the oxide semiconductor film 102a, the insulating film 126, the barrier film 120, and the insulating film 125 are etched. The oxide semiconductor films 102b and 102a may be etched using a mixed gas in which an Ar gas is added to a $CHF_3$ gas, for example. The insulating film 126 may be etched using a $C_4F_6$ gas mixed with an Ar gas and an $O_2$ gas, for example. The barrier film 120 and the insulating film 125 may be etched using a mixed gas in which an Ar gas is added to a $CHF_3$ gas, for example. Then, the substrate is transferred from the etching chamber B to the etching chamber C in a manner similar to that described above, and ashing is performed. As an ashing gas, an $O_2$ gas may be used, for example.

In accordance with the above example, by following the above steps, it is possible to form a fine opening in a multilayer film including even more films.

The etching apparatus in the above example requires a plurality of etching chambers. However, the substrate is always transferred in vacuum even during transfer between chambers and is not exposed to the air; therefore, stable etching can be performed. Furthermore, since etching is performed in accordance with the kind of film, treatment time in each etching chamber can be shortened; thus, production efficiency can be improved.

Next, a conductive film is formed over the conductive film 103a1 and in the openings formed as described above. The openings are filled with the conductive film. The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage. Next, the conductive film formed over the conductive film 103a1 is polished by a CMP method until a surface of the conductive film 103a1 is exposed. At this time, in the case where the insulating film 106a is left, the insulating film 106a functions as a CMP stopper film. Accordingly, the plug 164 and the plug 166 can be formed (see FIG. 14B).

Next, a resist mask is formed by a method similar to that described above, and an island-shaped conductive film 103a2 is formed by etching an unnecessary portion of the conductive film 103a1. After that, an unnecessary portion of the oxide semiconductor film is removed by etching using the island-shaped conductive film 103a2 as a mask. Then, the resist mask is removed. In this manner, a stacked-layer structure including the island-shaped oxide semiconductor film 101a and the island-shaped oxide semiconductor film 101b can be formed (see FIG. 15A).

At the same time, a stacked-layer structure including the electrode 103c, the island-shaped oxide semiconductor film 131a, and the island-shaped oxide semiconductor film 131b can be formed.

Next, a resist mask is formed over the island-shaped conductive film 103a2 by a method similar to that described above, and an unnecessary portion of the island-shaped conductive film 103a2 is etched using the mask. In this manner, the electrodes 103a and 103b serving as source and drain electrodes can be formed (see FIG. 15B).

Figure 16A:
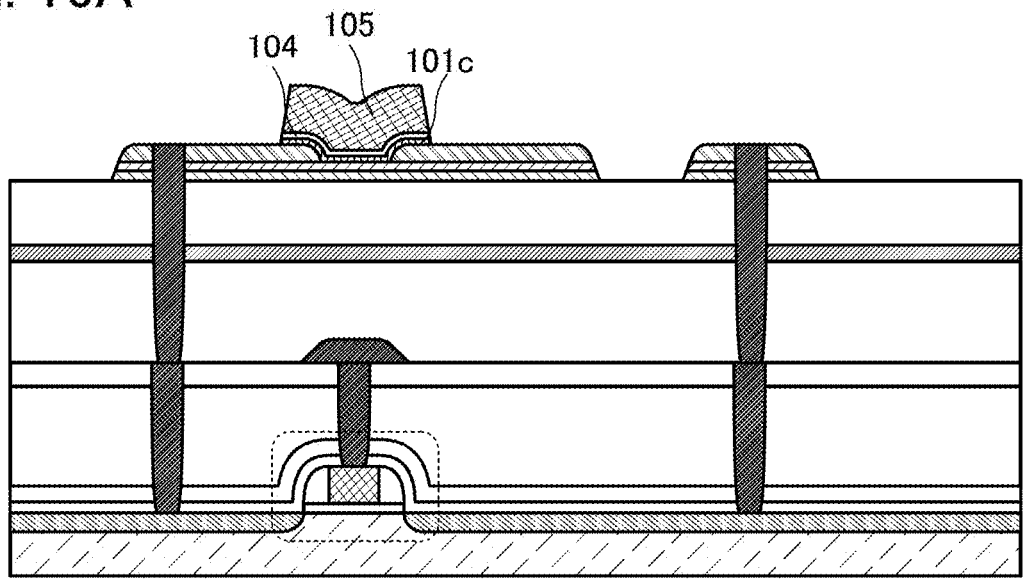
FIGS. 16A and 16B illustrate an example of a method for manufacturing a semiconductor device according to an embodiment.

Next, the oxide semiconductor film 101c, the gate insulating film 104, and the gate electrode 105 are formed (see FIG. 16A).

At this stage, the second transistor 100 is formed.

Next, the insulating film 107 is formed. The insulating film 107 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

After the insulating film 107 is formed, fifth heat treatment is preferably performed. Through the heat treatment, oxygen can be supplied to the oxide semiconductor film 101b from the insulating film 126 or the like; thus, oxygen vacancies in the oxide semiconductor film 101b can be reduced. At this time, oxygen released from the insulating film 126 is blocked by the barrier film 120 and the insulating film 107 and does not diffuse into a layer under the barrier film 120 and a layer over the insulating film 107; therefore, oxygen can be effectively confined. Thus, the amount of oxygen supplied to the oxide semiconductor film 101b can be increased, so that oxygen vacancies in the oxide semiconductor film 101b can be effectively reduced.

Figure 16B:
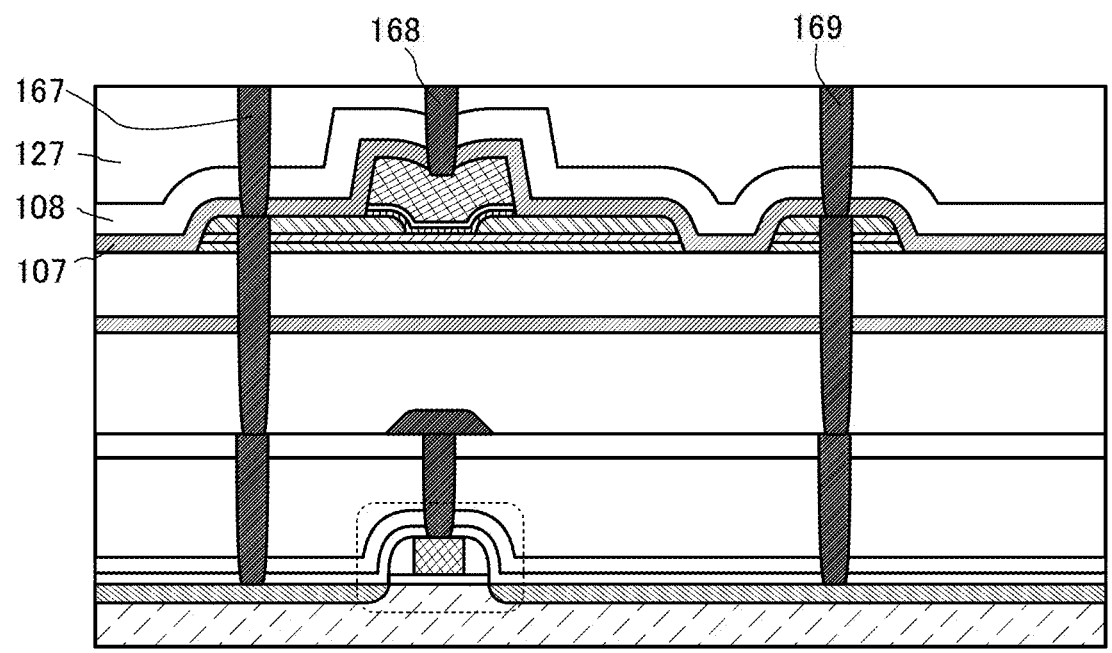

Next, the insulating film 108 and the insulating film 127 are sequentially formed (see FIG. 16B). The insulating films 108 and 127 can be formed by a sputtering method, a CVD method (including a thermal CVD method, an MOCVD method, a PECVD method, an atmospheric pressure CVD (APCVD) method, and the like), an MBE method, an ALD method, a PLD method, or the like, for example In particular, it is preferable that the insulating film 108 be formed by a DC sputtering method, in which case a film with a high barrier property can be formed thick with high productivity. It is also preferable that the insulating film 108 be formed by an ALD method because coverage can be favorable. In the case where the insulating film 127 is formed using an organic insulating material such as an organic resin, a coating method such as a spin coating method may be used. After the insulating film 127 is formed, a top surface thereof is preferably subjected to planarization treatment. It may be planarized through fluidization by heat treatment. In order to achieve higher planarity, after the insulating film 127 is formed, it is preferable that an insulating film be stacked by a CVD method and a top surface thereof be subjected to planarization treatment.

Next, by a method similar to that described above, openings are formed in the insulating film 127, the insulating film 108, and the insulating film 107, and the plug 167 reaching the plug 164, the plug 168 reaching the gate electrode 105, and the plug 169 reaching the plug 166 are formed (see FIG. 16B).

Next, the insulating film 128 is formed. Not that the description of the insulating film 127 can be referred to for the insulating film 128.

Next, by a method similar to that described above, openings are formed in the insulating film 128, and the plug 170 reaching the plug 167, the plug 171 reaching the plug 168, and the plug 172 reaching the plug 169 are formed.

Next, the electrode 173 electrically connected to the plug 170, the electrode 174 electrically connected to the plug 171, and the electrode 175 electrically connected to the plug 172 are formed (see FIG. 1B).

Through the above steps, the semiconductor device in one embodiment of the present invention can be manufactured.

Modification Example 1

Figure 17:
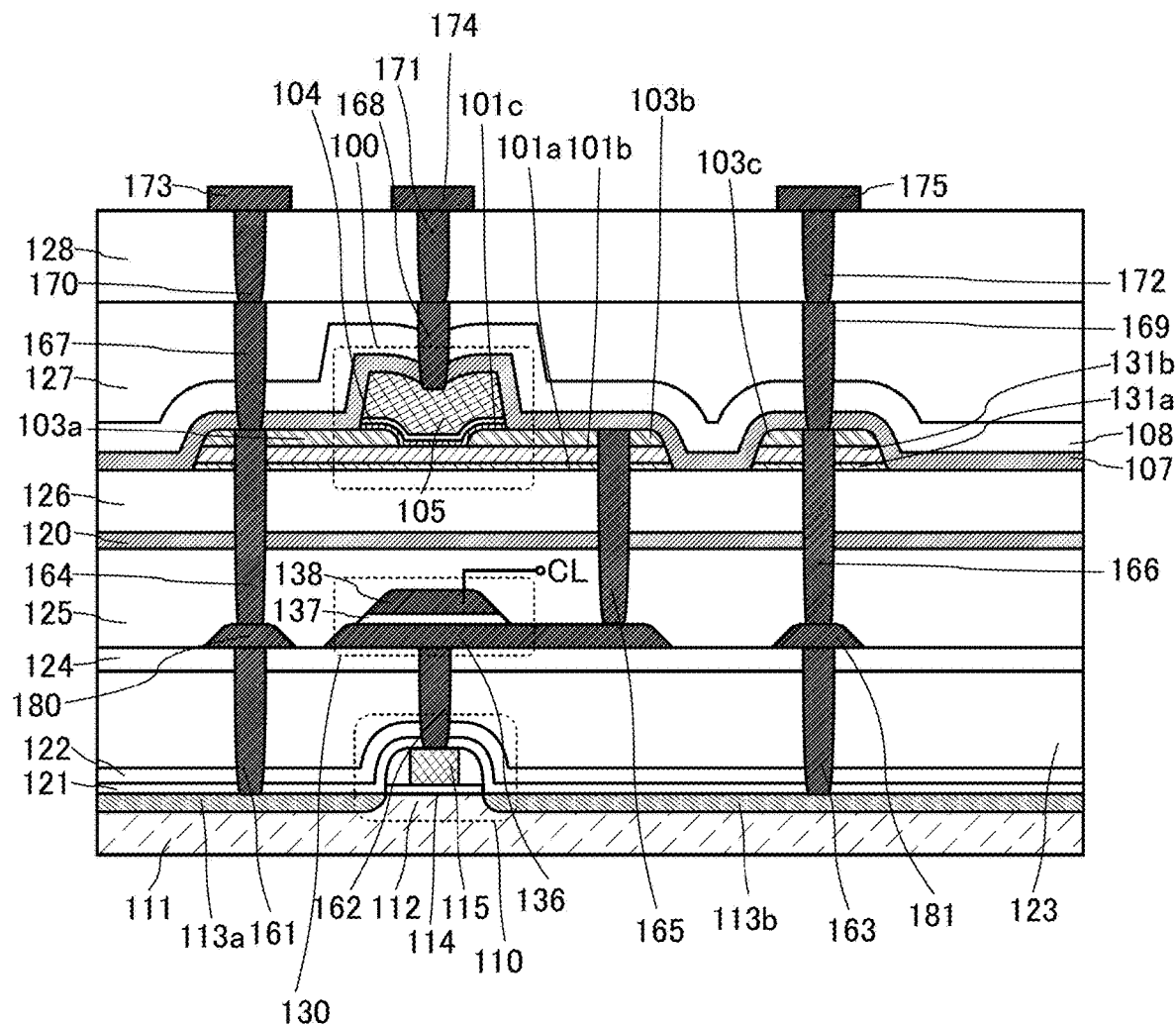
FIG. 17 illustrates an example of a structure of a semiconductor device according to an embodiment.

In a modification example of this embodiment, a capacitor 130 may be provided between the first transistor 110 and the second transistor 100 as illustrated in FIG. 17. The capacitor may be positioned over the second transistor 100. Specifically, the electrode 136 which is one electrode of the capacitor 130 is electrically connected to one of a source and a drain of the second transistor 100 and a gate of the first transistor 110. An insulating film 137 is provided over the electrode 136 of the capacitor 130, and an electrode 138 which is the other electrode of the capacitor 130 is provided over the insulating film 137. Note that the electrode 138 is electrically connected to a wiring CL. The electrode 136 is electrically connected to the electrode 103b through a plug 165.

In the above structure, since the second transistor 100 and the capacitor 130 are provided within the area occupied by the first transistor 110, the area occupied by the elements can be decreased.

A wiring 180 may be provided between the plug 161 and the plug 164, and a wiring 181 may be provided between the plug 163 and the plug 166. Between other plugs, a wiring may be provided similarly. Such a structure does not require high accuracy in mask alignment and can suppress a decrease in yield of manufacturing the semiconductor device.

Modification Example 2

Figure 18:
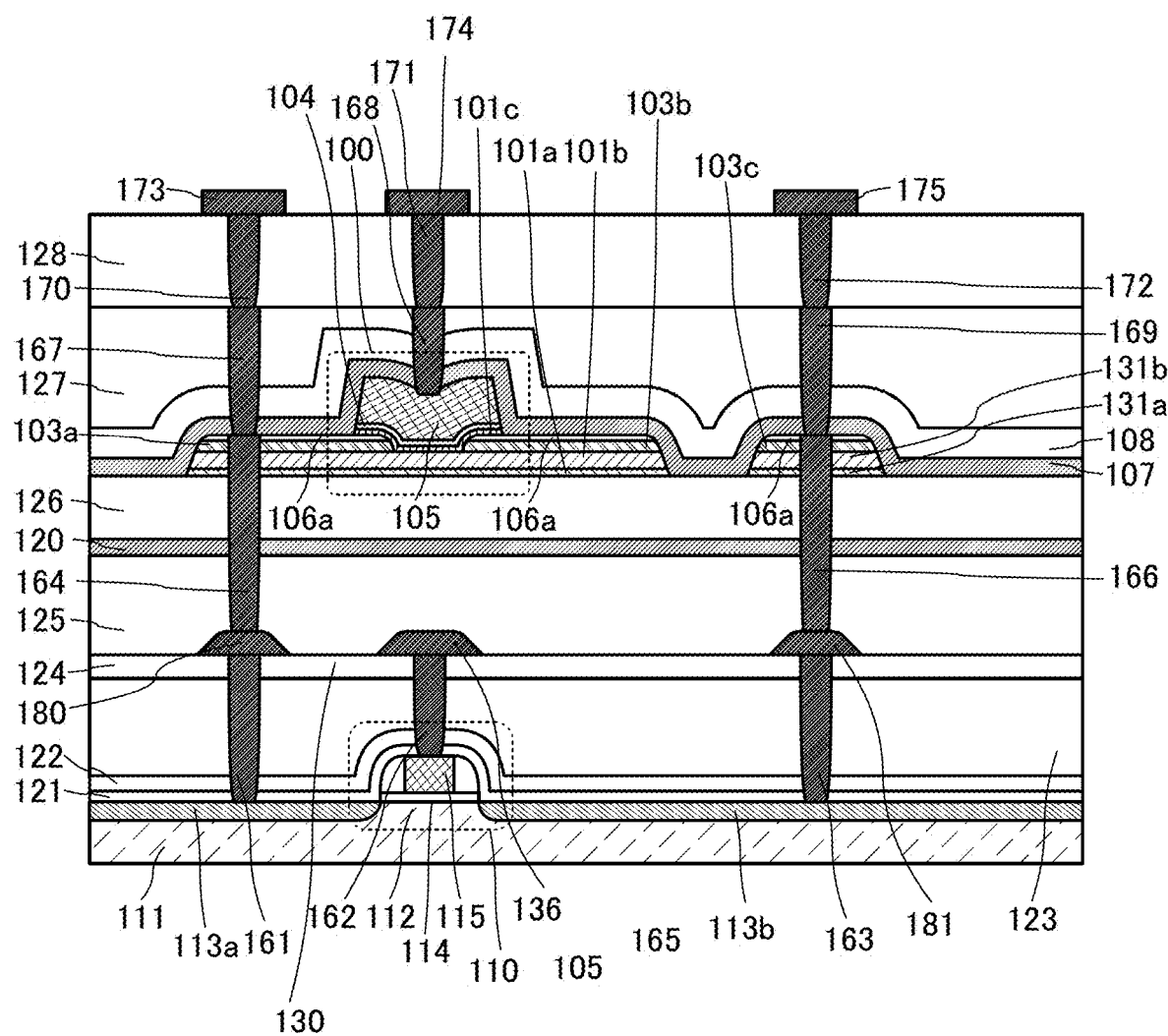
FIG. 18 illustrates an example of a structure of a semiconductor device according to an embodiment.

Another modification example of this embodiment is a structure illustrated in FIG. 18. A difference from FIGS. 1A and 1B is that the insulating film 106a of the two-layer hard mask is intentionally left. The insulating film 106a functions as a CMP stopper film and can prevent a decrease in thickness of the conductive film 103a1. Alternatively, parasitic capacitance between the gate electrode and the source electrode and parasitic capacitance between the gate electrode and the drain electrode can be reduced. Alternatively, leakage current between the gate electrode and the source electrode and leakage current between the gate electrode and the drain electrode can be reduced.

Modification Example 3

Figure 19:
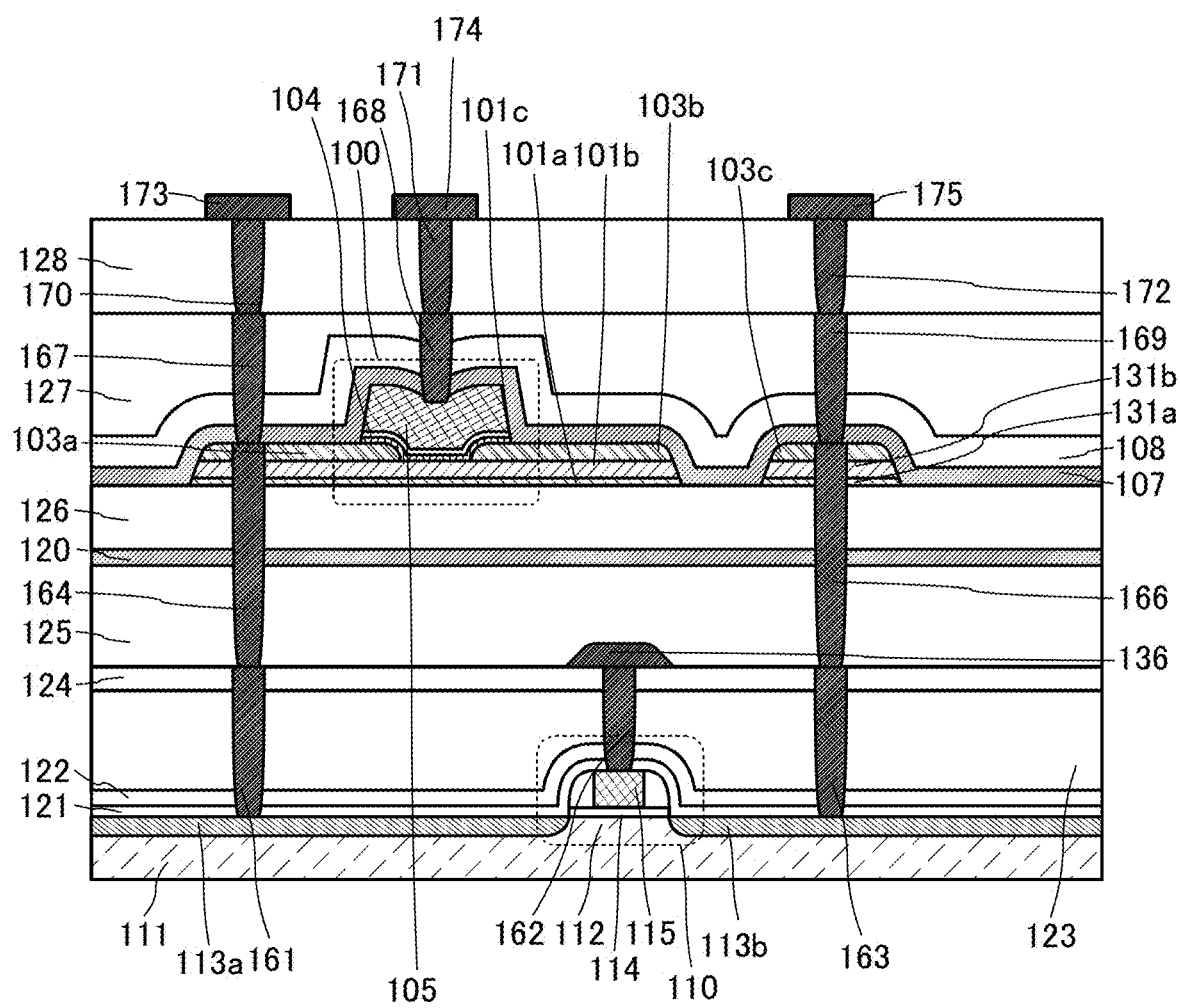
FIG. 19 illustrates an example of a structure of a semiconductor device according to an embodiment.

Another modification example of this embodiment is a structure in which the gate electrode 115 of the first transistor 110 does not overlap with the gate electrode 105 of the second transistor 100 as illustrated in FIG. 19.

Modification Example 4

Figure 20A:
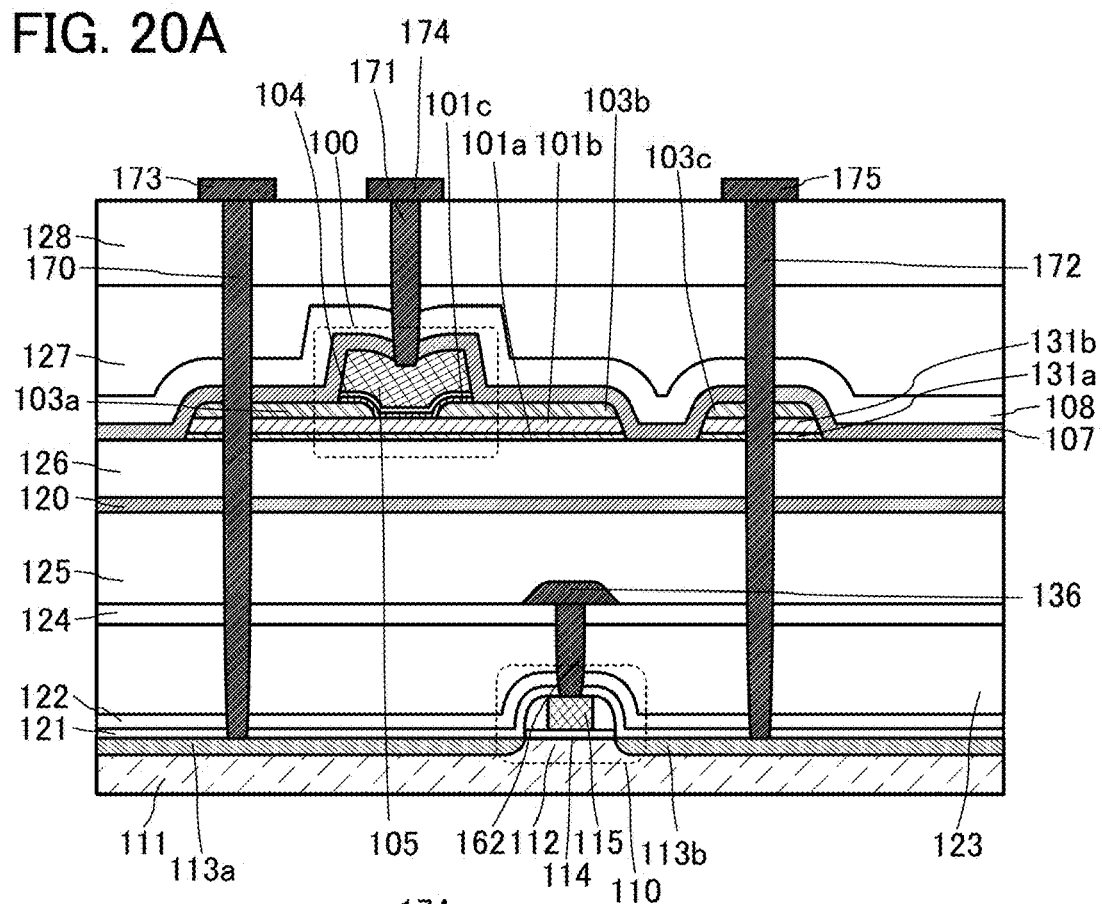
FIGS. 20A and 20B each illustrate an example of a structure of a semiconductor device according to an embodiment.
Figure 20B:
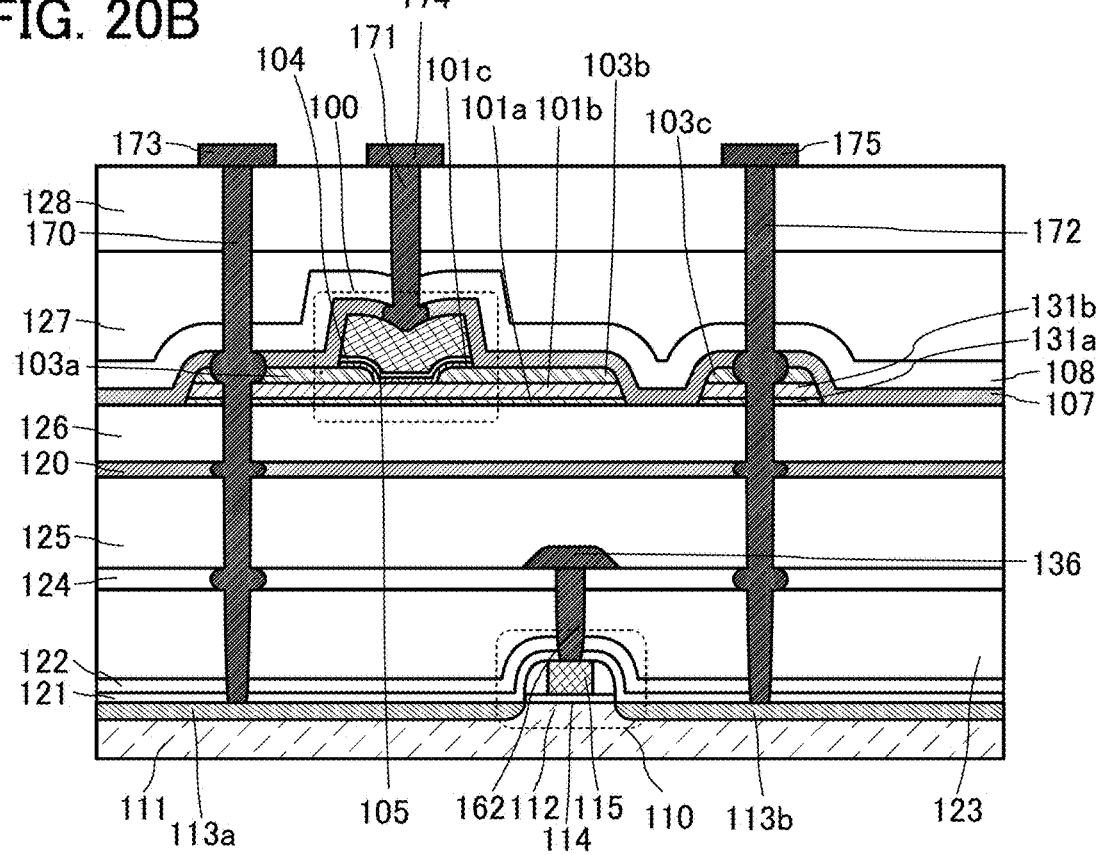

Another modification example of this embodiment is a structure in FIG. 20A which is obtained in the following manner. After the insulating film 128 is formed, openings are provided so as to reach the low-resistance layers 113a and 113b and the gate electrode 105 of the second transistor 100 by a method similar to that described above, the plugs 170, 171, and 172 are formed so as to reach the low-resistance layer 113a, the gate electrode 105 of the second transistor 100, and the low-resistance layer 113b, respectively, and the electrodes 173, 174, and 175 are formed so as to be electrically connected to the plugs 170, 171, and 172, respectively. In the case where an opening is formed in different kinds of films as described above, part of the films might recede in a cross-sectional view as illustrated in FIG. 20B. Such a shape may be formed when the etching rate of a film in the receding portion is higher than those of films over and under the receding portion, but does not affect formation of plugs. The receding portion may improve on-state characteristics of a transistor because of its large electrical contact area.

At least part of this embodiment can be implemented in combination with any of the other embodiments described in this specification as appropriate.

Embodiment 2

In this embodiment, one embodiment which can be applied to an oxide semiconductor film in the transistor included in the semiconductor device described in the above embodiment is described.

An oxide semiconductor is classified into, for example, a non-single-crystal oxide semiconductor and a single crystal oxide semiconductor. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

FIG. 33A shows an example of a high-resolution TEM image of a cross section of the CAAC-OS which is obtained from a direction substantially parallel to the sample surface. Here, the TEM image is obtained with a spherical aberration corrector function. The high-resolution TEM image obtained with a spherical aberration corrector function is particularly referred to as a Cs-corrected high-resolution TEM image in the following description. Note that the Cs-corrected high-resolution TEM image can be obtained with, for example, an atomic resolution analytical electron microscope JEM-ARM200F manufactured by JEOL Ltd.

FIG. 33B is an enlarged Cs-corrected high-resolution TEM image of a region (1) in FIG. 33A. FIG. 33B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

As shown in FIG. 33B, the CAAC-OS has a characteristic atomic arrangement. The characteristic atomic arrangement is denoted by an auxiliary line in FIG. 33C. FIGS. 33B and 33C prove that the size of a pellet is approximately 1 nm to 3 nm, and the size of a space caused by tilt of the pellets is approximately 0.8 nm. Therefore, the pellet can also be referred to as a nanocrystal (nc).

Here, according to the Cs-corrected high-resolution TEM images, the schematic arrangement of pellets 5100 of a CAAC-OS over a substrate 5120 is illustrated by such a structure in which bricks or blocks are stacked (see FIG. 33D). The part in which the pellets are tilted as observed in FIG. 33C corresponds to a region 5161 shown in FIG. 33D.

For example, as shown in FIG. 34A, a Cs-corrected high-resolution TEM image of a plane of the CAAC-OS obtained from a direction substantially perpendicular to the sample surface is observed. FIGS. 34B, 34C, and 34D are enlarged Cs-corrected high-resolution TEM images of regions (1), (2), and (3) in FIG. 34A, respectively. FIGS. 34B, 34C, and 34D indicate that metal atoms are arranged in a triangular, quadrangular, or hexagonal configuration in a pellet. However, there is no regularity of arrangement of metal atoms between different pellets.

Figure 35A:
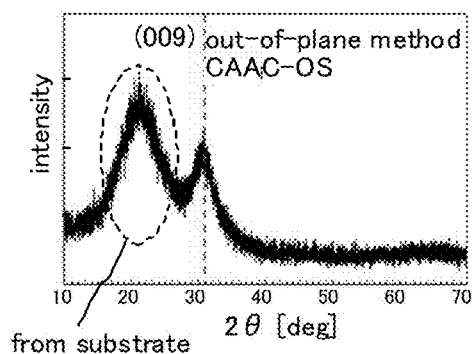
FIGS. 35A to 35C show structural analysis of a CAAC-OS and a single crystal oxide semiconductor by XRD.

For example, when the structure of a CAAC-OS including an InGaZnO$_4$ crystal is analyzed by an out-of-plane method using an X-ray diffraction (XRD) apparatus, a peak appears at a diffraction angle (2θ) of around 31° as shown in FIG. 35A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS including an InGaZnO$_4$ crystal by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS, a peak appear when 2θ is around 31° and that a peak not appear when 2θ is around 36°.

Figure 35B:
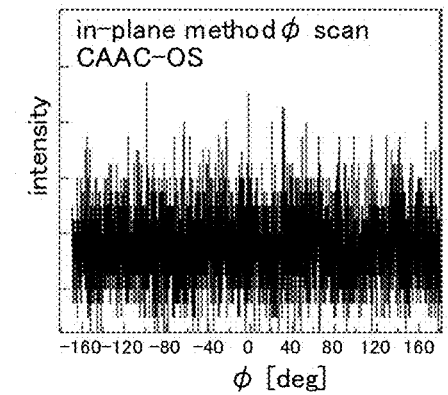
Figure 35C:
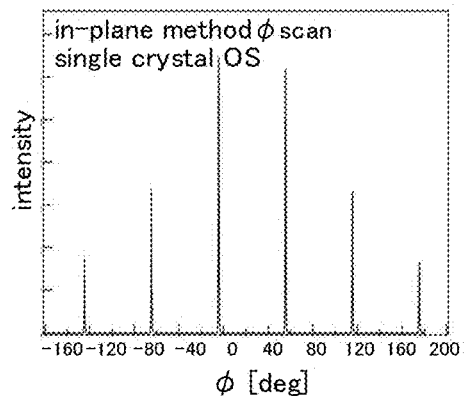

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 35B, a peak is not clearly observed. In contrast, in the case of a single crystal oxide semiconductor of InGaZnO$_4$, when φ scan is performed with 2θ fixed at around 56°, as shown in FIG. 35C, six peaks which are derived from crystal planes equivalent to the (110) plane are observed. Accordingly, the structural analysis using XRD shows that the directions of a-axes and b-axes are different in the CAAC-OS.

Figure 36A:
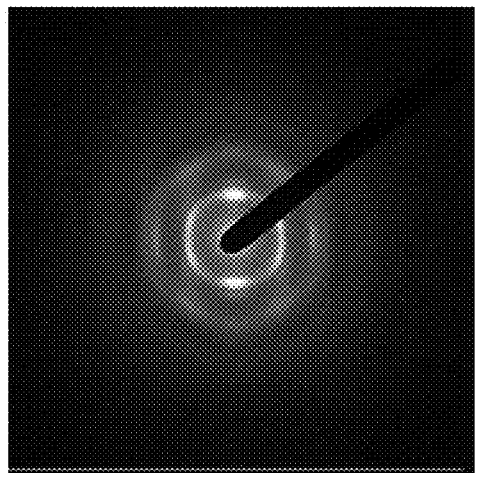
FIGS. 36A and 36B show electron diffraction patterns of a CAAC-OS.
Figure 36B:
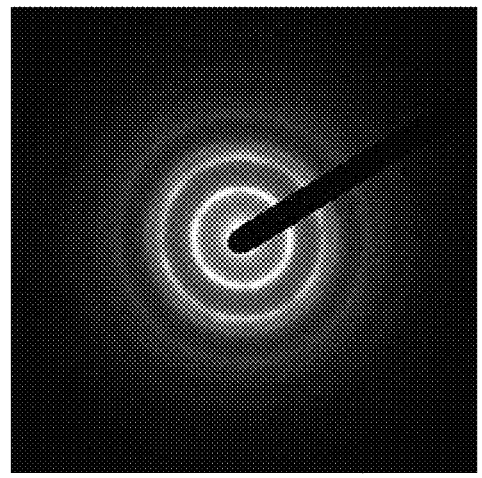

Next, FIG. 36A shows a diffraction pattern (also referred to as a selected-area transmission electron diffraction pattern) obtained in such a manner that an electron beam with a probe diameter of 300 nm is incident on an In—Ga—Zn oxide that is a CAAC-OS in a direction parallel to the sample surface. As shown in FIG. 36A, for example, spots derived from the (009) plane of an InGaZnO$_4$ crystal are observed. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 36B shows a diffraction pattern obtained in such a manner that an electron beam with a probe diameter of 300 nm is incident on the same sample in a direction perpendicular to the sample surface. As shown in FIG. 36B, a ring-like diffraction pattern is observed. Thus, the electron diffraction also indicates that the a-axes and b-axes of the pellets included in the CAAC-OS do not have regular alignment. The first ring in FIG. 36B is considered to be derived from the (010) plane, the (100) plane, and the like of the InGaZnO$_4$ crystal. The second ring in FIG. 36B is considered to be derived from the (110) plane and the like.

Since the c-axes of the pellets (nanocrystals) are aligned in a direction substantially perpendicular to the formation surface or the top surface in the above manner, the CAAC-OS can also be referred to as an oxide semiconductor including c-axis aligned nanocrystals (CANC).

The CAAC-OS is an oxide semiconductor with a low impurity concentration. The impurity means an element other than the main components of the oxide semiconductor, such as hydrogen, carbon, silicon, or a transition metal element. An element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity. Additionally, the impurity contained in the oxide semiconductor might serve as a carrier trap or a carrier generation source.

Moreover, the CAAC-OS is an oxide semiconductor having a low density of defect states. For example, oxygen vacancies in the oxide semiconductor serve as carrier traps or serve as carrier generation sources when hydrogen is captured therein.

In a transistor using the CAAC-OS, change in electrical characteristics due to irradiation with visible light or ultraviolet light is small.

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

Note that an oxide semiconductor may have a structure having physical properties intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

A difference in effect of electron irradiation between structures of an oxide semiconductor is described below.

An a-like OS, an nc-OS, and a CAAC-OS are prepared. Each of the samples is an In—Ga—Zn oxide.

First, a high-resolution cross-sectional TEM image of each sample is obtained. The high-resolution cross-sectional TEM images show that all the samples have crystal parts.

Figure 37:
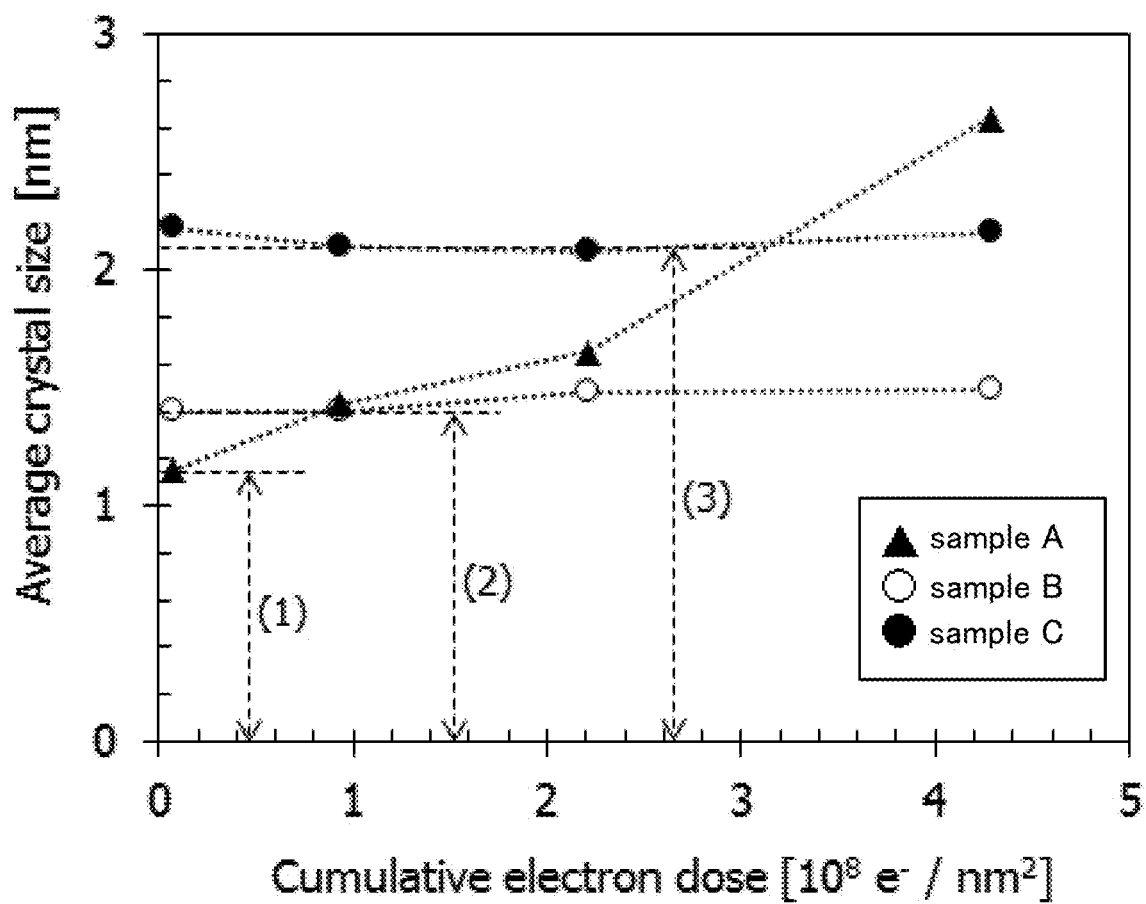
FIG. 37 shows a change in crystal part of an In—Ga—Zn oxide induced by electron irradiation.

Then, the size of the crystal part of each sample is measured. FIG. 37 shows the change in the average size of crystal parts (at 22 points to 45 points) in each sample. FIG. 37 indicates that the crystal part size in the a-like OS increases with an increase in the cumulative electron dose. Specifically, as shown by (1) in FIG. 37, a crystal part of approximately 1.2 nm at the start of TEM observation (the crystal part is also referred to as an initial nucleus) grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$ regardless of the cumulative electron dose. Specifically, as shown by (2) in FIG. 37, the average crystal size is approximately 1.4 nm regardless of the observation time by TEM. Furthermore, as shown by (3) in FIG. 37, the average crystal size is approximately 2.1 nm regardless of the observation time by TEM.

In this manner, growth of the crystal part occurs due to the crystallization of the a-like OS, which is induced by a slight amount of electron beam employed in the TEM observation. In contrast, in the nc-OS and the CAAC-OS that have good quality, crystallization hardly occurs by a slight amount of electron beam used for TEM observation.

Note that the crystal part size in the a-like OS and the nc-OS can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the InGaZnO$_4$ crystal.

Furthermore, the density of an oxide semiconductor varies depending on the structure in some cases. For example, when the composition of an oxide semiconductor is determined, the structure of the oxide semiconductor can be expected by comparing the density of the oxide semiconductor with the density of a single crystal oxide semiconductor having the same composition as the oxide semiconductor. For example, the density of the a-like OS is higher than or equal to 78.6% and lower than 92.3% of the density of the single crystal oxide semiconductor having the same composition. For example, the density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

Specific examples of the above description are given. For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor may be a stacked film including two or more films of an amorphous oxide semiconductor, an a-like OS, a microcrystalline oxide semiconductor, and a CAAC-OS, for example.

An oxide semiconductor having a low impurity concentration and a low density of defect states (a small number of oxygen vacancies) can have low carrier density. Therefore, such an oxide semiconductor is referred to as a highly purified intrinsic or substantially highly purified intrinsic oxide semiconductor. A CAAC-OS and an nc-OS have a low impurity concentration and a low density of defect states as compared to an a-like OS and an amorphous oxide semiconductor. That is, a CAAC-OS and an nc-OS are likely to be highly purified intrinsic or substantially highly purified intrinsic oxide semiconductors. Thus, a transistor including a CAAC-OS or an nc-OS rarely has negative threshold voltage (is rarely normally on). The highly purified intrinsic or substantially highly purified intrinsic oxide semiconductor has few carrier traps. Therefore, a transistor including a CAAC-OS or an nc-OS has small variation in electrical characteristics and high reliability. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics.

<Deposition Model>

Examples of deposition models of a CAAC-OS and an nc-OS are described below.

Figure 38A:
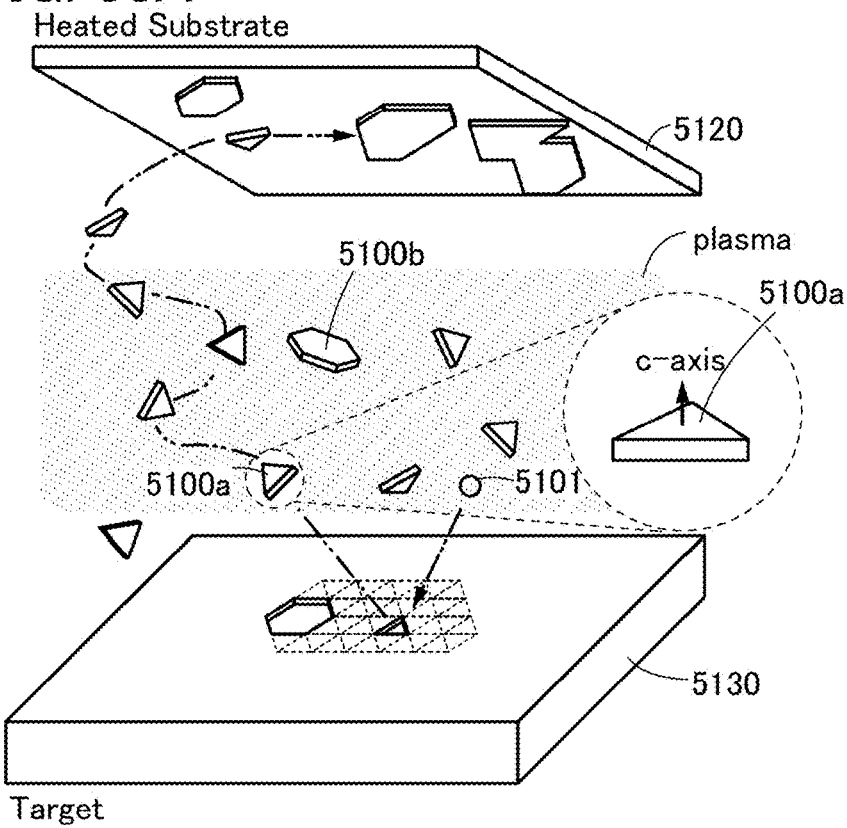
FIGS. 38A and 38B are schematic views showing deposition models of a CAAC-OS and an nc-OS.

FIG. 38A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The target 5130 has a polycrystalline structure in which a cleavage plane exists in at least one crystal grain.

Figure 39A:
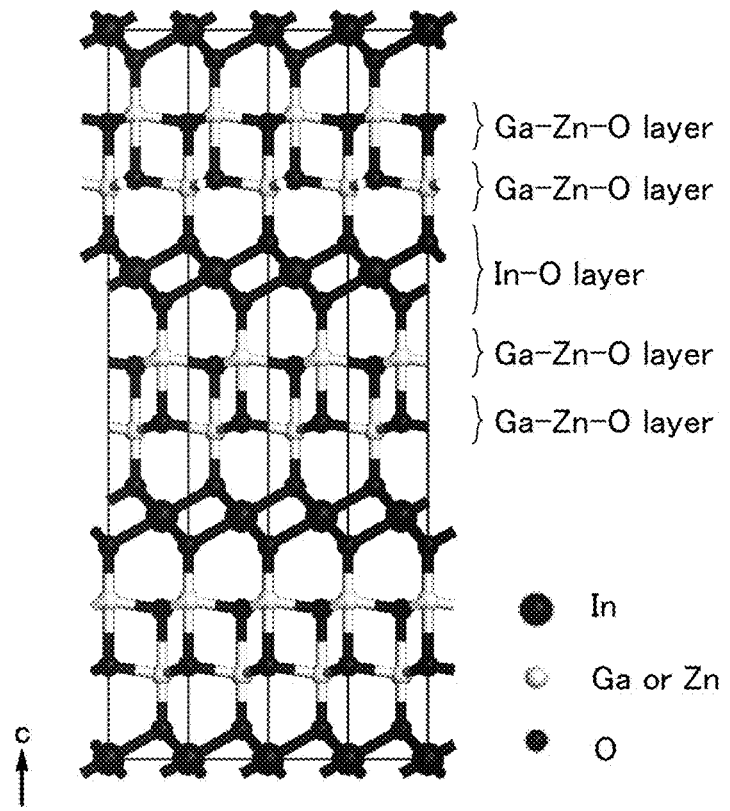
FIGS. 39A to 39C show an InGaZnO$_4$ crystal and a pellet.

A cleavage plane of the target 5130 including an In—Ga—Zn oxide is described as an example. FIG. 39A shows a structure of an InGaZnO$_4$ crystal included in the target 5130. Note that FIG. 39A shows a structure of the case where the InGaZnO$_4$ crystal is observed from a direction parallel to the b-axis when the c-axis is in an upward direction.

FIG. 39A indicates that oxygen atoms in a Ga—Zn—O layer are positioned close to those in an adjacent Ga—Zn—O layer. The oxygen atoms have negative charge, whereby the two Ga—Zn—O layers repel each other. As a result, the InGaZnO$_4$ crystal has a cleavage plane between the two adjacent Ga—Zn—O layers.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

The ion 5101 is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 39B:
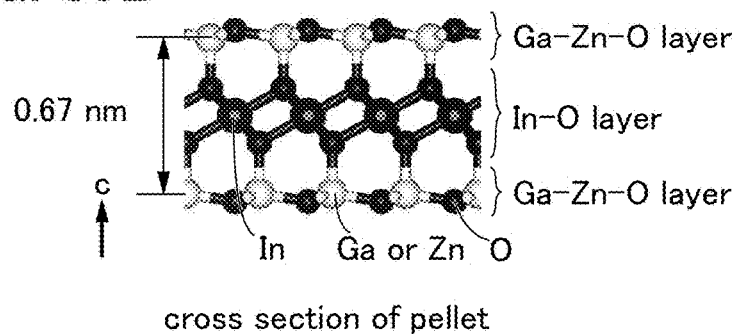
Figure 39C:
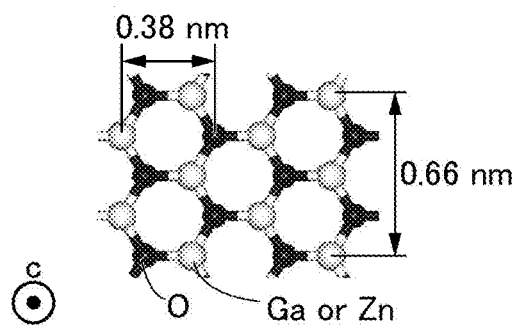

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 37. For example, in the case where the ion 5101 collides with the target 5130 including an In—Ga—Zn oxide, the pellet 5100 that includes three layers of a Ga—Zn—O layer, an In—O layer, and a Ga—Zn—O layer as shown in FIG. 39B is ejected. Note that FIG. 39C shows the structure of the pellet 5100 observed from a direction parallel to the c-axis. Therefore, the pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. The pellet 5100 includes an oxygen atom on its side surface, and the oxygen atom may be negatively charged. In this manner, when the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 37 corresponds to the amount of growth in plasma. Here, in the case where the temperature of the substrate 5120 is at around room temperature, the pellet 5100 does not grow anymore; thus, an nc-OS is formed (see FIG. 38B). An nc-OS can be deposited when the substrate 5120 has a large size because a temperature at which the deposition of an nc-OS is carried out is approximately room temperature. Note that in order that the pellet 5100 grows in plasma, it is effective to increase deposition power in sputtering. High deposition power can stabilize the structure of the pellet 5100.

Figure 38B:
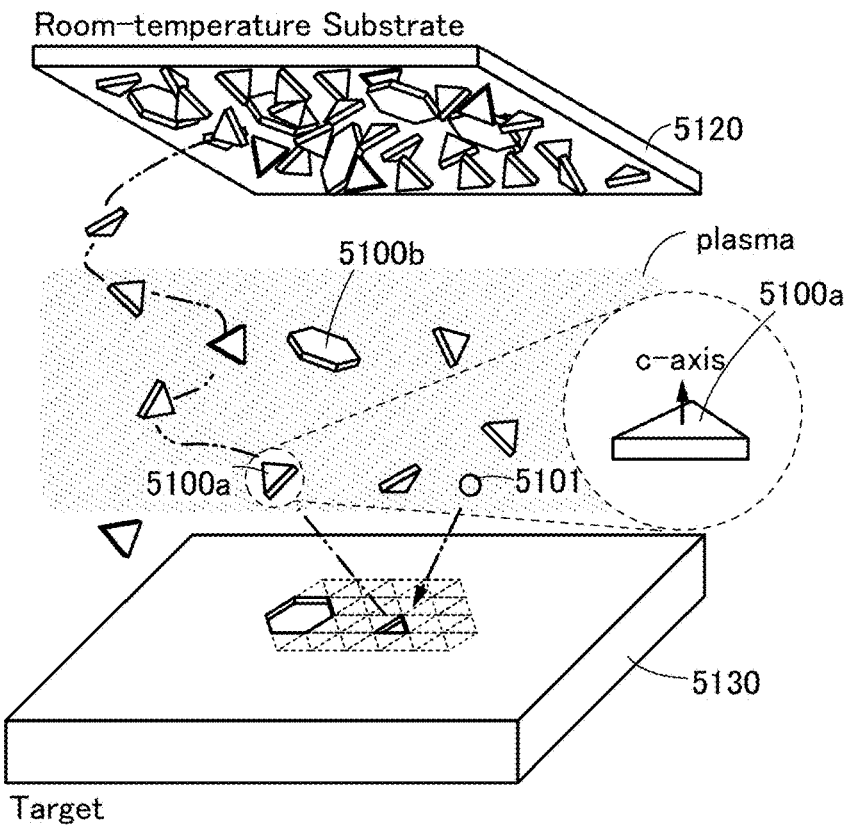

As shown in FIGS. 38A and 38B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to increase a force applied to the pellet 5100, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 38A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist therebetween. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target is sputtered with an ion, in addition to the pellets, zinc oxide or the like may be ejected. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 40A to 40D are cross-sectional schematic views.

Figure 40A:
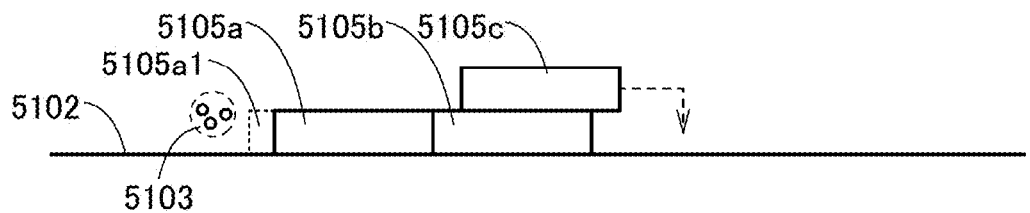
FIGS. 40A to 40D are schematic views showing a deposition model of a CAAC-OS.

As illustrated in FIG. 40A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 ejected from the target together with the zinc oxide is crystallized by heating of the substrate 5120 to form a region 5105a1 on another side surface of the pellet 5105a. Note that the plurality of particles 5103 may contain oxygen, zinc, indium, gallium, or the like.

Figure 40B:
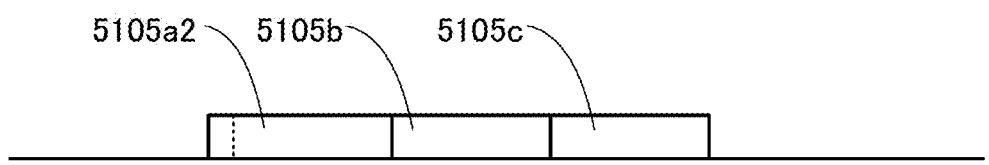

Then, as illustrated in FIG. 40B, the region 5105a1 grows to part of the pellet 5105a to form a pellet 5105a2. In addition, a side surface of the pellet 5105c is in contact with another side surface of the pellet 5105b.

Figure 40C:
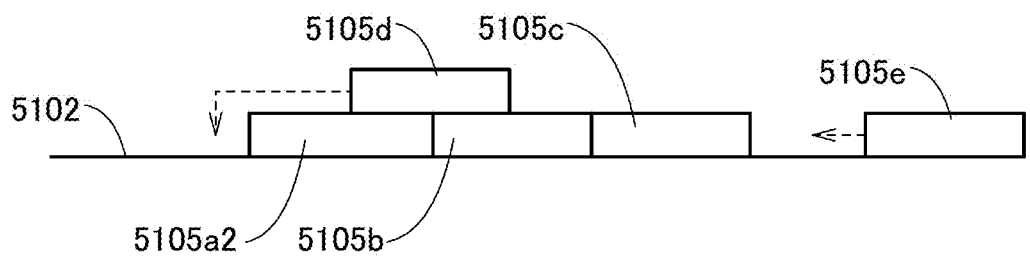

Next, as illustrated in FIG. 40C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 40D:
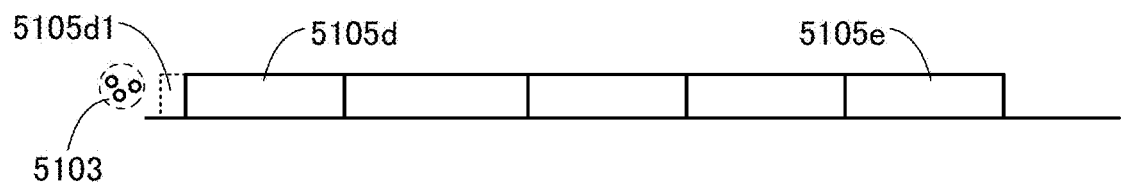

Then, as illustrated in FIG. 40D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 ejected from the target together with the zinc oxide is crystallized by heating of the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 37 corresponds to the amount of growth after deposition.

When spaces between pellets 5100 are extremely small, the pellets may form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above. Therefore, when a channel formation region of a transistor is smaller than the large pellet, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure, which is different from film deposition by epitaxial growth. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be obtained.

As a result, laser crystallization is not needed for formation of a CAAC-OS, and a uniform film can be formed even over a large-sized glass substrate or the like.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

Embodiment 3

In this embodiment, an example of a circuit including the transistor of one embodiment of the present invention is described with reference to drawings.
[Circuit Configuration Example]

When a connection between transistors, wirings, or electrodes is changed from that described in Embodiment 1, a variety of circuits can be formed. Examples of circuit configurations which can be achieved by using a semiconductor device of one embodiment of the present invention are shown below.
[CMOS Circuit]

Figure 21A:
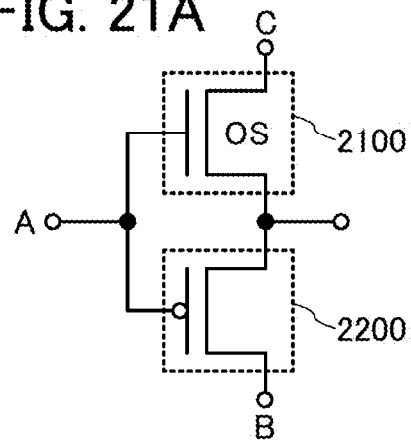
FIGS. 21A to 21D are circuit diagrams according to an embodiment.

A circuit diagram in FIG. 21A shows a configuration of a so-called CMOS circuit in which a p-channel transistor 2200 and an n-channel transistor 2100 are connected to each other in series and in which gates of them are connected to each other. Note that transistors in which a second semiconductor material is used are denoted by "OS" in drawings.
[Analog Switch]

Figure 21B:
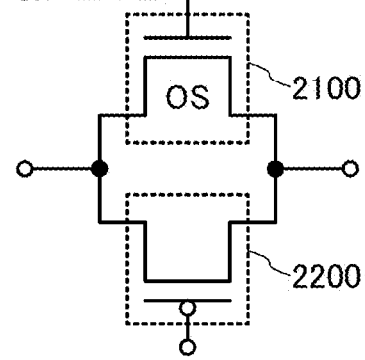

A circuit diagram in FIG. 21B shows a configuration in which sources of the transistors 2100 and 2200 are connected to each other and drains of the transistors 2100 and 2200 are connected to each other. With such a configuration, the transistors can function as a so-called analog switch.
[Memory Device Example]

Figure 21C:
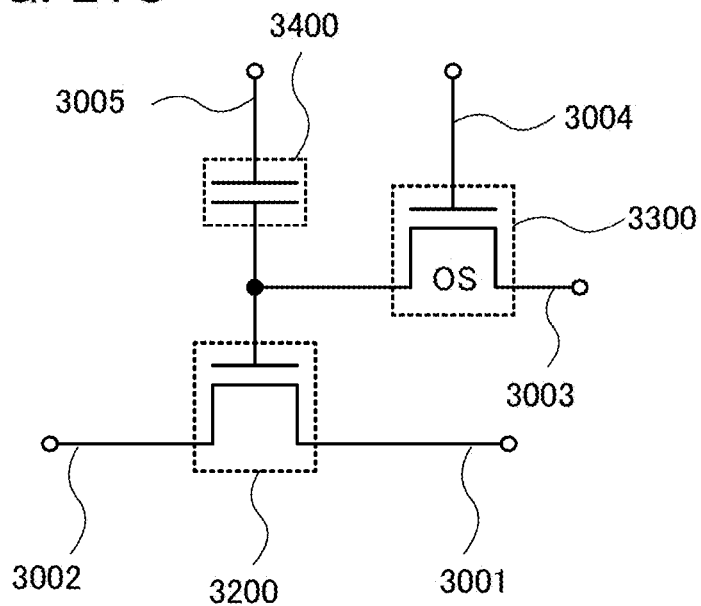

An example of a semiconductor device (memory device) which includes the transistor of one embodiment of the present invention, which can retain stored data even when not powered, and which has an unlimited number of write cycles is shown in FIG. 21C.

The semiconductor device illustrated in FIG. 21C includes a transistor 3200 using a first semiconductor material, a transistor 3300 using a second semiconductor material, and a capacitor 3400. Note that any of the transistors described in the above embodiments can be used as the transistor 3300.

The transistor 3300 is a transistor in which a channel is formed in a semiconductor film including an oxide semiconductor. Since the off-state current of the transistor 3300 is low, stored data can be retained for a long period. In other words, power consumption can be sufficiently reduced because a semiconductor memory device in which refresh operation is unnecessary or the frequency of refresh operation is extremely low can be provided.

In FIG. 21C, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 21C has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell is read. In the case where such reading is not performed, the fifth wiring 3005 may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

Figure 22:
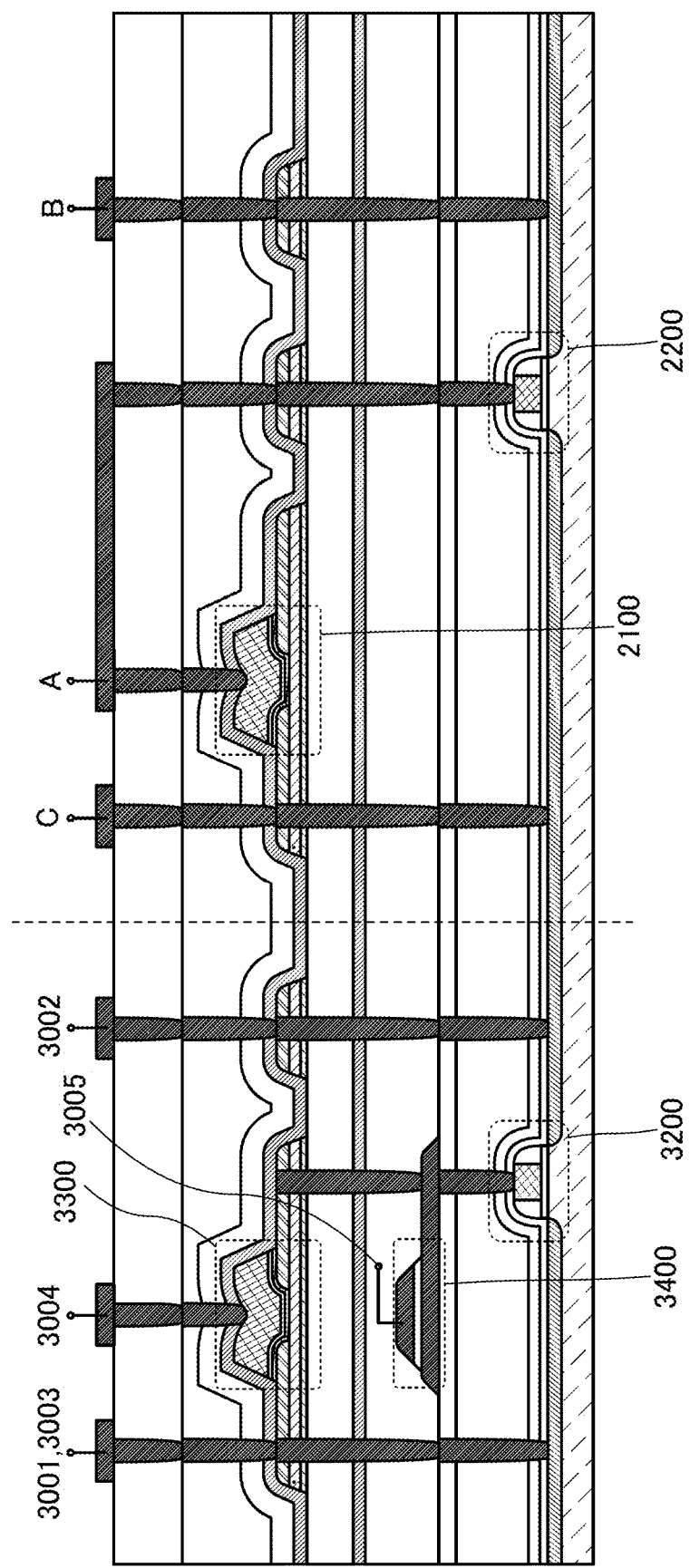
FIG. 22 illustrates an example of schematic cross-sectional diagrams of some of the circuit diagrams in FIGS. 21A to 21D.

Note that FIG. 22 illustrates a schematic cross-sectional view of the circuit diagram in FIG. 21A and a schematic cross-sectional view of a structure in which the wiring 3001 and the wiring 3003 in FIG. 21C are unified. Note that the schematic cross-sectional view of FIG. 21A is illustrated on the right side of the dotted line, and the schematic cross-sectional view of the circuit diagram in FIG. 21C is illustrated on the left side of the dotted line.

As illustrated in the diagram, the transistor 3300 is stacked over the transistor 3200; thus, the area occupied by the elements can be decreased. Furthermore, the capacitor 3400 is located under the transistor 3300; thus, the area occupied by the elements can be decreased. Moreover, the wiring 3005 and the gate electrode of the transistor 3300 overlap with each other; thus, the area occupied by the elements can be further decreased.

Figure 23:
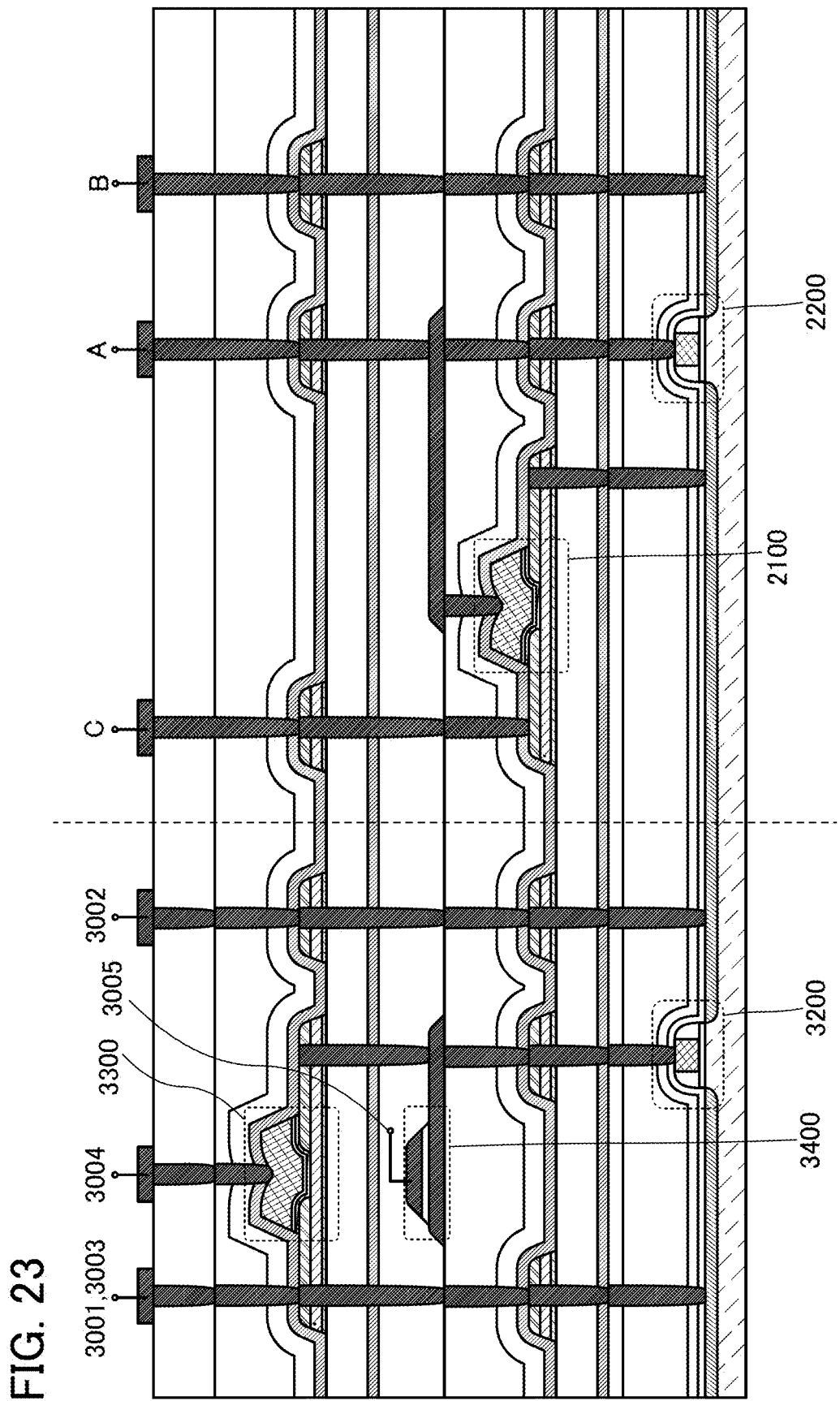
FIG. 23 illustrates an example of schematic cross-sectional diagrams of some of the circuit diagrams in FIGS. 21A to 21D.

Furthermore, the transistor 3300 and the transistor 2100 may be formed in different steps as illustrated in FIG. 23.

Figure 21D:
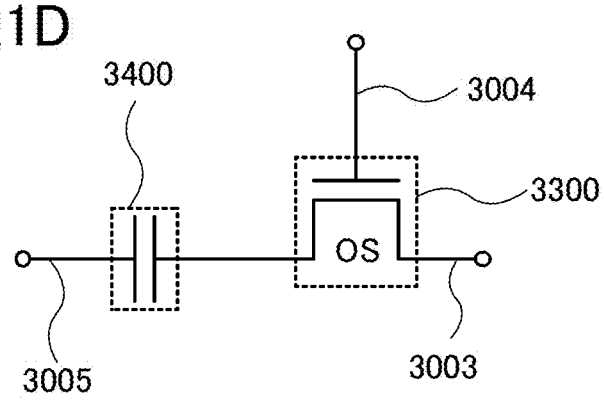

The semiconductor device illustrated in FIG. 21D is different mainly from the semiconductor device illustrated in FIG. 21C in that the transistor 3200 is not provided. Also in this case, writing and retaining operation of data can be performed in a manner similar to the semiconductor device illustrated in FIG. 21C.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, power consumption can be sufficiently reduced because refresh operation becomes unnecessary or the frequency of refresh operation can be extremely low. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

At least part of this embodiment can be implemented in combination with any of the other embodiments described in this specification as appropriate.

Embodiment 4

In this embodiment, an RFID tag that includes the transistor described in the above embodiments or the memory device described in the above embodiment is described with reference to FIG. 24.

The RFID tag of this embodiment includes a memory circuit, stores necessary data in the memory circuit, and transmits and receives data to/from the outside by using contactless means, for example, wireless communication. With these features, the RFID tag can be used for an individual authentication system in which an object or the like is recognized by reading the individual information, for example. Note that the RFID tag is required to have extremely high reliability in order to be used for this purpose.

A configuration of the RFID tag will be described with reference to FIG. 24. FIG. 24 is a block diagram illustrating a configuration example of an RFID tag.

Figure 24:
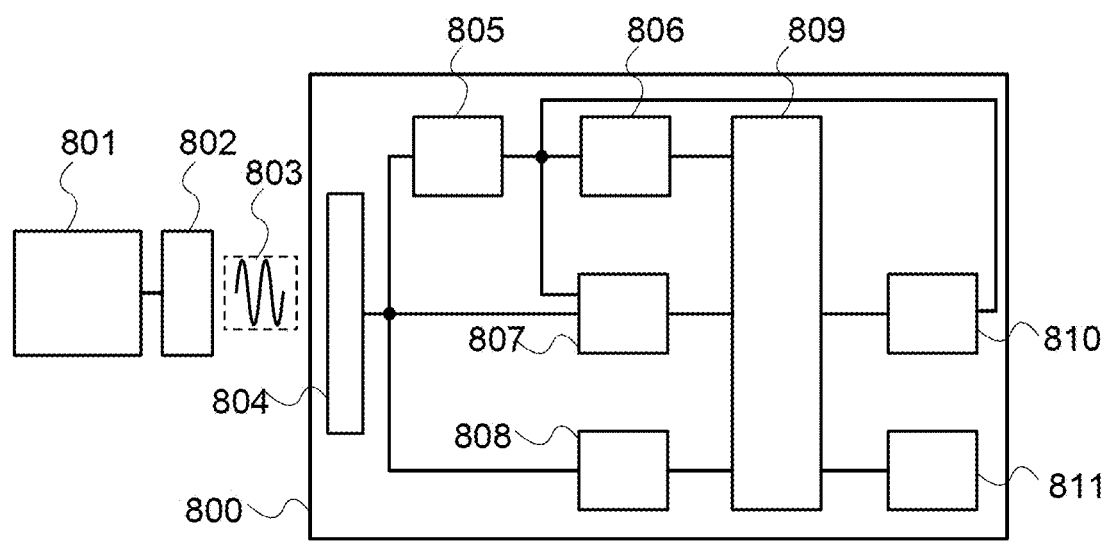
FIG. 24 illustrates an example of a structure of an RFID tag according to an embodiment.

As shown in FIG. 24, an RFID tag 800 includes an antenna 804 which receives a radio signal 803 that is transmitted from an antenna 802 connected to a communication device 801 (also referred to as an interrogator, a reader/writer, or the like). The RFID tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFID tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory device described in the above embodiment can be used as the memory circuit 810. Since the memory circuit of one embodiment of the present invention can retain data even when not powered, the memory circuit can be favorably used for an RFID tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RFID tags, it is possible to put identification numbers to only good products to be shipped. Thus, the identification numbers of the shipped products are in series and customer management corresponding to the shipped products is easily performed.

At least part of this embodiment can be implemented in combination with any of the other embodiments described in this specification as appropriate.

Embodiment 5

In this embodiment, a CPU in which at least the transistor described in any of the above embodiments can be used and the memory device described in the above embodiment is included is described.

Figure 25:
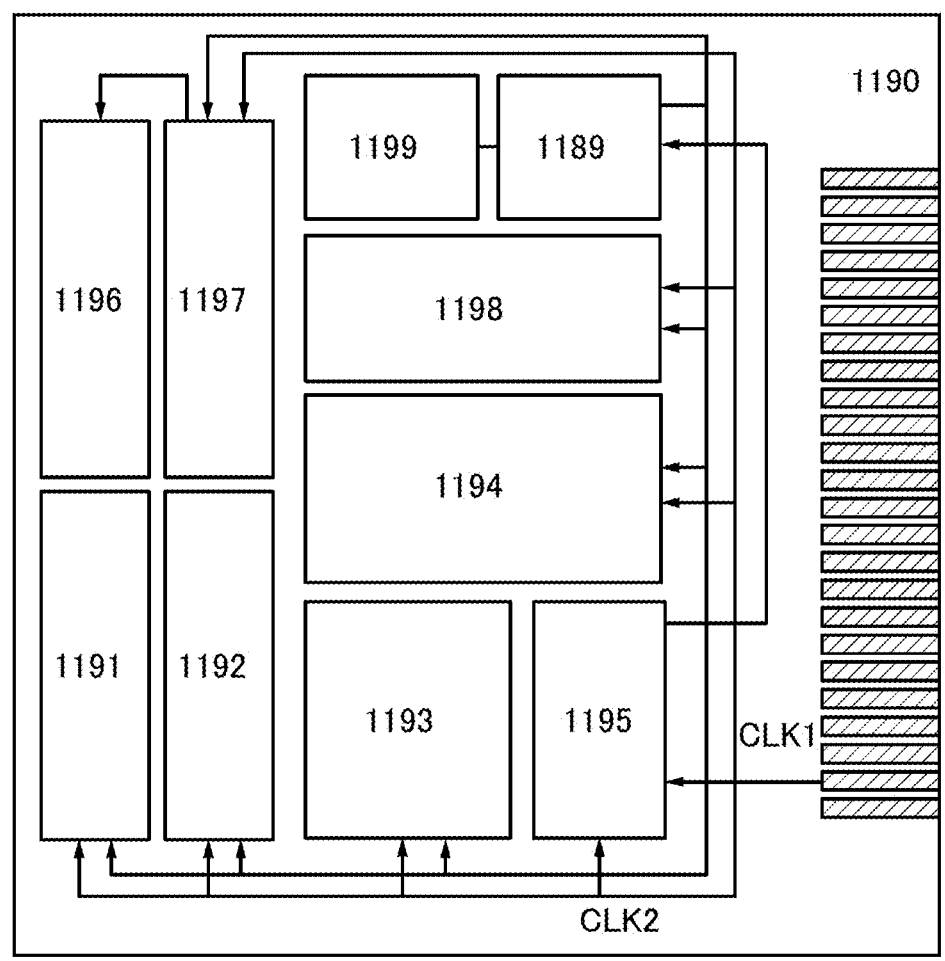
FIG. 25 illustrates an example of a structure of a CPU according to an embodiment.

FIG. 25 is a block diagram illustrating a configuration example of a CPU at least partly including any of the transistors described in the above embodiments as a component.

The CPU illustrated in FIG. 25 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 25 is just an example in which the configuration is simplified, and an actual CPU may have a variety of configurations depending on the application. For example, the CPU may have the following configuration: a structure including the CPU illustrated in FIG. 25 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 25, a memory cell is provided in the register 1196. For the memory cell of the register 1196, any of the transistors described in the above embodiments can be used.

In the CPU illustrated in FIG. 25, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 26:
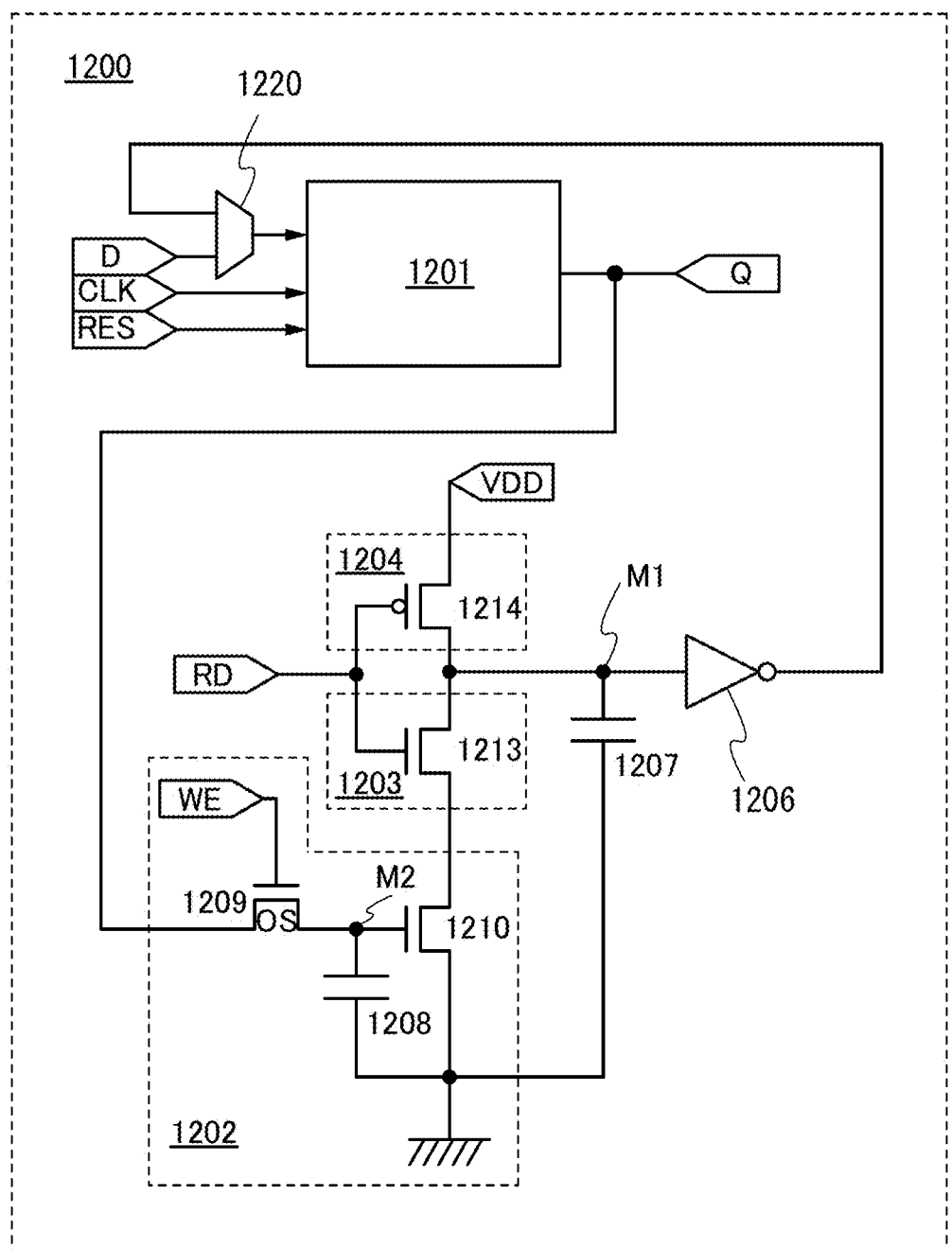
FIG. 26 is a circuit diagram of a memory element according to an embodiment.

FIG. 26 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When one of the switches is in the conduction state between the first terminal and the second terminal, the other of the switches is in the non-conduction state between the first terminal and the second terminal.

A signal corresponding to data retained in the circuit 1201 is input to the other of the source and the drain of the transistor 1209. FIG. 26 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 26, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 26, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor film can be used for all the transistors in the memory element 1200. Further alternatively, in the memory element 1200, a transistor in which a channel is formed in an oxide semiconductor film can be included besides the transistor 1209, and a transistor in which a channel is formed in a layer or the substrate 1190 including a semiconductor other than an oxide semiconductor can be used for the rest of the transistors.

As the circuit 1201 in FIG. 26, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor film is extremely low. For example, the off-state current of a transistor in which a channel is formed in an oxide semiconductor film is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RFID).

At least part of this embodiment can be implemented in combination with any of the other embodiments described in this specification as appropriate.

Embodiment 6

In this embodiment, a structure example of a display panel of one embodiment of the present invention is described.

Structure Example

Figure 27A:
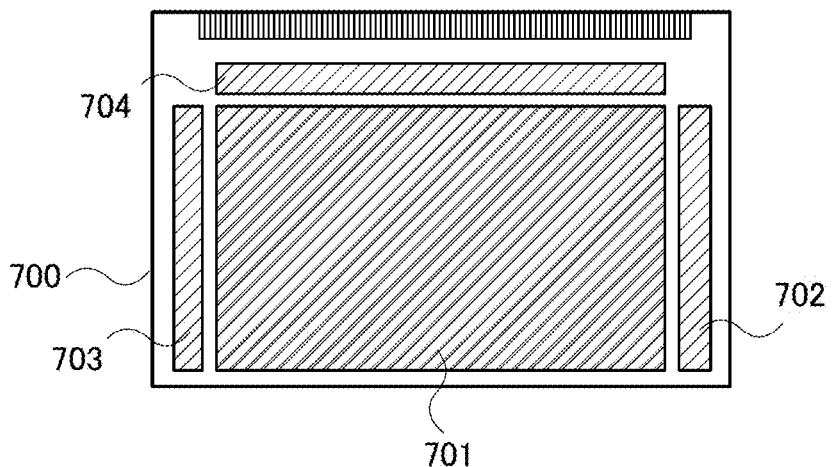
FIGS. 27A to 27C are a top view and circuit diagrams of a display device according to an embodiment.
Figure 27B:
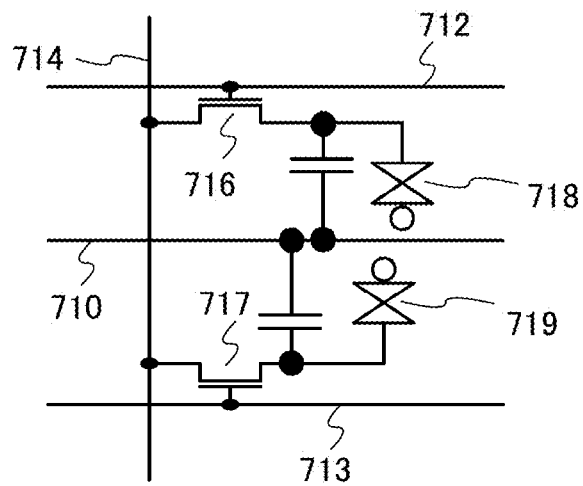
Figure 27C:
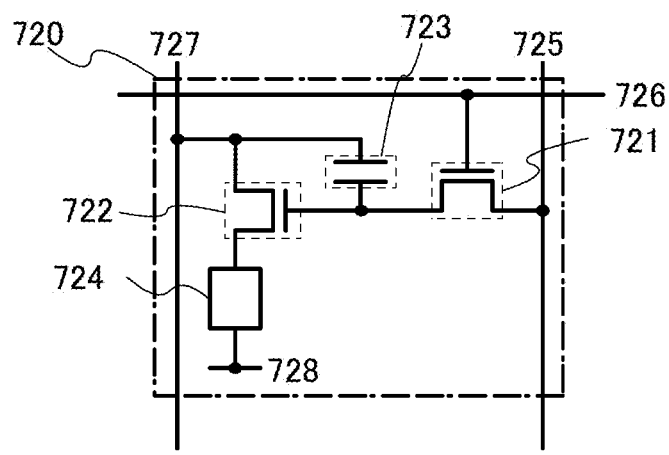
Figure 29A:
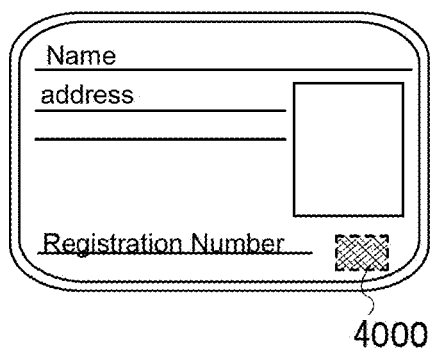
FIGS. 29A to 29F each illustrate an example of application of an RFID according to an embodiment.
Figure 29B:
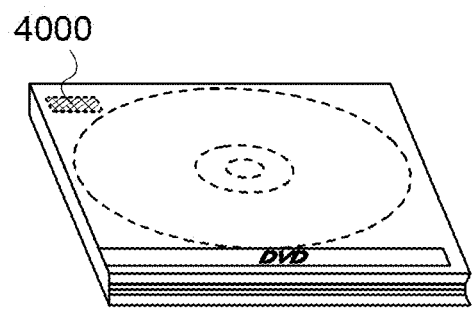
Figure 29C:
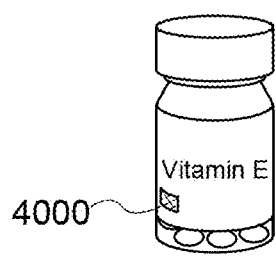
Figure 29D:
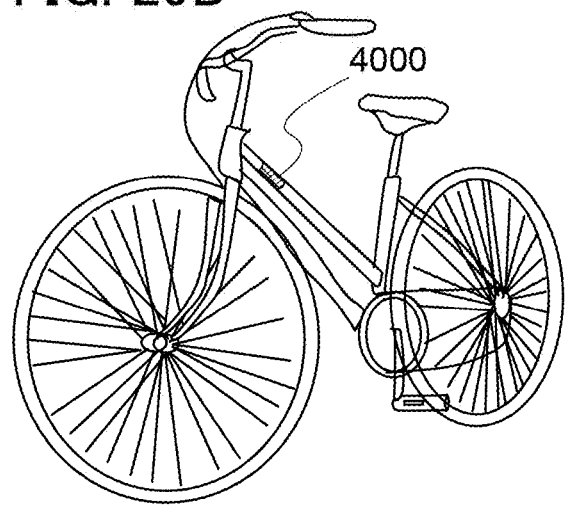
Figure 29E:
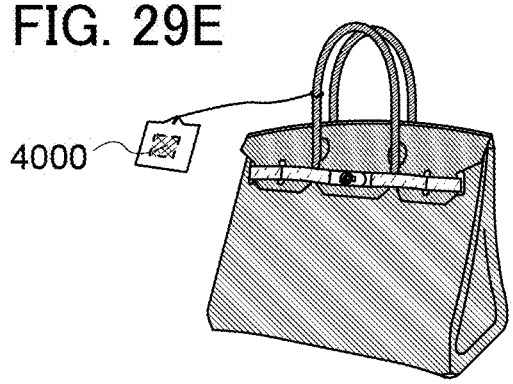
Figure 29F:
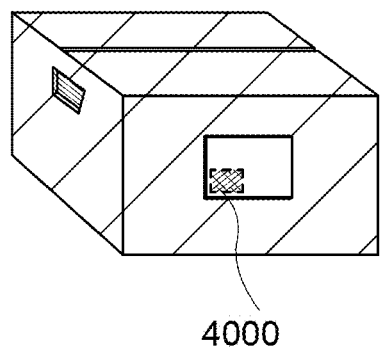

FIG. 27A is a top view of the display panel of one embodiment of the present invention. FIG. 27B is a circuit diagram illustrating a pixel circuit that can be used in the case where a liquid crystal element is used in a pixel in the display panel of one embodiment of the present invention. FIG. 27C is a circuit diagram illustrating a pixel circuit that can be used in the case where an organic EL element is used in a pixel in the display panel of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 27A illustrates an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 27A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Panel]

FIG. 27B illustrates an example of a circuit configuration of the pixel. Here, a pixel circuit that can be used in a pixel of a VA liquid crystal display panel is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 712 of a transistor 716 and a gate wiring 713 of a transistor 717 are separated so that different gate signals can be supplied thereto. In contrast, a source or drain electrode 714 that functions as a data line is shared by the transistors 716 and 717. The transistor described in any of the above embodiments can be used as appropriate as each of the transistors 716 and 717. Thus, a highly reliable liquid crystal display panel can be provided.

The shapes of a first pixel electrode electrically connected to the transistor 716 and a second pixel electrode electrically connected to the transistor 717 are described. The first pixel electrode and the second pixel electrode are separated by a slit. The first pixel electrode is spread in a V shape and the second pixel electrode is provided so as to surround the first pixel electrode.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode or the second pixel electrode.

The multi-domain pixel includes a first liquid crystal element 718 and a second liquid crystal element 719. The first liquid crystal element 718 includes the first pixel electrode, a counter electrode, and a liquid crystal layer therebetween. The second liquid crystal element 719 includes the second pixel electrode, a counter electrode, and a liquid crystal layer therebetween.

Note that a pixel circuit of the present invention is not limited to that shown in FIG. 27B. For example, a switch, a resistor, a capacitor, a transistor, a sensor, a logic circuit, or the like may be added to the pixel illustrated in FIG. 27B.

[Organic EL Panel]

FIG. 27C illustrates another example of a circuit configuration of the pixel. Here, a pixel structure of a display panel including an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 27C illustrates an applicable example of a pixel circuit. Here, one pixel includes two n-channel transistors. Note that a metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode of the switching transistor 721 is connected to a scan line 726, a first electrode (one of a source electrode and a drain electrode) of the switching transistor 721 is connected to a signal line 725, and a second electrode (the other of the source electrode and the drain electrode) of the switching transistor 721 is connected to a gate electrode of the driver transistor 722. The gate electrode of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of the above embodiments can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode of the driver transistor 722. Note that voltage higher than or equal to voltage which is the sum of power supply line voltage and the threshold voltage Vth of the driver transistor 722 is applied to the signal line 725.

In the case of performing analog grayscale driving, a voltage higher than or equal to a voltage which is the sum of the forward voltage of the light-emitting element 724 and the threshold voltage Vth of the driver transistor 722 is applied to the gate electrode of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 27C. For example, a switch, a resistor, a capacitor, a sensor, a transistor, a logic circuit, or the like may be added to the pixel circuit illustrated in FIG. 27C.

In the case where the transistor shown in any of the above embodiments is used for any of the circuits shown in FIGS. 27A to 27C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

At least part of this embodiment can be implemented in combination with any of the other embodiments described in this specification as appropriate.

Embodiment 7

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 28A to 28F illustrate specific examples of these electronic devices.

FIG. 28A illustrates a portable game machine, which includes a housing 901, a housing 902, a display portion 903, a display portion 904, a microphone 905, a speaker 906, an operation key 907, a stylus 908, and the like. Although the portable game machine in FIG. 28A has the two display portions 903 and 904, the number of display portions included in a portable game machine is not limited to this.

FIG. 28B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. Images displayed on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

FIG. 28C illustrates a laptop personal computer, which includes a housing 921, a display portion 922, a keyboard 923, a pointing device 924, and the like.

FIG. 28D illustrates an electric refrigerator-freezer, which includes a housing 931, a refrigerator door 932, a freezer door 933, and the like.

FIG. 28E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

FIG. 28F illustrates a passenger car, which includes a car body 951, wheels 952, a dashboard 953, lights 954, and the like.

At least part of this embodiment can be implemented in combination with any of the other embodiments described in this specification as appropriate.

Embodiment 8

In this embodiment, application examples of an RFID of one embodiment of the present invention will be described with reference to FIGS. 29A to 29F. The RFID is widely used and can be provided for, for example, products such as bills, coins, securities, bearer bonds, documents (e.g., driver's licenses or resident's cards, see FIG. 29A), recording media (e.g., DVD software or video tapes, see FIG. 29B), packaging containers (e.g., wrapping paper or bottles, see FIG. 29C), vehicles (e.g., bicycles, see FIG. 29D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 29E and 29F).

An RFID 4000 of one embodiment of the present invention is fixed to a product by being attached to a surface thereof or embedded therein. For example, the RFID 4000 is fixed to each product by being embedded in paper of a book, or embedded in an organic resin of a package. Since the RFID 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RFID 4000 of one embodiment of the present invention, and the identification function can be utilized to prevent counterfeiting. Moreover, the efficiency of a system such as an inspection system can be improved by providing the RFID of one embodiment of the present invention for packaging containers, recording media, personal belongings, foods, clothing, household goods, electronic devices, or the like. Vehicles can also have higher security against theft or the like by being provided with the RFID of one embodiment of the present invention.

As described above, by using the RFID of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RFID can be preferably used for application in which data is not frequently written or read.

At least part of this embodiment can be implemented in combination with any of the other embodiments described in this specification as appropriate.

Example 1

In this example, cross-sectional observation of an opening formed in an insulating film and an oxide semiconductor film is described.

First, a method for forming a sample A subjected to cross-sectional observation is described below.

By thermal oxidation of a silicon wafer, a 100-nm-thick thermal oxide film 200 was formed on a surface of the silicon wafer. The thermal oxidation was performed at 950° C. for four hours in a thermal oxidation atmosphere containing HCl at 3 vol % with respect to oxygen.

Next, the thermal oxide film 200 was etched 100 nm.

Then, a 50-nm-thick tungsten film 201 was formed by a sputtering method using a tungsten target in an atmosphere of an argon (Ar) gas at a flow rate of 80 sccm as a deposition gas under the conditions where the pressure was 0.8 Pa, the substrate temperature was 230° C., the distance between the target and the substrate was 60 mm, and a source power (DC) of 1.0 kW was applied.

Next, a 100-nm-thick silicon oxide film was formed by a CVD method in which tetraethoxysilane (TEOS) at a flow rate of 15 sccm and oxygen ($O_2$) at a flow rate of 750 sccm were used as source gases, the substrate temperature was 300° C., and a high-frequency power of 300 W was supplied to parallel plate electrodes by using a 27 MHz high-frequency power source.

Then, a 20-nm-thick aluminum oxide film was formed by a sputtering method using an aluminum oxide target under the conditions where an argon (Ar) gas at a flow rate of 25 sccm and an oxygen ($O_2$) gas at a flow rate of 25 sccm were used as deposition gases, the pressure was 0.4 Pa, the substrate temperature was 250° C., the distance between the target and the substrate was 60 mm, and an RF power of 2.5 kW was applied.

Then, a 50-nm-thick silicon oxynitride film was formed by a CVD method in which silane ($SiH_4$) at a flow rate of 1 sccm and dinitrogen monoxide ($N_2O$) at a flow rate of 800 sccm were used as source gases, the pressure in a reaction chamber was 200 Pa, the substrate temperature was 350° C., and a high-frequency power of 150 W was supplied to parallel plate electrodes by using a 60 MHz high-frequency power source.

Then, a 20-nm-thick first oxide semiconductor film and a 15-nm-thick second oxide semiconductor film were stacked by a sputtering method. The first oxide semiconductor film was formed using a target with an atomic ratio of In:Ga:Zn=1:3:4 in a mixed atmosphere of argon (Ar) at a flow rate of 40 sccm and oxygen ($O_2$) at a flow rate of 5 sccm under the conditions where the pressure was 0.7 Pa, a source power (DC) of 0.5 kW was applied, the distance between the target and the substrate was 60 mm, and the substrate temperature was 200° C. The second oxide semiconductor film was formed using a target with an atomic ratio of In:Ga:Zn=4:2:4.1 in a mixed atmosphere of argon (Ar) at a flow rate of 30 sccm and oxygen ($O_2$) at a flow rate of 15 sccm under the conditions where the pressure was 0.7 Pa, a source power (DC) of 0.5 kW was applied, the distance between the target and the substrate was 60 mm, and the substrate temperature was 200° C.

Next, a 30-nm-thick tungsten film was formed by a sputtering method using a tungsten target in an atmosphere of an argon (Ar) gas at a flow rate of 80 sccm as a deposition gas under the conditions where the pressure was 0.8 Pa, the substrate temperature was 230° C., the distance between the target and the substrate was 60 mm, and a source power (DC) of 1.0 kW was applied. This tungsten film functions as a hard mask when the first oxide semiconductor film and the second oxide semiconductor film are etched.

Next, a 100-nm-thick silicon nitride film was formed by a CVD method.

Next, a 20-nm-thick organic resin film was formed by application of SWK-T7 (manufactured by Tokyo Ohka Kogyo Co., Ltd.). Before the application of SWK-T7, moisture was removed by heating at 200° C. for 120 seconds, and 1,1,1,3,3,3-hexamethyldisilazane (HMDS) was further applied, and then moisture was removed by heating at 110° C. for 60 seconds. Then, a solvent and moisture were removed by heating at 200° C. for 200 seconds.

Next, a resist mask was formed, and the organic resin film was partly etched. As an etching gas, a chlorine ($Cl_2$) gas was used.

Next, the silicon nitride film was partly etched using the resist mask and the organic resin film as a mask. The silicon oxide film was processed in a mixed atmosphere of a trifluoromethane ($CHF_3$) gas and a helium (He) gas as an etching gas.

Next, the tungsten film was partly etched using the resist mask, the organic resin film, and the silicon nitride film as a mask. The tungsten film was processed in a mixed atmosphere of a chlorine ($Cl_2$) gas, a carbon tetrafluoride ($CF_4$) gas, and an oxygen ($O_2$) gas as an etching gas, whereby a tungsten film 207a and a tungsten film 207b were formed. Note that in the above etching treatment, the resist mask and the organic resin film were also etched and receded.

Next, the second oxide semiconductor film, the first oxide semiconductor film, the silicon oxynitride film, and the aluminum oxide film were partly etched using the tungsten films 207a and 207b as a mask, whereby an aluminum oxide film 203, a silicon oxynitride film 204, a first oxide semiconductor film 205, and a second oxide semiconductor film 206 were formed. As an etching gas, a mixed atmosphere of a trifluoromethane ($CHF_3$) gas and a helium (He) gas, or a mixed atmosphere of a hexafluoro-1,3-butadiene ($C_4F_6$) gas and an argon (Ar) gas was used.

Next, the silicon oxide film was partly etched using the tungsten films 207a and 207b as a mask, whereby an opening reaching the tungsten film 201 was provided, and a silicon oxide film 202 was formed. As an etching gas, a mixed atmosphere of a hexafluoro-1,3-butadiene ($C_4F_6$) gas and an argon (Ar) gas was used.

Next, a 5-nm-thick titanium nitride film 208a was formed by a CVD method.

Next, a 200-nm-thick tungsten film 208b was formed by a CVD method.

Through the above process, the sample A was formed.

In addition, a sample B was formed. A method for forming the sample B will be described below.

By thermal oxidation of a silicon wafer, a 100-nm-thick thermal oxide film was formed on a surface of the silicon wafer. The thermal oxidation was performed at 950° C. for four hours in a thermal oxidation atmosphere containing HCl at 3 vol % with respect to oxygen.

Next, the thermal oxide film was etched 100 nm deep.

Then, a 150-nm-thick tungsten film 211 was formed by a sputtering method using a tungsten target in an atmosphere of an argon (Ar) gas at a flow rate of 80 sccm as a deposition gas under the conditions where the pressure was 0.8 Pa, the substrate temperature was 230° C., the distance between the target and the substrate was 60 mm, and a source power (DC) of 1.0 kW was applied.

Next, a 100-nm-thick silicon oxide film was formed by a CVD method in which tetraethoxysilane (TEOS) at a flow rate of 15 sccm and oxygen ($O_2$) at a flow rate of 750 sccm were used as source gases, the substrate temperature was 300° C., and a high-frequency power of 300 W was supplied to parallel plate electrodes by using a 27 MHz high-frequency power source.

Then, a 20-nm-thick aluminum oxide film was formed by a sputtering method using an aluminum oxide target under the conditions where an argon (Ar) gas at a flow rate of 25 sccm and an oxygen ($O_2$) gas at a flow rate of 25 sccm were used as deposition gases, the pressure was 0.4 Pa, the substrate temperature was 250° C., the distance between the target and the substrate was 60 mm, and an RF power of 2.5 kW was applied.

Then, a 50-nm-thick silicon oxynitride film was formed by a CVD method in which silane ($SiH_4$) at a flow rate of 1 sccm and dinitrogen monoxide ($N_2O$) at a flow rate of 800 sccm were used as source gases, the pressure in a reaction chamber was 200 Pa, the substrate temperature was 350° C., and a high-frequency power of 150 W was supplied to parallel plate electrodes by using a 60 MHz high-frequency power source.

Then, a 10-nm-thick first oxide semiconductor film and a 40-nm-thick second oxide semiconductor film were stacked by a sputtering method. The first oxide semiconductor film was formed using a target with an atomic ratio of In:Ga:

Zn=1:3:4 in a mixed atmosphere of argon (Ar) at a flow rate of 40 sccm and oxygen ($O_2$) at a flow rate of 5 sccm under the conditions where the pressure was 0.4 Pa, a source power (DC) of 0.5 kW was applied, the distance between the target and the substrate was 60 mm, and the substrate temperature was 200° C. The second oxide semiconductor film was formed using a target with an atomic ratio of In:Ga:Zn=1:1:1 in a mixed atmosphere of argon (Ar) at a flow rate of 30 sccm and oxygen ($O_2$) at a flow rate of 15 sccm under the conditions where the pressure was 0.4 Pa, a source power (DC) of 0.5 kW was applied, the distance between the target and the substrate was 60 mm, and the substrate temperature was 300° C.

Next, a 30-nm-thick tungsten film was formed by a sputtering method using a tungsten target in an atmosphere of an argon (Ar) gas at a flow rate of 80 sccm as a deposition gas under the conditions where the pressure was 0.8 Pa, the substrate temperature was 230° C., the distance between the target and the substrate was 60 mm, and a source power (DC) of 1.0 kW was applied. This tungsten film functions as a hard mask when the first oxide semiconductor film and the second oxide semiconductor film are etched.

Next, a 20-nm-thick organic resin film was formed by application of SWK-T7. Before the application of SWK-T7, moisture was removed by heating at 200° C. for 120 seconds, and 1,1,1,3,3,3-hexamethyldisilazane (HMDS) was further applied, and then moisture was removed by heating at 110° C. for 60 seconds. Then, a solvent and moisture were removed by heating at 200° C. for 200 seconds.

Next, a resist mask was formed, and the organic resin film was partly etched. As an etching gas, a chlorine ($Cl_2$) gas was used.

Next, the tungsten film was partly etched using the resist mask and the organic resin film as a mask. The tungsten film was processed in a mixed atmosphere of a chlorine ($Cl_2$) gas, a carbon tetrafluoride ($CF_4$) gas, and an oxygen (02) gas as an etching gas, whereby a tungsten film 217a and a tungsten film 217b were formed. Note that in the above etching treatment, the resist mask and the organic resin film were also etched and receded.

Next, the second oxide semiconductor film, the first oxide semiconductor film, the silicon oxynitride film, and the aluminum oxide film were partly etched using the tungsten films 217a and 217b as a mask, whereby an aluminum oxide film 213, a silicon oxynitride film 214, a first oxide semiconductor film 215, and a second oxide semiconductor film 216 were formed. As an etching gas, a mixed atmosphere of a trifluoromethane ($CHF_3$) gas and a helium (He) gas, or a mixed atmosphere of a hexafluoro-1,3-butadiene ($C_4F_6$) gas and an argon (Ar) gas was used.

Next, the silicon oxide film was partly etched using the tungsten films 217a and 217b as a mask, whereby an opening reaching the tungsten film 211 was provided, and a silicon oxide film 212 was formed. As an etching gas, a mixed atmosphere of a hexafluoro-1,3-butadiene ($C_4F_6$) gas and an argon (Ar) gas was used.

Next, a 10-nm-thick titanium nitride film 218a was formed by a CVD method.

Next, a 200-nm-thick tungsten film 218b was formed by a CVD method.

Through the above process, the sample B was formed.

Figure 30:
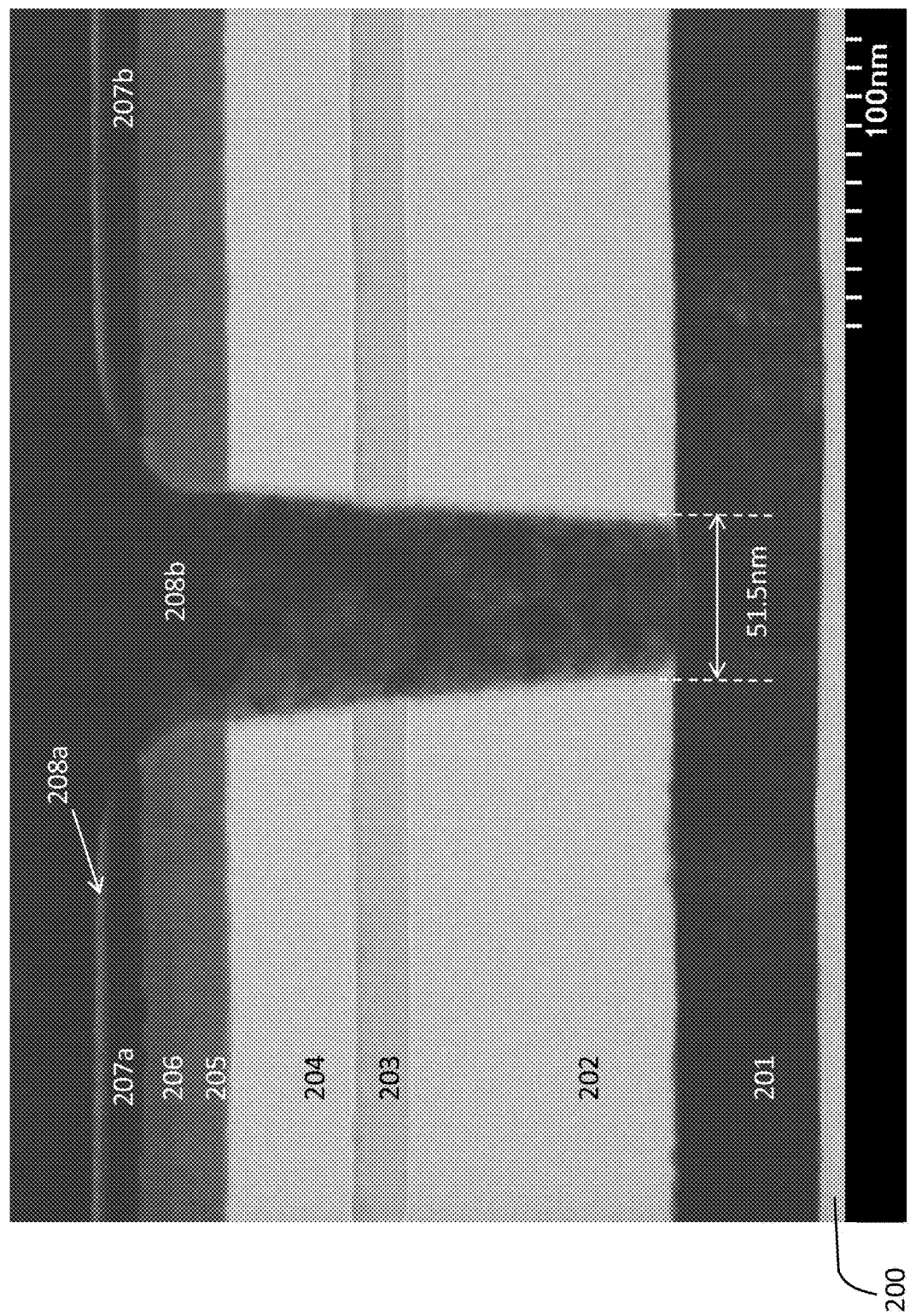
FIG. 30 is a cross-sectional STEM image of a sample in an example.
Figure 31:
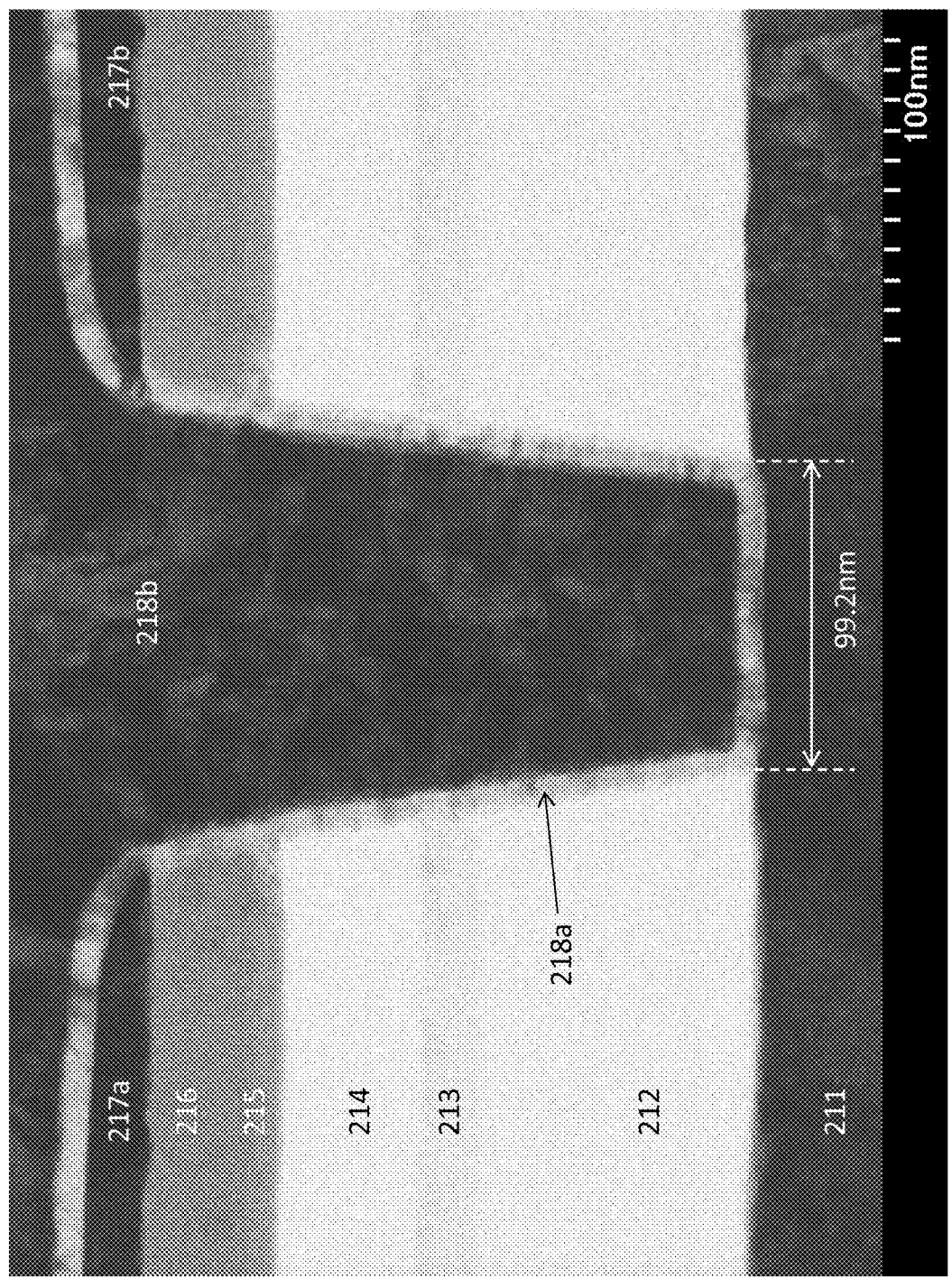
FIG. 31 is a cross-sectional STEM image of a sample in a comparative example.

FIG. 30 shows a cross-sectional STEM image of the sample A, and FIG. 31 shows a cross-sectional STEM image of the sample B.

FIG. 30 shows that the width of the bottom of the opening in the sample A is 51.5 nm. FIG. 31 shows that the width of the bottom of the opening in the sample B is 99.2 nm.

The above results suggest that an increase in length of pattern of a resist mask can be suppressed and the width of the bottom of an opening (the expansion of the opening) can be decreased when a silicon nitride film is provided between and in contact with an organic resin film and a tungsten film serving as a hard mask, etching is performed under conditions where the selectivity of the silicon nitride film to the resist mask is high so that receding of the silicon nitride film is suppressed, and the opening is formed using the silicon nitride film as a mask.

Example 2

In this example, cross-sectional observation of a semiconductor device including a first transistor in which single crystal silicon is used for a semiconductor film (this transistor is also referred to as a Si-FET) and a second transistor in which an oxide semiconductor is used for a semiconductor film (this transistor is also referred to as an OS-FET) is described. Note that the Si-FET and the OS-FET were formed by the method described in Embodiment 1.

Figure 32:
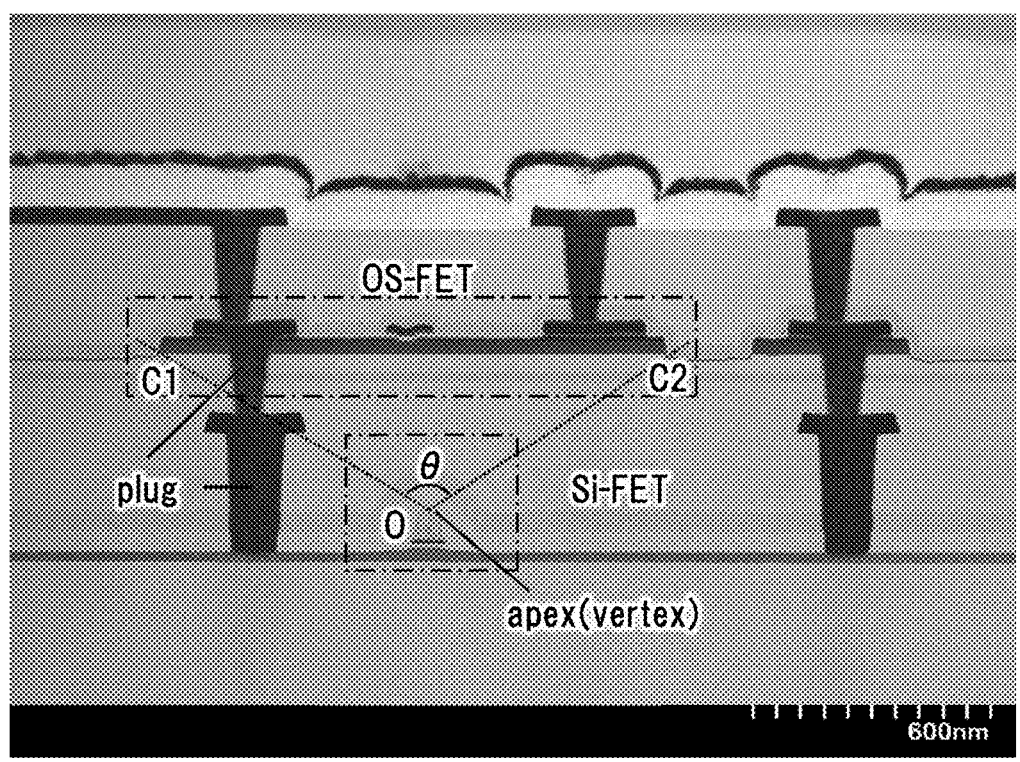
FIG. 32 is a cross-sectional STEM image of a semiconductor device.

FIG. 32 shows a cross-sectional STEM image of the semiconductor device.

FIG. 32 shows that a plug formed using the two-layer hard mask in the above description of the process of forming the OS-FET has a narrower bottom than a plug in direct contact with the Si-FET. In other words, it can be confirmed that the expansion of an opening for the plug formed using the two-layer hard mask is suppressed as compared with that of the opening filled with the plug in direct contact with the Si-FET.

When the center of the top surface of the gate electrode of the Si-FET shown in FIG. 32 is at point O and the long side of the bottom surface of the oxide semiconductor film in the OS-FET corresponds to line C1-C2, the angle θ shown in FIG. 32 is 118.36°.

EXPLANATION OF REFERENCE

100: transistor, 101a: oxide semiconductor film, 101b: oxide semiconductor film, 101c: oxide semiconductor film, 102a: oxide semiconductor film, 102b: oxide semiconductor film, 103: conductive film, 103a: electrode, 103a1: conductive film, 103a2: island-shaped conductive film, 103b: electrode, 103c: electrode, 104: gate insulating film, 105: gate electrode, 106: insulating film, 106a: insulating film, 107: insulating film, 108: insulating film, 109a: low-resistance region, 109b low-resistance region, 110: transistor, 111: semiconductor substrate, 112: semiconductor film, 113a: low-resistance layer, 113b: low-resistance layer, 114: gate insulating film, 115: gate electrode, 115a: gate electrode, 115b: gate electrode, 120: barrier film, 121: insulating film, 122: insulating film, 123: insulating film, 124: insulating film, 125: insulating film, 126: insulating film, 127: insulating film, 128: insulating film, 130: capacitor, 131a: oxide semiconductor film, 131b: oxide semiconductor film, 136: electrode, 137: insulating film, 138: electrode, 140a: organic resin film, 140b: organic resin film, 141: resist mask, 141a: resist mask, 146a: oxide semiconductor film, 146b: oxide semiconductor film, 147a: layer, 147b: layer, 160: transistor, 161: plug, 162: plug, 163: plug, 164: plug, 165: plug, 166: plug, 167: plug, 168: plug, 169: plug, 170: plug, 171: plug, 172: plug, 173: electrode, 174: electrode, 175: electrode, 180: wiring, 181: wiring, 201: tungsten film, 202: silicon oxide film, 203: aluminum oxide film, 204: silicon oxynitride film, 205: oxide semiconductor film, 206: oxide semiconductor film, 207a: tungsten film, 207b: tungsten film, 208a: titanium nitride film, 208b: tungsten film, 211: tungsten film, 212: silicon oxide film, 213: aluminum oxide film, 214: silicon oxynitride film, 215: oxide semiconductor film, 216: oxide semiconductor film, 217a: tungsten film, 217b: tungsten film, 218a: titanium nitride film, 218b: tungsten film, 700: substrate, 701: pixel portion, 702: scan line driver circuit, 703: scan line driver circuit, 704: signal line driver circuit, 710: capacitor wiring, 712: gate wiring, 713: gate wiring, 714: drain electrode, 716: transistor, 717: transistor, 718: liquid crystal element, 719: liquid crystal element, 720: pixel, 721: switching transistor, 722: driver transistor, 723: capacitor, 724: light-emitting element, 725: signal line, 726: scan line, 727: power supply line, 728: common electrode, 800: RFID tag, 801: communication device, 802: antenna, 803: radio signal, 804: antenna, 805: rectifier circuit, 806: constant voltage circuit, 807: demodulation circuit, 808: modulation circuit, 809: logic circuit, 810: memory circuit, 811: ROM, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: refrigerator door, 933: freezer door, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2100: transistor, 2200: transistor, 3001: wiring, 3002: wiring, 3003: wiring, 3004: wiring, 3005: wiring, 3200: transistor, 3300: transistor, 3400: capacitor, 4000: RFID, 5100: pellet, 5100a: pellet, 5100b: pellet, 5101: ion, 5102: zinc oxide layer, 5103: particle, 5105a: pellet, 5105a1: region, 5105a2: pellet, 5105b: pellet, 5105c: pellet, 5105d: pellet, 5105d1: region, 5105e: pellet, 5120: substrate, 5130: target, and 5161: region.

This application is based on Japanese Patent Application serial no. 2014-112369 filed with Japan Patent Office on May 30, 2014, the entire contents of which are hereby incorporated by reference.

The invention claimed is:

1. A semiconductor device comprising:
a first transistor;
a second transistor over the first transistor, in a cross-sectional view; and
a capacitor between the first transistor and the second transistor, in the cross-sectional view,
wherein a channel formation region of the first transistor comprises polycrystalline silicon,
wherein a channel formation region of the second transistor comprises an oxide semiconductor,
wherein a gate of the first transistor is electrically connected to a first electrode of the capacitor,
wherein a second electrode of the capacitor overlaps with the first electrode of the capacitor with a first insulating layer provided therebetween,
wherein a second insulating layer is provided over the channel formation region of the second transistor, in the cross-sectional view,
wherein the gate of the first transistor is electrically connected to one of a source and a drain of the second transistor via a first opening provided in a third insulating layer,
wherein the third insulating layer is provided between the second electrode of the capacitor and the oxide semiconductor,
wherein one of a source and a drain of the first transistor is electrically connected to the other of the source and the drain of the second transistor via a second opening provided in the third insulating layer,
wherein a gate of the second transistor is provided over the second insulating layer, in the cross-sectional view, and
wherein a first conductive layer comprising a region configured to function as the other of the source and the drain of the second transistor does not overlap with the gate of the first transistor and the gate of the second transistor, in the cross-sectional view.

2. The semiconductor device according to claim 1, wherein the capacitor overlaps with the channel formation region of the first transistor.

3. The semiconductor device according to claim 1, wherein an entire area of overlap of a second conductive layer, comprising a region configured to function as the one of the source and the drain of the second transistor, with the first electrode of the capacitor is greater than an entire area of overlap of the second conductive layer with the second electrode of the capacitor, in the cross-sectional view.

4. The semiconductor device according to claim 1,
wherein a second conductive layer is provided over the gate of the second transistor, and
wherein the second conductive layer overlaps with the gate of the first transistor, the gate of the second transistor, and the second electrode of the capacitor.

5. A semiconductor device comprising:
a first transistor;
a second transistor over the first transistor, in a cross-sectional view; and
a capacitor,
wherein a first material of a first semiconductor layer of the first transistor in which a channel is formed is different from a second material of a second semiconductor layer of the second transistor in which a channel is formed,
wherein one of a source and a drain of the first transistor is electrically connected to one of a source and a drain of the second transistor via a first opening provided in a first insulating layer,
wherein a gate of the first transistor is electrically connected to a first electrode of the capacitor,
wherein the gate of the first transistor is electrically connected to the other of the source and the drain of the second transistor via a second opening provided in the first insulating layer,
wherein the first insulating layer is provided over a second electrode of the capacitor, wherein the second semiconductor layer is provided over and in contact with the first insulating layer, in the cross-sectional view, wherein a second insulating layer is provided over the channel of the second transistor, and wherein a gate of the second transistor is provided over the second insulating layer, in the cross-sectional view.

6. The semiconductor device according to claim 5, wherein the capacitor overlaps with the channel of the first transistor.

7. A semiconductor device comprising:

a first transistor;

a second transistor over the first transistor, in a cross-sectional view; and a capacitor, wherein a first material of a first semiconductor layer of the first transistor in which a channel is formed is different from a second material of a second semiconductor layer of the second transistor in which a channel is formed, wherein one of a source and a drain of the first transistor is electrically connected to one of a source and a drain of the second transistor via a first opening provided in a first insulating layer, wherein a first conductive layer provided over the channel of the first transistor is configured to function as a first electrode of the capacitor, wherein a second conductive layer provided over the first conductive layer with a second insulating layer therebetween is configured to function as a second electrode of the capacitor, in the cross-sectional view, wherein the first insulating layer is provided over the second conductive layer, in the cross-sectional view, wherein the second semiconductor layer is provided over and in contact with the first insulating layer, in the cross-sectional view, wherein a third insulating layer is provided over the second semiconductor layer, in the cross-sectional view, and wherein a gate of the second transistor is provided over the third insulating layer, in the cross-sectional view.

8. The semiconductor device according to claim 7, wherein the first conductive layer is electrically connected to the other of the source and the drain of the second transistor via a second opening provided in the first insulating layer.

9. The semiconductor device according to claim 7, wherein a third conductive layer electrically connected to the second semiconductor layer is in direct contact with a top surface of the first electrode of the capacitor.

\* \* \* \* \*